US012329025B2

(12) United States Patent
Yamamoto

(10) Patent No.: US 12,329,025 B2
(45) Date of Patent: Jun. 10, 2025

(54) PHOTOELECTRIC CONVERSION ELEMENT, IMAGING ELEMENT, AND OPTICAL SENSOR

(71) Applicant: FUJIFILM Corporation, Tokyo (JP)

(72) Inventor: Yosuke Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 539 days.

(21) Appl. No.: 17/858,982

(22) Filed: Jul. 6, 2022

(65) Prior Publication Data

US 2022/0367817 A1 Nov. 17, 2022

Related U.S. Application Data

(63) Continuation of application No. PCT/JP2021/000310, filed on Jan. 7, 2021.

(30) Foreign Application Priority Data

Jan. 10, 2020 (JP) ................................. 2020-002790

(51) Int. Cl.
*H10K 85/60* (2023.01)
*H10K 30/30* (2023.01)
*H10K 85/20* (2023.01)

(52) U.S. Cl.
CPC ......... *H10K 85/654* (2023.02); *H10K 85/211* (2023.02); *H10K 30/30* (2023.02)

(58) Field of Classification Search
CPC ............. H10K 85/6576; H10K 85/381; H10K 85/322; H10K 85/654; H10K 85/657;
(Continued)

(56) References Cited

U.S. PATENT DOCUMENTS 3,684,517 A 8/1972 Brooker et al.
8,222,519 B2 * 7/2012 Nomura ............... H10K 85/652 548/207
(Continued)

FOREIGN PATENT DOCUMENTS

EP 3823054 5/2021
JP H11167937 6/1999
(Continued)

OTHER PUBLICATIONS

Andrii V. Kulinich et al., "Fluorescent Properties of Merocyanines Based on 1,3-Indandione", Optics and Spectroscopy, Jul. 26, 2015, pp. 39-48., vol. 119.
(Continued)

*Primary Examiner* — Mouloucoulaye Inoussa
(74) *Attorney, Agent, or Firm* — JCIPRNET

(57) ABSTRACT

An object of the present invention is to provide a photoelectric conversion element excellent in suppression of a change in an external quantum efficiency during a continuous drive. In addition, an imaging element and an optical sensor related to the photoelectric conversion element are provided. The photoelectric conversion element of the present invention includes a conductive film, a photoelectric conversion film, and a transparent conductive film in this order, contains a first compound that has a maximum absorption wavelength at a wavelength of 500 to 620 nm, and that is a compound represented by Formula (1), and contains a second compound that is different from the first compound and that has a maximum absorption wavelength at a wavelength of 450 to 550 nm.
(Continued)

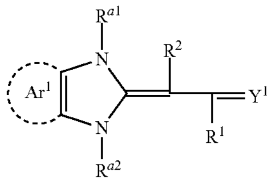

(1)

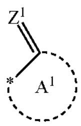

(1-1)

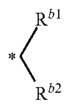

(1-2)

20 Claims, 1 Drawing Sheet

(58) Field of Classification Search
CPC ............. H10K 85/6572; H10K 85/211; H10K 85/653; H10K 85/631; H10K 39/32; H10K 30/30; H10K 30/211; H10K 85/621; H10K 30/40; H10K 85/615; H10K 85/6574; H10K 50/11; H10K 50/16; H10K 50/18; H10K 50/165; H10K 85/215; H10K 30/57; H10K 30/10; H10K 30/82; H10K 85/636; H10K 2101/10; H10K 2101/20; H10F 39/191; Y02E 10/549; C07D 517/14; C07D 495/04; C07D 517/04; C07D 519/00; C07D 487/22; C07D 487/04; C07D 221/00; C07D 233/02; C07F 11/00; C07F 9/6561; C09K 11/06; C09K 2211/1018; G02B 5/20; C09D 165/00; C08G 61/10; C08G 2261/1414; C08G 2261/3223; C08G 2261/312; C08G 2261/148; C08G 2261/95; C08G 2261/135; C08G 2261/3221; C08G 2261/228; C08G 2261/411; C08G 2261/1424; C08G 2261/124; C08G 2261/3162; C08G 2261/18; C08G 2261/122; C08G 2261/3142; C08G 2261/76; C08G 2261/1412; C08G 2261/794
See application file for complete search history.

(56) References Cited

U.S. PATENT DOCUMENTS

| | | | | |
|---|---|---|---|---|
| 2007/0085074 A1* | 4/2007 | Wang | H10K 85/652 548/364.7 |
| 2009/0184235 A1* | 7/2009 | Nomura | C09B 23/105 250/206 |
| 2012/0085411 A1* | 4/2012 | Isobe | H01G 9/2059 136/263 |
| 2012/0235015 A1* | 9/2012 | Nomura | H10K 85/652 257/E51.026 |
| 2014/0319421 A1* | 10/2014 | Kwon | G03F 7/0007 252/301.16 |
| 2019/0140187 A1* | 5/2019 | Schulze | H10K 85/615 |
| 2020/0058881 A1* | 2/2020 | Groarke | C07F 9/6561 |
| 2020/0168815 A1* | 5/2020 | Saito | H10K 85/322 |
| 2020/0212107 A1* | 7/2020 | Yoshioka | H10K 85/615 |
| 2020/0403163 A1* | 12/2020 | Yoshioka | H10K 85/657 |
| 2020/0411569 A1* | 12/2020 | Fukuzaki | C07D 487/04 |
| 2021/0024544 A1* | 1/2021 | Shin | H10K 85/657 |
| 2021/0102010 A1* | 4/2021 | Matsumura | C08L 101/00 |
| 2021/0135121 A1* | 5/2021 | Mashiko | H10K 85/657 |
| 2021/0135128 A1* | 5/2021 | Yoshioka | C07F 7/0814 |
| 2021/0173304 A1* | 6/2021 | Arayama | G03F 7/031 |
| 2021/0222010 A1* | 7/2021 | Nakamura | G03F 7/033 |
| 2022/0037591 A1* | 2/2022 | Hatakeyama | C08G 61/122 |
| 2022/0109117 A1* | 4/2022 | Yoshioka | H10K 85/626 |
| 2022/0251391 A1* | 8/2022 | Matsumura | C09B 57/004 |
| 2022/0310929 A1* | 9/2022 | Snaith | H10K 30/40 |
| 2023/0227486 A1* | 7/2023 | Nishide | C09K 11/06 |

FOREIGN PATENT DOCUMENTS

| | | |
|---|---|---|
| JP | 2005123013 | 5/2005 |
| JP | 2009167348 | 7/2009 |
| WO | 2019230562 | 12/2019 |

OTHER PUBLICATIONS

"Search Report of Europe Counterpart Application", issued on Jun. 6, 2023, p. 1-p. 9.

Andrii V.Kulinich, et al., "Structure and redox properties of polymethine dyes: Electrochemical and DFT/TD-DFT study," Dyes and Pigments, vol. 161, Sep. 2018, pp. 24-33.

"International Search Report (Form PCT/ISA/210) of PCT/JP2021/000310," mailed on Mar. 30, 2021, with English translation thereof, pp. 1-5.

"Written Opinion of the International Searching Authority (Form PCT/ISA/237) of PCT/ JP2021/000310," mailed on Mar. 30, 2021, with English translation thereof, pp. 1-6.

* cited by examiner

PHOTOELECTRIC CONVERSION ELEMENT, IMAGING ELEMENT, AND OPTICAL SENSOR

CROSS-REFERENCE TO RELATED APPLICATIONS

This application is a Continuation of PCT International Application No. PCT/JP2021/000310 filed on Jan. 7, 2021, which claims priority under 35 U.S.C. § 119(a) to Japanese Patent Application No. 2020-002790 filed on Jan. 10, 2020. The above application is hereby expressly incorporated by reference, in its entirety, into the present application.

BACKGROUND OF THE INVENTION

1. Field of the Invention

The present invention relates to a photoelectric conversion element, an imaging element, and an optical sensor.

2. Description of the Related Art

In recent years, the development of an element (for example, an imaging element) having a photoelectric conversion film has been progressing.

For example, it is disclosed in JP2009-167348A that "a photoelectric conversion element comprising: a pair of electrodes; and a photoelectric conversion section which is provided between the pair of electrodes and which includes a photoelectric conversion layer containing an organic dye, wherein the organic dye is a merocyanine coloring agent having a fluorescence quantum yield of 10% or higher (Claim 6)".

SUMMARY OF THE INVENTION

In recent years, along with the demand for improving the performance of imaging elements, optical sensors, and the like, further improvements are required for various characteristics required for photoelectric conversion elements used therein.

For example, even in a case where the photoelectric conversion element is continuously driven for a long time, it is required to be able to suppress changes in external quantum efficiency of the photoelectric conversion element.

The present inventors have studied the photoelectric conversion element having the configuration disclosed in JP2009-167348A and have found that there is room for improvement in suppression of a change in an external quantum efficiency due to a continuous drive.

In addition, even in a case where the photoelectric conversion element is continuously driven for a long time, it is also required to be able to suppress changes in a dark current of the photoelectric conversion element.

In view of the above circumstances, an object of the present invention is to provide a photoelectric conversion element that is excellent in suppression of a change in an external quantum efficiency (for example, an external quantum efficiency with respect to light at a wavelength of 460 nm and/or a wavelength of 560 nm) during a continuous drive, and that is excellent in suppression of a change in a dark current during a continuous drive.

Another object of the present invention is to provide an imaging element and an optical sensor related to the photoelectric conversion element.

The present inventors have conducted extensive studies on the above-described problems, and as a result, the inventors have found that it is possible to solve the above-described problems by configurations described below and have completed the present invention.

[1]

A photoelectric conversion element comprising, in the following order: a conductive film; a photoelectric conversion film; and a transparent conductive film, in which the photoelectric conversion film includes a first compound that has a maximum absorption wavelength at a wavelength of 500 to 620 nm, that has no ionic group, and that is a compound represented by Formula (1), and a second compound that is different from the first compound and that has a maximum absorption wavelength at a wavelength of 450 to 550 nm, (1)

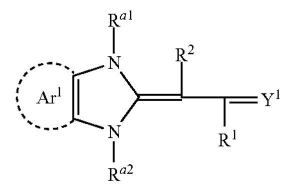

(1-1)

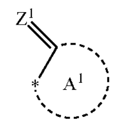

(1-2)

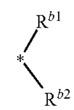

in Formula (1), $Y^1$ represents a group represented by Formula (1-1) or a group represented by Formula (1-2), $A^1$ represents a ring which contains at least two carbon atoms and may have a substituent, $Z^1$ represents an oxygen atom, a sulfur atom, $=NR^{Z1}$, or $=CR^{Z2}R^{Z3}$, $R^{Z1}$ represents a hydrogen atom or a substituent, $R^{Z2}$ and $R^{Z3}$ each independently represent a cyano group or $-COOR^{Z4}$, $R^{Z4}$ represents an alkyl group which may have a substituent, an aryl group which may have a substituent, or a heteroaryl group which may have a substituent, $R^{b1}$ and $R^{b2}$ each independently represent a cyano group or $-COOR^{b3}$, $R^{b3}$ represents an alkyl group which may have a substituent, an aryl group which may have a substituent, or a heteroaryl group which may have a substituent, $R^1$ and $R^2$ each independently represent a hydrogen atom or a substituent, $R^{a1}$ and $R^{a2}$ each independently represent an aryl group which may have a substituent, $-C(R^{L1})(R^{L2})(R^{L3})$, or a heteroaryl group which may have a substituent, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L3}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, $Ar^1$ represents an aromatic ring which may have a substituent, and

* represents a bonding position.

[2]

The photoelectric conversion element according to [1], in which the photoelectric conversion film includes a layer containing the first compound and a layer containing the second compound.

[3]

The photoelectric conversion element according to [2], in which at least one of a condition in which the layer containing the first compound has a bulk heterostructure formed in a state where the first compound and an n-type semiconductor material are mixed or a condition in which the layer containing the second compound has a bulk heterostructure formed in a state where the second compound and an n-type semiconductor material are mixed is satisfied.

[4]

The photoelectric conversion element according to [2] or [3], in which the layer containing the first compound has a bulk heterostructure formed in a state where the first compound and an n-type semiconductor material are mixed, and the layer containing the second compound has a bulk heterostructure formed in a state where the second compound and an n-type semiconductor material are mixed.

[5]

The photoelectric conversion element according to [2] or [3], in which at least one of a condition in which the layer containing the first compound has a bulk heterostructure formed in a state where the first compound, an n-type semiconductor material, and a p-type semiconductor material are mixed or a condition in which the layer containing the second compound has a bulk heterostructure formed in a state where the second compound, an n-type semiconductor material, and a p-type semiconductor material are mixed is satisfied.

[6]

The photoelectric conversion element according to any one of [2] to [5], in which the layer containing the first compound has a bulk heterostructure formed in a state where the first compound, an n-type semiconductor material, and a p-type semiconductor material are mixed, and the layer containing the second compound has a bulk heterostructure formed in a state where the second compound, an n-type semiconductor material, and a p-type semiconductor material are mixed.

[7]

The photoelectric conversion element according to [1], in which the photoelectric conversion film includes a mixture layer formed in a state where the first compound and the second compound are mixed.

[8]

The photoelectric conversion element according to [7], in which the mixture layer further includes an n-type semiconductor material and has a bulk heterostructure formed in a state where the first compound, the second compound, and the n-type semiconductor material are mixed.

[9]

The photoelectric conversion element according to [8], in which the mixture layer further includes a p-type semiconductor material and has a bulk heterostructure formed in a state where the first compound, the second compound, the n-type semiconductor material, and the p-type semiconductor material are mixed.

[10]

The photoelectric conversion element according to any one of [3] to [6], [8], and [9], in which the n-type semiconductor material includes fullerenes selected from the group consisting of a fullerene and a derivative thereof.

[11]

The photoelectric conversion element according to any one of [1] to [10], in which the compound represented by Formula (1) is a compound represented by Formula (2), (2)

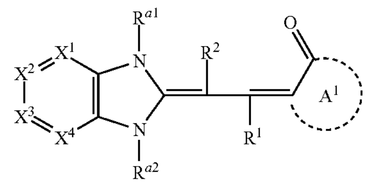

in Formula (2), $A^1$ represents a ring which contains at least two carbon atoms and may have a substituent, $R^1$ and $R^2$ each independently represent a hydrogen atom or a substituent, $R^{a1}$ and $R^{a2}$ each independently represent an aryl group which may have a substituent, —C($R^{L1}$)($R^{L2}$)($R^{L3}$), or a heteroaryl group which may have a substituent, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L3}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, $X^1$ to $X^4$ each independently represent a nitrogen atom or —$CR^{c1}$═, $R^{c1}$ represents a hydrogen atom or a substituent, and in a case where a plurality of $R^{c1}$'s exist, the plurality of $R^{c1}$'s may be bonded to each other to form a ring.

[12]

The photoelectric conversion element according to [11], in which in Formula (2), $X^1$ and $X^4$ each represent a nitrogen atom.

[13]

The photoelectric conversion element according to any one of [1] to [12], in which the compound represented by Formula (1) is a compound represented by Formula (3), (3)

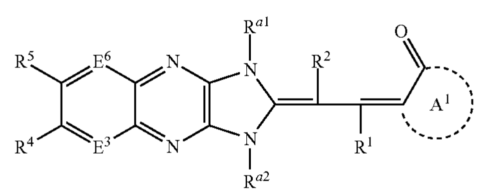

in Formula (3), $A^1$ represents a ring which contains at least two carbon atoms and may have a substituent, $E^3$ represents a nitrogen atom or —$CR^3$═, $E^6$ represents a nitrogen atom or —$CR^6$═, $R^1$ to $R^6$ each independently represent a hydrogen atom or a substituent, $R^{a1}$ and $R^{a2}$ each independently represent an aryl group which may have a substituent, —C($R^{L1}$)($R^{L2}$)($R^{L3}$), or a heteroaryl group which may have a substituent, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, and $R^3$ and $R^4$, $R^4$ and $R^5$, and $R^5$ and $R^6$ each may be independently bonded to each other to form a ring.

[14]

The photoelectric conversion element according to any one of [1] to [13], in which in Formula (1), $Y^1$ represents the group represented by Formula (1-1), and in Formula (1-1), the ring represented by $A^1$ is a ring having any of groups represented by Formulae (AW1) to (AW3), $$*1\text{-}NR^{L}—CO—CR^{ZA}{=}CR^{ZB}—*2 \quad \text{(AW1)}$$

$$*1\text{-}NR^{L}—N{=}CR^{Y5}—*2 \quad \text{(AW2)}$$

$$*1\text{-}CR^{Y1}{=}CR^{Y2}—C({=}CR^{ZC}R^{ZD})\text{-}*2 \quad \text{(AW3)}$$

in Formulae (AW1) to (AW3), *1 represents a bonding position with a carbon atom in —C(=$Z^1$)— which is specified in Formula (1-1), *2 represents a bonding position with a carbon atom marked with * in Formula (1-1), $R^L$ represents a hydrogen atom or a substituent, $R^{Y1}$, $R^{Y2}$, and $R^{Y5}$ each independently represent a hydrogen atom or a substituent, $R^{ZA}$ to $R^{ZD}$ each independently represent a hydrogen atom or a substituent, and $R^{Y1}$ and $R^{Y2}$ may be bonded to each other to form a ring.

[15]

The photoelectric conversion element according to any one of [1] to [14], further comprising one or more interlayers between the conductive film and the transparent conductive film, in addition to the photoelectric conversion film.

[16]

The photoelectric conversion element according to [15], in which the photoelectric conversion element includes at least an electron blocking film as the interlayer.

[17]

The photoelectric conversion element according to [16], in which an ionization potential Ip(B) of the electron blocking film, an ionization potential Ip (1) of the first compound, and an ionization potential Ip (2) of the second compound satisfy a relationship of Ip(B)≤Ip (1) and Ip(B)≤Ip (2).

[18]

An imaging element comprising the photoelectric conversion element according to any one of [1] to [17].

[19]

An optical sensor comprising the photoelectric conversion element according to any one of [1] to [17].

According to the present invention, it is possible to provide the photoelectric conversion element that is excellent in suppression of a change in an external quantum efficiency during a continuous drive, and that is excellent in suppression of a change in a dark current during a continuous drive.

In addition, according to the present invention, it is possible to provide an imaging element and an optical sensor related to the photoelectric conversion element.

DESCRIPTION OF THE PREFERRED EMBODIMENTS

Figure 1:
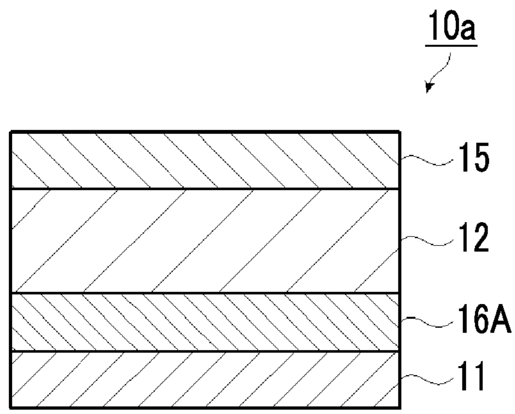
FIG. 1 is a schematic cross-sectional view illustrating a configuration example of a photoelectric conversion element.

Hereinafter, suitable embodiments of a photoelectric conversion element of the present invention will be described.

In addition, in the present specification, a "substituent" includes a group exemplified by a substituent W described later, unless otherwise specified.

(Substituent W)

A substituent W in the present specification will be described below.

Examples of the substituent W include a halogen atom (such as a fluorine atom, a chlorine atom, a bromine atom, an iodine atom), an alkyl group (including a cycloalkyl group, a bicycloalkyl group, and a tricycloalkyl group), an alkenyl group (including a cycloalkenyl group and a bicycloalkenyl group), an alkynyl group, an aryl group, a heteroaryl group (the heteroaryl group may also be referred to as a heterocyclic group), a cyano group, a nitro group, an alkoxy group, an aryloxy group, a silyloxy group, a heterocyclic oxy group, an acyloxy group, a carbamoyloxy group, an alkoxycarbonyloxy group, an aryloxycarbonyloxy group, a secondary or tertiary amino group (including an anilino group), an alkylthio group, an arylthio group, a heterocyclic thio group, an alkyl or an arylsulfinyl group, an alkyl or an arylsulfonyl group, an acyl group, an aryloxycarbonyl group, an alkoxycarbonyl group, an aryl or a heterocyclic azo group, an imide group, a phosphino group, a phosphinyl group, a phosphinyloxy group, a phosphinylamino group, a phosphono group, and a silyl group. Each of the above-described groups may further have a substituent (for example, one or more groups of each of the above-described groups), as possible. For example, an alkyl group which may have a substituent is also included as a form of the substituent W.

In addition, in a case where the substituent W has a carbon atom, the number of carbon atoms of the substituent W is, for example, 1 to 20.

The number of atoms other than a hydrogen atom included in the substituent W is, for example, 1 to 30.

The first compound, the second compound, the n-type semiconductor material, and/or the p-type semiconductor material, which will be described later, preferably do not contain, as a substituent, a carboxy group, a salt of a carboxy group, phosphoric acid group, a salt of a phosphoric acid group, a sulfonic acid group, a salt of a sulfonic acid group, a hydroxy group, a SH group, an acylamino group, a carbamoyl group, an ureido group, a boronic acid group (—B(OH)$_2$), and/or —$NH_2$ from the viewpoint of appropriately adjusting the vapor deposition suitability.

In the present specification, examples of the halogen atom include a fluorine atom, a chlorine atom, a bromine atom, and an iodine atom.

In the present specification, unless otherwise specified, the number of carbon atoms of the alkyl group is preferably 1 to 20, more preferably 1 to 10, and still more preferably 1 to 6.

The alkyl group may be any of linear, branched, or cyclic.

Examples of the alkyl group include a methyl group, an ethyl group, an n-propyl group, an i-propyl group, an n-butyl group, a t-butyl group, an n-hexyl group, a cyclopentyl group, and the like.

In addition, the alkyl group may be, for example, a cycloalkyl group, a bicycloalkyl group, or a tricycloalkyl group, and may have a cyclic structure thereof as a partial structure.

In the alkyl group which may have a substituent, a substituent which may be contained in the alkyl group is not particularly limited, an example thereof includes the substituent W, and an aryl group (preferably having 6 to 18 carbon atoms, and more preferably having 6 carbon atoms), a heteroaryl group (preferably having 5 to 18 carbon atoms, and more preferably having 5 and 6 carbon atoms), or a halogen atom (preferably a fluorine atom or a chlorine atom) is preferable.

Examples of the alkylene group in the present specification include an alkylene group in which one hydrogen atom is removed from the above-described alkyl group to form a divalent group.

In the present specification, unless otherwise specified, the above-described alkyl group is preferable as an alkyl group moiety in the alkoxy group. The alkyl group moiety in the alkylthio group is preferably the above-described alkyl group.

In the alkoxy group which may have a substituent, the substituent which may be contained in the alkoxy group includes the same examples as the substituent in the alkyl group which may have a substituent. In the alkylthio group which may have a substituent, the substituent which may be contained in the alkylthio group includes the same examples as the substituent in the alkyl group which may have a substituent.

In the present specification, the alkenyl group may be any of linear, branched, or cyclic, unless otherwise specified. The alkenyl group preferably has 2 to 20 carbon atoms. In the alkenyl group which may have a substituent, the substituent which may be contained in the alkenyl group includes the same examples as the substituent in the alkyl group which may have a substituent.

Examples of the alkenylene group in the present specification include an alkenylene group in which one hydrogen atom is removed from the above-described alkenyl group to form a divalent group.

In the present specification, an alkynyl group may be any of linear, branched, or cyclic, unless otherwise specified. The alkynyl group preferably has 2 to 20 carbon atoms. In the alkynyl group which may have a substituent, the substituent which may be contained in the alkynyl group includes the same examples as the substituent in the alkyl group which may have a substituent.

Examples of the alkinylene group in the present specification include an alkinylene group in which one hydrogen atom is removed from the above-described alkynyl group to form a divalent group.

In the present specification, unless otherwise specified, the aryl group is preferably an aryl group having 6 to 18 ring members.

The aryl group may be monocyclic or polycyclic (for example, with 2 to 6 rings).

The aryl group is preferably, for example, a phenyl group, a naphthyl group, an anthryl group, or a phenanthrenyl group.

In the aryl group which may have a substituent, the substituent which may be contained in the aryl group is not particularly limited, and an example thereof includes the substituent W, an alkyl group which may have a substituent (preferably having 1 to 10 carbon atoms) is preferable, and a methyl group is more preferable.

In a case where the aryl group which may have a substituent has a plurality of substituents, the plurality of substituents may be bonded to each other to form a ring. As described above, in the case where the plurality of substituents are bonded to each other to form a ring, for example, the aryl group which may have a substituent, as a whole, may form a fluorenyl group (such as 9,9-dimethylfluorenyl group) which may further have a substituent.

Examples of the arylene group in the present specification include an arylene group in which one hydrogen atom is removed from ring member atoms of the above-described aryl group to form a divalent group.

In the present specification, unless otherwise specified, the heteroaryl group is preferably a heteroaryl group having a monocyclic or polycyclic ring structure, which contains a heteroatom such as a nitrogen atom, a sulfur atom, an oxygen atom, a selenium atom, a tellurium atom, a phosphorus atom, a silicon atom, and/or a boron atom.

The number of carbon atoms among the ring member atoms of the above-described heteroaryl group is not particularly limited, but is preferably 3 to 18, and more preferably 3 to 5.

The number of heteroatoms among the ring member atoms of the heteroaryl group is not particularly limited, but is preferably 1 to 10, more preferably 1 to 4, and still more preferably 1 and 2.

The heteroaryl group may be monocyclic or polycyclic (for example, with 2 to 6 rings).

The number of ring members of the heteroaryl group is not particularly limited, but is preferably 5 to 15.

Examples of the above-described heteroaryl group include a furyl group, a pyridyl group, a quinolyl group, an isoquinolyl group, an acridinyl group, a phenanthridinyl group, a pteridinyl group, a pyrazinyl group, a quinoxalinyl group, a pyrimidinyl group, a quinazolyl group, a pyridazinyl group, a cinnolinyl group, a phthalazinyl group, a triazinyl group, an oxazolyl group, a benzoxazolyl group, a thiazolyl group, a benzothiazolyl group, an imidazolyl group, a benzimidazolyl group, a pyrazolyl group, an indazolyl group, an isoxazolyl group, a benzisoxazolyl group, an isothiazolyl group, a benzisothiazolyl group, an oxadiazolyl group, a thiadiazolyl group, a triazolyl group, a tetrazolyl group, a benzofuryl group, a thienyl group, a benzothienyl group, a dibenzofuryl group, a dibenzothienyl group, a pyrrolyl group, an indolyl group, an imidazopyridinyl group, a carbazolyl group, and the like.

In the heteroaryl group which may have a substituent, the substituent which may be contained in the heteroaryl group is not particularly limited, and an example thereof includes the substituent W.

In a case where the heteroaryl group which may have a substituent has a plurality of substituents, the plurality of substituents may be bonded to each other to form a ring.

Examples of the heteroarylene group in the present specification include a heteroarylene group in which one hydrogen atom is removed from ring member atoms of the above-described heteroaryl group to form a divalent group.

In the present specification, the aromatic ring group may be an aromatic hydrocarbon ring group or an aromatic heterocyclic group.

In a case where the aromatic ring group is monovalent, examples of the aromatic ring group include the above-described aryl group and heteroaryl group.

In a case where the aromatic ring group has an m valence (m is an integer of 2 or more and is preferably an integer of 2 to 5), examples of the aromatic ring group include a group in which (m−1) hydrogen atoms are removed from ring member atoms of the above-described aryl group or heteroaryl group.

In the present specification, unless otherwise specified, examples of a silyl group which may have a substituent include a group represented by —Si($R^{S1}$)($R^{S2}$)($R^{S3}$). $R^{S1}$, $R^{S2}$, and $R^{S3}$ each independently represent a hydrogen atom or a substituent, and preferably represent an alkyl group which may have a substituent, an alkoxy group which may have a substituent, an alkylthio group which may have a substituent, an aryl group which may have a substituent, or a heteroaryl group which may have a substituent.

In the present specification, as an ionic group, cationic groups such as cationic nitrogen atoms (>$N^+$<, =$N^+$<, and the like), as well as anionic groups such as —$SO_3^-$ and —$COO^-$ are collectively referred to as an ionic group. The ionic group in the compound may not be a group that is covalently bonded to other sites in the compound, and may be, for example, a group that is bonded by an ionic bond such as halide ions ($Cl^-$, and the like)

A bonding direction of a divalent group (for example, —CO—O—) described in the present specification is not limited unless otherwise specified. For example, In a case where Y is —CO—O— in the compound represented by General Formula "X—Y—Z", the compound may be "X—O—CO—Z" or may be "X—CO—O—Z".

In the present specification, regarding a compound that may have a geometric isomer (cis-trans isomer), a general formula or a structural formula representing the above compound may be described only in the form of either a cis isomer or a trans isomer for convenience. Even in such a case, unless otherwise specified, the form of the compound is not limited to either the cis form or the trans form, and the compound may be either the cis form or the trans form.

In addition, in the present specification, the numerical range represented by "to" means a range including numerical values denoted before and after "to" as a lower limit value and an upper limit value.

In the present specification, a hydrogen atom may be a light hydrogen atom (an ordinary hydrogen atom) or a deuterium atom (a double hydrogen atom and the like).

In the present specification, each of a maximum absorption wavelength and an absorption coefficient is a value obtained from a single film (a thin film consisting of only a compound to be evaluated) of each compound, which is subjected to the measurement. The absorption coefficient is a rate at which light is absorbed per unit length in a case where the light travels through the thin film, and is a value calculated by substituting a numerical value into Expression "(absorbance at a wavelength required for obtaining an absorption coefficient)×0.434÷(thickness (cm))". Specifically, first, the compound to be evaluated is deposited on a transparent quartz glass having a thickness of 0.7 mm by a vacuum deposition method at a vapor deposition rate of 2 Å/sec to form a single film having a film thickness of 100 nm. Next, an absorbance in a visible region of 400 nm to 700 nm is measured by an ultraviolet and visible spectrophotometer with respect to the obtained single film, an absorbance at a wavelength required for obtaining an absorption coefficient is multiplied by 0.434, and the result value is then divided by a film thickness (unit: cm) of the single film to calculate an absorption coefficient at the wavelength.

The wavelength at which the absorption coefficient is maximized is defined as a maximum absorption wavelength.

[Photoelectric Conversion Element]

The photoelectric conversion element according to the embodiment of the present invention includes a conductive film, a photoelectric conversion film, and a transparent conductive film in this order, contains a first compound that has a maximum absorption wavelength at a wavelength of 500 to 620 nm, that has no ionic group, and that is a compound represented by Formula (1), and contains a second compound that is different from the first compound and that has a maximum absorption wavelength at a wavelength of 450 to 550 nm.

The mechanism by which the photoelectric conversion element according to the embodiment of the present invention can solve the above problems by adopting such a configuration is not always clear, but it is considered that both the first compound and the second compound that are used in the photoelectric conversion film contribute to the solution of the problems.

In addition, regarding the first compound, the compound represented by Formula (1) has a large ionization potential. Therefore, during a continuous drive, in the photoelectric conversion film, even though the first compounds or the first compound and the second compound perform molecular motion in the layer containing the first compound or at an interface between the layer containing the first compound and the layer containing the second compound, and the like, to form an aggregate, it is difficult to obtain a component with a small ionization potential that affects a dark current. Therefore, it is considered that the suppression of a change in a dark current during a continuous drive can be improved.

Hereinafter, the description that at least one of the suppression of a change in an external quantum efficiency (particularly, an external quantum efficiency for light having a wavelength of 460 nm and/or a wavelength of 560 nm) during a continuous drive or the suppression of a change in a dark current during a continuous drive is excellent is simply referred to as "the effect of the present invention is excellent".

Hereinafter, the first compound and the second compound are collectively referred to as a specific compound.

FIG. 1 is a schematic cross-sectional view of one embodiment of a photoelectric conversion element of the present invention.

A photoelectric conversion element **10*a* illustrated in FIG. 1 has a configuration in which a conductive film (hereinafter, also referred to as a lower electrode) 11 functioning as a lower electrode, an electron blocking film 16A, a photoelectric conversion film 12, and a transparent conductive film (hereinafter, also referred to as an upper electrode) 15** functioning as an upper electrode are laminated in this order.

The photoelectric conversion film 12 contains the second compound that has a maximum absorption wavelength at a wavelength of 450 to 550 nm, the second compound being different from the first compound that has a maximum absorption wavelength at a wavelength of 500 to 620 nm, has no ionic group, and is a compound represented by Formula (1).

The photoelectric conversion film 12 may be a single layer type consisting of one layer or a laminated type consisting of a plurality of layers.

In a case where the photoelectric conversion film 12 is a single layer type, for example, the photoelectric conversion film 12 may be a mixture layer formed in a state where the first compound and the second compound are mixed with each other.

Figure 2:
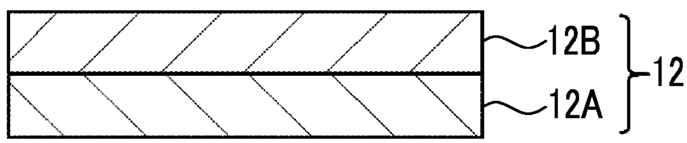
FIG. 2 is a schematic cross-sectional view illustrating a configuration example of a photoelectric conversion film.

FIG. 2 can also illustrate a schematic cross-sectional view of an embodiment of a laminated photoelectric conversion film.

Regarding the photoelectric conversion film 12 illustrated in FIG. 2, the photoelectric conversion film 12 (laminated photoelectric conversion film 12) is formed by containing the first compound and the second compound and is formed with a layer 12A containing the second compound and a layer 12B containing the first compound, which are laminated in this order.

It is also preferable that the layer containing the first compound substantially contains no second compound. For example, a content of the second compound to a content of the first compound in the layer containing the first compound (=(film thickness in terms of single layer of second compound/film thickness in terms of single layer of first compound)×100) is preferably 0% to 30% by volume, more preferably 0% to 10% by volume, and still more preferably 0% to 1% by volume.

It is also preferable that the layer containing the second compound is substantially no first compound. For example, a content of the first compound to a content of the second compound in the layer containing the second compound (=(film thickness in terms of single layer of first compound/film thickness in terms of single layer of second compound×100) is preferably 0% to 30% by volume, more preferably 0% to 10% by volume, and still more preferably 0% to 1% by volume.

Although the photoelectric conversion film 12 in FIG. 2 illustrates the form in which the layer 12A containing the second compound and the layer 12B containing the first compound are laminated in this order from the bottom, in the state where the photoelectric conversion film 12 is actually incorporated in the photoelectric conversion element, the lamination order of the layer 12A containing the second compound and the layer 12B containing the first compound is not limited thereto. In the case where the photoelectric conversion film 12 illustrated in FIG. 2 is applied as the photoelectric conversion film 12 of the photoelectric conversion element 10*a* of FIG. 1, the layer 12A containing the second compound may be in contact with a lower electrode 11, or the layer 12B containing the first compound may be in contact with the lower electrode 11.

In addition, the form in which the layer 12A containing the second compound and the layer 12B containing the first compound are present one by one is illustrated in FIG. 2, but the laminated photoelectric conversion film 12 may be adopted as long as the first compound and the second compound are individually contained in the entire laminated photoelectric conversion film 12. For example, a laminated photoelectric conversion film 12 in which at least one of the layer 12A containing the second compound or the layer 12B containing the first compound is present in two or more layers may be used. In the laminated photoelectric conversion film 12, one or more layers are the mixture layers, and the other layer may be any one of the layer containing the first compound or the layer containing the second compound.

Figure 3:
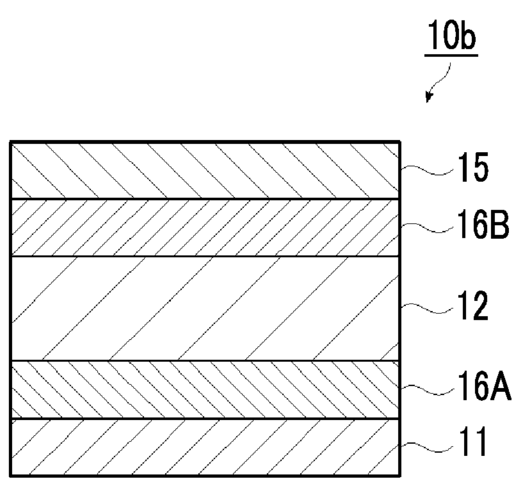
FIG. 3 is a schematic cross-sectional view illustrating a configuration example of the photoelectric conversion element.

FIG. 3 illustrates a configuration example of another photoelectric conversion element. A photoelectric conversion element 10*b* illustrated in FIG. 3 has a configuration in which the electron blocking film 16A, the photoelectric conversion film 12, a positive hole blocking film 16B, and the upper electrode 15 are laminated on the lower electrode 11 in this order. The lamination order of the electron blocking film 16A, the photoelectric conversion film 12, and the positive hole blocking film 16B in FIGS. 1 to 3 may be appropriately changed according to the application and the characteristics.

The photoelectric conversion film 12 in FIG. 3 may be the single layer photoelectric conversion film 12 consisting of one layer, or may be the laminated photoelectric conversion film 12 consisting of the plurality of layers (for example, the photoelectric conversion film 12 illustrated in FIG. 2).

In the photoelectric conversion element 10*a* (or 10*b*), it is preferable that light is incident on the photoelectric conversion film 12 through the upper electrode 15.

In a case where the photoelectric conversion element 10*a* (or 10*b*) is used, a voltage can be applied. In this case, it is preferable that the lower electrode 11 and the upper electrode 15 form a pair of electrodes, and a voltage of $1\times10^{-5}$ to $1\times10^{7}$ V/cm is applied between the pair of electrodes. From the viewpoint of the performance and power consumption, the applied voltage is more preferably $1\times10^{-4}$ to $1\times10^{7}$ V/cm, and still more preferably $1\times10^{-3}$ to $5\times10^{6}$ V/cm.

Regarding a voltage application method, in FIGS. 1 to 3, it is preferable that the voltage is applied such that the electron blocking film 16A side is a cathode and the photoelectric conversion film 12 side is an anode. In a case where the photoelectric conversion element 10*a* (or 10*b*) is used as an optical sensor, or also in a case where the photoelectric conversion element 10*a* (or 10*b*) is incorporated in an imaging element, the voltage can be applied by the same method.

As described in detail below, the photoelectric conversion element 10*a* (or 10*b*) can be suitably applied to applications of the imaging element.

Hereinafter, the form of each layer constituting the photoelectric conversion element according to the embodiment of the present invention will be described in detail.

<Photoelectric Conversion Film>

As described above, the photoelectric conversion film includes the first compound that has a maximum absorption wavelength at a wavelength of 500 to 620 nm, that has no ionic group, and that is a compound represented by Formula (1) and the second compound that is different from the first compound and that has a maximum absorption wavelength at a wavelength of 450 to 550 nm.

(First Compound)

The first compound will be described.

The first compound satisfies conditions that the first compound is a compound having a maximum absorption wavelength at a wavelength of 500 to 620 nm, is a compound having no ionic group, and is a compound represented by Formula (1).

From the viewpoint of the vapor deposition suitability and/or the photoelectric conversion suitability of a compound, the first compound has no ionic group.

Compound Represented by Formula (1)

Formula (1) is illustrated below.

(1)

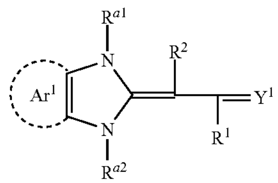

(1-1)

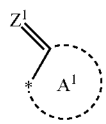

(1-2)

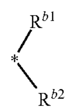

In Formula (1), $Y^1$ represents a group represented by Formula (1-1) or a group represented by Formula (1-2). Among these, the group represented by Formula (1-1) is preferable from the viewpoint of obtaining an excellent effect of the present invention. In Formulae (1-1) and (1-2), * represents a bonding position, and a carbon atom marked with * and a carbon atom bonded to $R^1$ are bonded to each other to form a double bond.

That is, the compound represented by Formula (1) is a compound represented by Formula (1-1a) or a compound represented by Formula (1-2a).

The symbols used in Formulae (1-1a) and (1-2a) have the same meanings as the corresponding symbols used in Formula (1).

(1-1a)

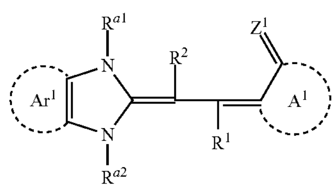

(1-2a)

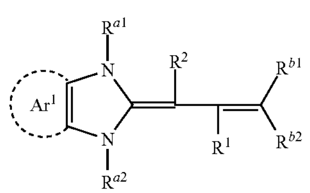

In Formula (1-1), A' represents a ring which contains at least two carbon atoms and may have a substituent. The two carbon atoms mean a carbon atom that is bonded to Z' specified in Formula (1-1), and a carbon atom that is adjacent to the carbon atom bonded to the Z' and is specified in Formula (1-1) (a carbon atom bonded with the carbon atom bonded to R' to form a double bond), and any carbon atom is an atom constituting A.

In addition, in the above ring, carbon atoms constituting the ring may be substituted with another carbonyl carbon (>C═O) and/or another thiocarbonyl carbon (>C═S). The other carbonyl carbon (>C═O) and the other thiocarbonyl carbon (>C═S) as used herein respectively mean a carbonyl carbon and a thiocarbonyl carbon each of which has a carbon atom other than the carbon atom bonded to $Z^1$ among the carbon atoms constituting the ring, as a constituent.

The carbon atoms of $A^1$ are preferably 3 to 30, more preferably 3 to 20, and still more preferably 3 to 15. The number of carbon atoms described above is a number containing two carbon atoms specified in Formula.

$A^1$ may have a heteroatom, and examples thereof preferably include a nitrogen atom, a sulfur atom, an oxygen atom, a selenium atom, a tellurium atom, a phosphorus atom, a silicon atom, and a boron atom.

The number of heteroatoms in $A^1$ is preferably 0 to 10, more preferably 0 to 5, and still more preferably 0 to 2. The number of heteroatoms in which a carbon atom constituting the ring represented by $A^1$ is substituted by the carbonyl carbon (>C═O) or the thiocarbonyl carbon (>C═S) and introduced into the ring (the carbonyl carbon (>C═O) described herein includes the carbonyl carbon specified in Formula (1-1)), and the number of heteroatoms that a substituent of $A^1$ has is not included in the number of heteroatoms.

$A^1$ may have a substituent, and examples of the substituent preferably include a halogen atom (preferably a chlorine atom), an alkyl group (may be any of linear, branched, or cyclic, and preferably has 1 to 10 carbon atoms and more preferably 1 to 6 carbon atoms), an aryl group (preferably has 6 to 18 carbon atoms, and more preferably 6 to 12 carbon atoms), a heteroaryl group (preferably has 5 to 18 carbon atoms, and more preferably 5 to 6 carbon atoms), or a silyl group (for example, an alkylsilyl group is mentioned, the alkyl group in the alkylsilyl group may be any of linear, branched or cyclic, and the silyl group preferably has 1 to 4 carbon atoms, and more preferably one carbon atom).

$A^1$ may or may not indicate aromaticity.

$A^1$ may have a monocyclic structure or a condensed ring structure, but is preferably a 5-membered ring, a 6-membered ring, or a fused ring containing at least any one of a 5-membered ring or a 6-membered ring. The number of rings forming the fused ring is preferably 1 to 4, and more preferably 1 to 3.

The ring represented by $A^1$ is usually preferably a ring used as an acidic nucleus (specifically, an acidic nucleus of a merocyanine coloring agent), and specific examples thereof are as follows:

(a) 1,3-dicarbonyl nuclei: for example, a 1,3-indandione nucleus, 1,3-cyclohexanedione, 5,5-dimethyl-1,3-cyclohexanedione, 1,3-dioxane-4,6-dione, and the like;

(b) pyrazolinone nuclei: for example, 1-phenyl-2-pyrazolin-5-one, 3-methyl-1-phenyl-2-pyrazolin-5-one, 3-cyano-1-phenyl-2-pyrazolin-5-one, 1-(2-benzothiazolyl)-3-methyl-2-pyrazolin-5-one, and the like;

(c) isoxazolinone nuclei: for example, 3-phenyl-2-isoxazolin-5-one, 3-methyl-2-isoxazolin-5-one, and the like;

(d) oxindole nuclei: for example, 1-alkyl-2,3-hydro-2-oxindole, and the like;

(e) 2,4,6-trioxohexahydropyrimidine nuclei: for example, barbituric acid or 2-thibarbituric acid and derivatives thereof, and the like, and examples of the derivatives include 1-alkyl compounds such as 1-methyl and 1-ethyl, 1,3-dialkyl compounds such as 1,3-dimethyl, 1,3-diethyl, and 1,3-dibutyl, 1,3-diaryl compounds such as 1,3-diphenyl, 1,3-di(p-chlorophenyl), and 1,3-di(p-ethoxycarbonylphenyl), 1-alkyl-1-aryl compounds such as 1-ethyl-3-phenyl, 1,3-diheteroaryl compounds such as 1,3-di(2-pyridyl), and the like;

(f) 2-thio-2,4-thiazolidinedione nuclei: for example, rhodanine and derivatives thereof, and the like, and examples of the derivatives include 3-aklylrhodanine such as 3-methylrhodanine, 3-ethylrhodanine, and 3-allylrhodanine, 3-arylrhodanine such as 3-phenylrhodanine, 3-heteroarylrhodanine such as 3-(2-pyridyl)rhodanine, and the like;

(g) 2-thio-2,4-oxazolidinedione nuclei (2-thio-2,4-(3H, 5H)-oxazoledione nuclei): for example, 3-ethyl-2-thio-2,4-oxazolidinedione, and the like;

(h) thianaphthenone nuclei: for example, 3(2H)-thianaphthenone-1,1-dioxide, and the like;

(i) 2-thio-2,5-thiazolidinedione nuclei: for example, 3-ethyl-2-thio-2,5-thiazolidinedione, and the like;

(j) 2,4-thiazolidinedione nuclei: for example, 2,4-thiazolidinedione, 3-ethyl-2,4-thiazolidinedione, 3-phenyl-2,4-thiazolidinedione, and the like;

(k) thiazoliin-4-one nuclei: for example, 4-thiazolinone, 2-ethyl-4-thiazolinone, and the like;

(l) 2,4-imidazolidinedione (hydantoin) nuclei: for example, 2,4-imidazolidinedione, 3-ethyl-2,4-imidazolidinedione, and the like;

(m) 2-thio-2,4-imidazolidinedione (2-thiohydantoin) nuclei: for example, 2-thio-2,4-imidazolidinedione, 3-ethyl-2-thio-2,4-imidazolidinedione, and the like;

(n) imidazolin-5-one nuclei: for example, 2-propylmercapto-2-imidazolin-5-one, and the like;

(o) 3,5-pyrazolidinedione nuclei: for example, 1,2-diphenyl-3,5-pyrazolidinedione, 1,2-dimethyl-3,5-pyrazolidinedione, and the like;

(p) benzothiophen-3(2H)-one nuclei: for example, benzothiophen-3(2H)-one, oxobenzothiophen-3(2H)-one, dioxobenzothiophen-3(2H)-one, and the like;

(q) indanone nuclei: for example, 1-indanone, 3-phenyl-1-indanone, 3-methyl-1-indanone, 3,3-diphenyl-1-indanone, 3-(dicyanomethylidene)indan-1-one, 3,3-dimethyl-1-indanone, and the like;

(r) benzofuran-3-(2H)-one nucleus: for example, benzofuran-3-(2H)-one, and the like;

(s) 2,2-dihydrophenalene-1,3-dione nucleus, and the like; and (t) Pyridone nucleus: for example, 3-cyano-1-ethyl-6-hydroxy-4-methyl-2-pyridone, 3-cyano-1-methyl-6-hydroxy-4-methyl-2-pyridone, 3-cyano-1-ethyl-6-hydroxy-4-trifluoromethyl-2-pyridone, and 3-cyano-1-phenyl-6-hydroxy-4-trifluoromethyl-2-pyridone, and the like.

$A^1$ may be a ring having a group represented by Formula (AW).

*1-L-Y—Z—*2 (AW)

In Formula (AW), *1 represents a bonding position with the carbon atom in —C(=Z$^1$)— which is specified in Formula (1-1) (or Formula (1-1a)). *2 represents a bonding position with a carbon atom marked with * in Formula (1-1) (in other words, *2 represents a bonding position with a carbon atom bonded to the carbon atom, to which $R^1$ in Formula (1) is directly bonded to form a double bond).

That is, in a case where $A^1$ is a ring having a group represented by Formula (AW), a compound represented by Formula (1), in which $Y^1$ is a group represented by Formula (1-1), (or a compound represented by Formula (1-1a) is a compound represented by Formula (1-lb).

The symbols used in Formulae (1-lb) have the same meanings as the corresponding symbols used in Formula (1).

(1-1b)

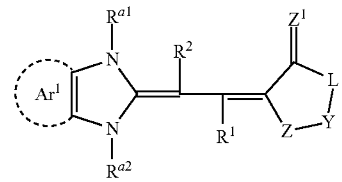

In Formula (AW), L represents a single bond or —NR$^L$—. $R^L$ represents a hydrogen atom or a substituent. Among these, $R^L$ is preferably an alkyl group, an aryl group, or a heteroaryl group, and more preferably an alkyl group or an aryl group. The alkyl group and the aryl group each may have a substituent. As a substituent that the aryl group may have, an alkyl group (for example, having 1 to 3 carbon atoms) is preferable.

L is preferably a single bond.

Y represents —CR$^{Y1}$=CR$^{Y2}$—, —CS—NR$^{Y3}$—, —CO—, —CS—, —NR$^{Y4}$—, —N=CR$^{Y5}$—, —CO—NR$^{Y6}$—, or 1,8-naphthalenediyl group which may have a substituent, and among these, —CR$^{Y1}$=CR$^{Y2}$— is preferable.

$R^{Y1}$ to $R^{Y6}$ each independently represent a hydrogen atom or a substituent. Among these, $R^{Y1}$ to $R^{Y6}$ each are independently preferably an alkyl group, a cyano group, an aryl group, or a heteroaryl group.

In addition, in a case where Y represents —CR$^{Y1}$=CR$^{Y2}$—, $R^{Y1}$ and $R^{Y2}$ may be bonded to each other to form a ring. Examples of the ring formed by $R^{Y1}$ and $R^{Y2}$ being bonded to each other include an aromatic ring (such as an aromatic hydrocarbon ring and an aromatic heterocycle), and specific examples thereof include a benzene ring and a pyridine ring. The ring formed by bonding $R^{Y1}$ and $R^{Y2}$ to each other may further have a substituent, and furthermore, such substituents may be bonded to each other to form a ring.

Z represents a single bond, —CO—, —S—, —$SO_2$—, —CR$^{ZA}$=CR$^{ZB}$—, or —C(=CR$^{ZC}$R$^{ZD}$)—, and among these, —CO—, —CR$^{ZA}$=CR$^{ZB}$—, or —C(=CR$^{ZC}$R$^{ZD}$)— is preferable.

$R^{ZA}$ to $R^{ZD}$ each independently represent a hydrogen atom or a substituent.

$R^{ZA}$ to $R^{ZD}$ each are independently preferably an alkyl group, a cyano group, an aryl group, or a heteroaryl group. The alkyl group may have a substituent, and is also preferably an alkyl group (for example, having 1 to 3 carbon atoms) that has a halogen atom as a substituent such as a trifluoromethyl group, for example.

The combination of L, Y, and Z described above is preferably a combination in which a ring formed by bonding -L-Y—Z— to two carbon atoms specified in Formula (1-1) is a 5-membered ring or a 6-membered ring. However, as described above, the 5-membered ring or the 6-membered ring may be condensed with a different ring (preferably a benzene ring) to form a condensed ring structure.

Example of the more specific form of a group represented by Formula (AW) include a group represented by any of the following formulae (AW1) to (AW6).

That is, $Y^1$ in Formula (1) represents a group represented by Formula (1-1), and the ring represented by $A^1$ in Formula (1-1) may be a ring having a group represented by any of Formulae (AW1) to (AW6).

Among these, the group represented by any of Formulae (AW1) to (AW6) is preferably a group represented by any of Formulae (AW1) to (AW3).

$$*1\text{-}NR^{L}—CO—CR^{ZA}═CR^{ZB}—*2 \quad (AW1)$$

$$*1\text{-}NR^{L}—N═CR^{Y5}—*2 \quad (AW2)$$

$$*1\text{-}CR^{Y1}═CR^{Y2}—C(═CR^{ZC}R^{ZD})\text{-}*2 \quad (AW3)$$

$$*1\text{-}NR^{L}—NR^{Y4}—CO\text{-}*2 \quad (AW4)$$

$$*1\text{-}NR^{L}CO—NR^{Y6}—CO\text{-}*2 \quad (AW5)$$

$$*1\text{-}CR^{Y1}═CR^{Y2}—CO\text{-}*2 \quad (AW6)$$

The structure of each group in Formulae (AW1) to (AW6) is the same as that described in the description of the groups represented by Formula (AW).

Among these, A' is also preferably a ring having a group represented by Formula (AX) from the viewpoint that the heat resistance of the photoelectric conversion element is more excellent.

(AX)

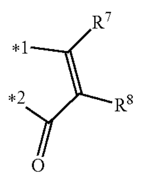

In Formula (AX), *1 and *2 have the same meanings as *1 and *2 in Formula (AW), respectively.

$R^7$ to $R^8$ each independently represent a hydrogen atom or a substituent.

$R^7$ and $R^8$ are preferably bonded to each other to form a ring. Examples of the ring formed by bonding $R^7$ and $R^8$ to each other include aromatic rings (such as an aromatic hydrocarbon ring and an aromatic heterocycle), and specific examples thereof include a benzene ring, a pyrazine ring, and a pyridine ring.

The ring formed by bonding $R^7$ and $R^8$ to each other preferably further has a substituent. As the substituent, a halogen atom is preferable, and a chlorine atom is more preferable.

In addition, the substituents contained in the ring formed by bonding $R^7$ and $R^8$ to each other may further be bonded to each other to form a ring (benzene ring or the like).

The group represented by Formula (AX) is preferably a group represented by Formula (AY) from the viewpoint that the heat resistance of the photoelectric conversion element is more excellent.

(AY)

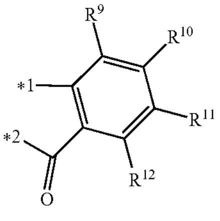

In Formula (AY), *1 and *2 have the same meanings as *1 and *2 in Formula (AX), respectively.

$R^9$ to $R^{12}$ each independently represent a hydrogen atom or a substituent. Among these, $R^9$ to $R^{12}$ each are independently preferably a hydrogen atom or a halogen atom, and more preferably a hydrogen atom or a chlorine atom.

$R^9$ and $R^{10}$ may be bonded to each other to form a ring, $R^{10}$ and $R^{11}$ may be bonded to each other to form a ring, and $R^{11}$ and $R^{12}$ may be bonded to each other to form a ring. Examples of the ring, which is formed by bonding $R^9$ and $R^{10}$, $R^{10}$ and $R^{11}$, and $R^{11}$ and $R^{12}$ to each other respectively, include an aromatic ring (aromatic hydrocarbon ring and aromatic heterocycle), and a specific example preferably includes a benzene ring.

Among these, it is preferable that $R^{10}$ and $R^{11}$ are bonded to each other to form a ring.

The ring, which is formed by bonding $R^9$ and $R^{10}$, $R^{10}$ and $R^{11}$, and $R^{11}$ and $R^{12}$ to each other respectively, may be further substituted with a substituent. Such substituents contained in the ring may be bonded to each other to form a ring. In addition, in an available case, the substituents contained in the ring and one or more of $R^9$ to $R^{12}$ may be bonded to each other to form one or more rings.

A group may be formed by bonding the substituents contained in the ring to each other to form a single bond.

In Formula (1-1), $Z^1$ represents an oxygen atom, a sulfur atom, $═NR^{Z1}$, or $═CR^{Z2}R^{Z3}$ $R^{z1}$ represents a hydrogen atom or a substituent. $R^{Z2}$ and $R^{Z3}$ each independently represent a cyano group or $—COOR^{Z4}$. $R^{Z4}$ represents an alkyl group which may have a substituent, an aryl group which may have a substituent, or a heteroaryl group which may have a substituent.

$Z^1$ is preferably an oxygen atom.

In Formula (1-2), $R^{b1}$ and $R^{b2}$ each independently represent a cyano group or $—COOR^{b3}$.

$R^{b3}$ represents an alkyl group which may have a substituent, an aryl group (phenyl group or the like) which may have a substituent, or a heteroaryl group which may have a substituent.

In Formula (1), $R^1$ and $R^2$ each independently represent a hydrogen atom or a substituent.

$R^1$ and $R^2$ each independently preferably represent a hydrogen atom.

In Formula (1), $R^{a1}$ and $R^{a2}$ each independently represent an aryl group which may have a substituent, $—C(R^{L1})(R^{L1})(R^{L3})$, or a heteroaryl group which may have a substituent.

The aryl group is preferably a phenyl group, a naphthyl group, or a fluorenyl group, and more preferably a phenyl group or a naphthyl group.

In a case where the aryl group is a phenyl group, the phenyl group preferably has a substituent, and the substituent is independently preferably an alkyl group (preferably having 1 to 3 carbon atoms).

In a case where the aryl group is a phenyl group, the number of substituents contained in the phenyl group is preferably 1 to 5, and more preferably 2 or 3.

In $—C(R^{L1})(R^{L2})(R^{L3})$, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L3}$ each independently represent an alkyl group which may have a substituent, an aryl group which may have a substituent, or a heteroaryl group which may have a substituent. An alkyl group which may have a substituent, an aryl group which may have a substituent, and a heteroaryl group which may have a substituent, which are represented by $R^{L1}$ to $R^{L3}$, may be bonded to each other to form a ring.

For example, the alkyl groups which may have a substituent may be bonded to each other to form a ring. A substituent in the aryl group which may have a substituent and the alkyl group which may have a substituent may be bonded to each other to form a ring. A substituent in the heteroaryl group which may have a substituent and the alkyl group which may have a substituent may be bonded to each other to form a ring. A substituent in the aryl group which may have a substituent and a substituent in another aryl group which may have a substituent may be bonded to each other to form a ring. A substituent in the aryl group which may have a substituent and a substituent in the heteroaryl group which may have a substituent may be bonded to each other to form a ring. A substituent in the heteroaryl group which may have a substituent and a substituent in another heteroaryl group which may have a substituent may be bonded to each other to form a ring.

A substituent in the ring formed as described above, and another alkyl group which may have a substituent, a substituent in another aryl group which may have a substituent, or a substituent in another heteroaryl group which may have a substituent may be bonded to form a ring.

As described above, a group may be formed by bonding the substituent and the substituent (for example, the substituent in the aryl group which may have a substituent and the substituent in the heteroaryl group which may have a substituent) to form a single bond.

In a case where the alkyl group which may have a substituent, the aryl group which may have a substituent, and the heteroaryl group which may have a substituent, which are represented by $R^{L1}$ to $R^{L3}$, may be bonded to each other to form a ring, —C($R^{L1}$)($R^{L2}$)($R^{L3}$) is preferably a group other than the aryl group and the heteroaryl group.

The alkyl groups represented by $R^{L1}$ to $R^{L3}$ each may be independently linear, branched, or cyclic. In the alkyl groups represented by $R^{L1}$ to $R^{L3}$, it is preferable that two alkyl groups are bonded to each other to form a ring.

More specifically, for example, the alkyl group represented by $R^{L1}$ and the alkyl group represented by $R^{L2}$ may be bonded to each other to form a ring. Furthermore, a substituent contained in a ring (a monocyclic cycloalkane ring or the like), which is formed by bonding the alkyl group represented by $R^{L1}$ and the alkyl group represented by $R^{L2}$ to each other, and an alkyl group represented by $R^{L}$ may be bonded to each other to form a polycycle (a polycyclic cycloalkane ring or the like).

That is, —C($R^{L1}$)($R^{L2}$)($R^{L3}$) may be a cycloalkyl group (preferably a cyclohexyl group) which may have a substituent. The number of membered rings of the cycloalkyl group is preferably 3 to 12, more preferably 5 to 8, and still more preferably 6.

The cycloalkyl group may be monocyclic (a cyclohexyl group or the like) or polycyclic (1-adamantyl group or the like).

The cycloalkyl group preferably has a substituent. In a case where the cycloalkyl group has a substituent, a carbon atom adjacent to a carbon atom directly bonded to the nitrogen atom specified in General Formula (1) (that is, the "C" atom specified in "—C($R^{L1}$)($R^{L2}$)($R^{L3}$)") preferably has a substituent.

An example of a substituent which may be contained in the cycloalkyl group includes an alkyl group (preferably having 1 to 3 carbon atoms).

Substituents contained in the cycloalkyl group may be bonded to each other to form a ring, and the ring formed by bonding the substituents to each other may be a ring other than a cycloalkane ring.

$R^{a1}$ and $R^{a2}$ each independently preferably represent a group represented by Formula (X), —C($R^{L1}$)($R^{L2}$)($R^{L3}$), a polycyclic aryl group which may have a substituent, or a polycyclic heteroaryl group which may have a substituent, from the viewpoint that the heat resistance of the photoelectric conversion element is more excellent.

Among these, $R^{a1}$ and $R^{a2}$ each are preferably independently a group represented by Formula (X), —C($R^{L1}$)($R^{L2}$)($R^{L3}$), or a polycyclic aryl group which may have a substituent, from the viewpoint of sublimation suitability of the photoelectric conversion element. The group represented by Formula (X) is preferably a group represented by Formula (Z) described below, and more preferably a group represented by Formula (ZB) described below.

The group represented by Formula (X) is a group shown below.

(X)

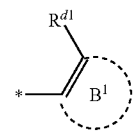

In Formula (X), $B^1$ represents a monocyclic aromatic ring which may have a substituent other than Rai.

$R^{d1}$ represents an alkyl group, a silyl group, an alkoxy group, an alkylthio group, a cyano group, a halogen atom, an aryl group, a heteroaryl group, an alkenyl group, or an alkynyl group.

These groups may further have a substituent as much as possible.

Examples of the monocyclic aromatic ring include a monocyclic aromatic hydrocarbon ring and a monocyclic aromatic heterocycle. An example of the aromatic hydrocarbon ring includes a benzene ring. Examples of the aromatic heterocycle include a pyrrole ring, a furan ring, a thiophene ring, an imidazole ring, and an oxazole ring.

Among these, the aromatic hydrocarbon ring is preferable, and the benzene ring is more preferable, from the viewpoint that the heat resistance of the photoelectric conversion element is more excellent.

The alkyl group represented by $R^{d1}$ preferably has 1 to 12 carbon atoms, more preferably has 1 to 6 carbon atoms, and still more preferably has 1 to 3 carbon atoms. In addition, the alkyl group may be —CH($R^{d3}$)($R^{d4}$) or —C($R^{d3}$)($R^{d4}$)($R^{d5}$). $R^{d3}$ to $R^{d5}$ each independently represent an aryl group, an alkyl group (for example, 1 to 3 carbon atoms), or a heteroaryl group.

Examples of the silyl group represented by $R^{d1}$ include a group represented by —Si($R^{p}$)($R^{q}$)($R^{r}$). $R^{p}$ to $R^{r}$ each independently represent a hydrogen atom or a substituent. Examples of the substituents represented by $R^{p}$ to $R^{r}$ include an alkyl group (the alkyl group may be any of linear, branched, or cyclic, and may have 1 to 4 carbon atoms), an aryl group, and a heteroaryl group. These groups may further have a substituent. The silyl group represented by $R^{d1}$ preferably has 1 to 12 carbon atoms, more preferably has 1 to 6 carbon atoms, and still more preferably has 3 carbon atoms.

The alkoxy group represented by $R^{d1}$ preferably has 1 to 12 carbon atoms, more preferably has 1 to 6 carbon atoms, and still more preferably has 1 to 3 carbon atoms.

The alkylthio group represented by $R^{d1}$ preferably has 1 to 12 carbon atoms, more preferably has 1 to 6 carbon atoms, and still more preferably has 1 to 3 carbon atoms.

Examples of the halogen atom represented by $R^{d1}$ include a fluorine atom, an iodine atom, a bromine atom, a chlorine atom, and the like.

The alkenyl group represented by $R^{d1}$ preferably has 2 to 12 carbon atoms, more preferably has 2 to 6 carbon atoms, and still more preferably has 2 to 3 carbon atoms.

The alkynyl group represented by $R^{d1}$ preferably has 2 to 12 carbon atoms, more preferably has 2 to 6 carbon atoms, and still more preferably has 2 to 3 carbon atoms.

Substituents which contained in $R^{d1}$ and $B^1$ may be bonded to each other to form a non-aromatic ring.

* represents a bonding position. The aromatic ring of $B^1$ is directly bonded to the nitrogen atom specified in Formula (1).

As the group represented by Formula (X), the group represented by Formula (Z) is preferable.

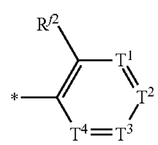

(Z)

In Formula (Z), $T^1$ to $T^4$ each independently represent —$CR^{e12}$= or a nitrogen atom (=N—). $R^{e12}$ represents a hydrogen atom or a substituent.

It is preferable that "at least one of $T^1$, $T^2$, $T^3$, or $T^4$ represents —$CR^{e12}$=" and at least one of $R^{e12}$ represents a substituent", and it is more preferable that "at least $T^4$ represents —$CR^{e12}$=, and $R^{e12}$ represents an alkyl group, an aryl group, or a heteroaryl group". In addition, the form of "at least $T^4$ represents —$CR^{e12}$=, and $R^{e12}$ is —$CH(R^{d3})(R^{d4})$, or —$C(R^{d3})(R^{d4})(R^{d5})$" may be adopted.

The —$CH(R^{d3})(R^{d4})$ and the —$C(R^{d3})(R^{d4})(R^{d5})$ will be described below.

The definition of the substituent is the same as the substituent W described above. Examples of the substituent include an alkyl group, an aryl group, a heteroaryl group, a silyl group, a halogen atom, a cyano group, and the like. In addition, these groups may further have a substituent (for example, a halogen atom such as a fluorine atom).

The alkyl group represented by $R^{e12}$ preferably has 1 to 12 carbon atoms, more preferably has 1 to 6 carbon atoms, and still more preferably has 1 to 3 carbon atoms. In addition, the alkyl group may be —$CH(R^{d3})(R^{d4})$ or —$C(R^{d3})(R^{d4})(R^{d5})$. $R^{d3}$ to $R^{d5}$ each independently represent an aryl group, an alkyl group (for example, 1 to 3 carbon atoms), or a heteroaryl group.

An example of the silyl group represented by $R^{e12}$ includes the silyl group described as the silyl group represented by $R^{d1}$.

Examples of the halogen atom represented by $R^{e12}$ include a fluorine atom, an iodine atom, a bromine atom, and a chlorine atom.

In addition, in a case where a plurality of $R^{e12}$'s exist in Formula (Z), $R^{e12}$'s may be the same or different from each other.

In Formula (Z), $R^{f2}$ represents an alkyl group, a silyl group, an alkoxy group, an alkylthio group, a cyano group, a halogen atom, an aryl group, a heteroaryl group, an alkenyl group, or an alkynyl group, and has the same meaning as $R^{d1}$ in Formula (X) and preferred conditions are also the same.

In addition, $R^{f2}$ and $R^{e12}$ in $T^1$ may be bonded to each other to form a non-aromatic ring.

As the group represented by Formula (X), the group represented by Formula (ZB) is more preferable.

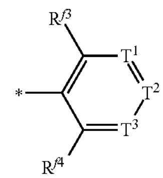

(ZB)

In Formula (ZB), $T^1$ to $T^3$ each independently represent —$CR^{e12}$= or a nitrogen atom. $R^{e12}$ represents a hydrogen atom or a substituent.

$R^{e12}$ in Formula (ZB) is the same as $R^{e12}$ in Formula (Z).

In Formula (ZB), $R^{f3}$ and $R^{f4}$ each independently represent an alkyl group, an aryl group, or a heteroaryl group. One or both of $R^{f3}$ and $R^{f4}$ may be —$CH(R^{d3})(R^{d4})$, —$C(R^{d3})(R^{d4})(R^{d5})$, an aryl group, or a heteroaryl group. $R^{d3}$ to $R^{d5}$ each independently represent an aryl group, an alkyl group (for example, 1 to 3 carbon atoms), or a heteroaryl group.

These groups may further have a substituent as much as possible.

* represents a bonding position.

The number of rings constituting the polycyclic aryl group which may have a substituent and the polycyclic heteroaryl group which may have a substituent is 2 or more, preferably 2 to 4, more preferably 2 to 3, and still more preferably 2.

The polycyclic aryl group which may have a substituent and a substituent which may be contained in the polycyclic heteroaryl group which may have a substituent may contain a non-aromatic ring.

As the polycyclic aryl group which may have a substituent, for example, a naphthyl group which may have a substituent is preferable.

In Formula (1), $Ar^1$ represents an aromatic ring which may have a substituent.

The aromatic ring may be monocyclic or polycyclic.

Examples of the aromatic ring include an aromatic hydrocarbon ring and an aromatic heterocycle. Examples of the aromatic hydrocarbon ring include a benzene ring, a naphthalene ring, an anthracene ring, and a phenanthrene ring. Examples of the aromatic heterocycle include a quinoxaline ring, a pyrazine ring, a pyrrole ring, a furan ring, a thiophene ring, an imidazole ring, and an oxazole ring. These rings may be further condensed with another ring (which may be a non-aromatic ring).

Among these, $Ar^1$ is preferably an aromatic heterocycle, and more preferably a quinoxaline ring or a pyrazine ring.

A substituent contained in an aromatic ring represented by $Ar^1$ is preferably an alkyl group.

Compound Represented by Formula (2)

From the viewpoint that the photoelectric conversion element is more excellent in the heat resistance, the compound represented by Formula (1) is preferably a compound represented by Formula (2).

(2)

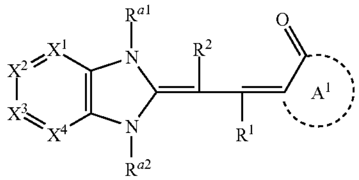

$A^1$ in Formula (2) has the same meaning as $A^1$ in Formula (1-1) (or Formula (1-1a)) and preferred conditions are also the same.

$R^1$ and $R^2$ in Formula (2) have the same meanings as $R^1$ and $R^2$ in Formula (1) and preferred conditions are also the same.

$R^{a1}$ and $R^{a2}$ in Formula (2) have the same meanings as $R^{a1}$ and $R^{a2}$ in Formula (1) and preferred conditions are also the same.

$X^1$ to $X^4$ each independently represent a nitrogen atom (—N=) or —$CR^{c1}$=.

$R^{c1}$ represents a hydrogen atom or a substituent.

At least two of $X^1$, $X^2$, $X^3$, or $X^4$ are preferably nitrogen atoms, more preferably at least $X^1$ and $X^4$ are nitrogen atoms, and still more preferably only $X^1$ and $X^4$ are nitrogen atoms.

In a case where a plurality of $R^{c1}$'s exist, the plurality of $R^{c1}$'s may be bonded to each other to form a ring. The ring formed by bonding the plurality of $R^{c1}$'s to each other is preferably an aromatic ring, and more preferably a benzene ring or a pyridine ring. The ring formed by bonding the plurality of $R^{c1}$'s to each other may further have a substituent.

Compound Represented by Formula (3)

From the viewpoint that the photoelectric conversion element is more excellent in the heat resistance, the compound represented by Formula (1) is more preferably a compound represented by Formula (3).

(3)

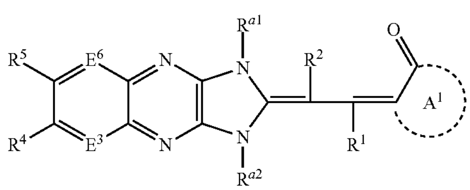

$A^1$ in Formula (3) has the same meaning as $A^1$ in Formula (1-1) (or Formula (1-1a)) and preferred conditions are also the same.

$R^1$ and $R^2$ in Formula (3) have the same meanings as $R^1$ and $R^2$ in Formula (1) and preferred conditions are also the same.

$E^3$ represents a nitrogen atom (—N=) or —$CR^3$=.

$E^6$ represents a nitrogen atom (—N=) or —$CR^6$=.

$E^3$ and $E^6$ preferably have "a form in which $E^3$ is —$CR^3$=, $E^6$ is —$CR^6$=", "a form in which $E^3$ is —N= and $E^6$ is —$CR^6$=", or "a form in which $E^3$ is —$CR^3$= and $E^6$ is —N=", and more preferably have "a form in which $E^3$ is —$CR^3$= and $E^6$ is —$CR^6$=".

$R^3$ to $R^6$ each independently represent a hydrogen atom or a substituent.

$R^3$ to $R^6$ each are independently preferably a hydrogen atom, an alkoxy group, a silyl group, a chlorine atom, a fluorine atom, a cyano group, or an alkyl group, and more preferably a hydrogen atom, an alkoxy group containing an alkyl group moiety having 1 to 3 carbon atoms, a chlorine atom, a fluorine atom, a cyano group, or an alkyl group having 1 to 4 carbon atoms. In $R^3$ to $R^6$, the number of $R^3$ to $R^6$ representing a substituent is preferably 0 to 2. In a case where one or more of $R^3$ to $R^6$ represent a substituent, it is preferable that $R^4$ and/or $R^5$ represent a substituent.

$R^3$ and $R^4$, and $R^4$ and $R^5$ in a case where $E^3$ is —$CR^3$=, and $R^5$ and $R^6$ in a case where $E^6$ is —$CR^6$= may be independently bonded to each other to form a ring, respectively. The rings, which are formed by bonding $R^3$ and $R^4$, $R^4$ and $R^5$, and $R^5$ and $R^6$ to each other respectively, may be monocyclic or polycyclic, may be aromatic or non-aromatic, and may have a substituent.

The number of ring member atoms in the ring is preferably 5 to 12, and more preferably 5 to 7.

For example, it is also preferable that $R^3$ and $R^4$, $R^4$ and $R^5$, or $R^5$ and $R^6$ (preferably $R^4$ and $R^5$) are bonded with each other to form a benzene ring which may further have a substituent. In this case, the benzene ring (benzene ring which may further have a substituent) is condensed with respect to a ring containing $E^3$ and $E^6$.

$R^{a1}$ and $R^{a2}$ in Formula (3) have the same meanings as $R^{a1}$ and $R^{a2}$ in Formula (1) and preferred conditions are also the same.

Compound Represented by Formula (4)

From the viewpoint that the photoelectric conversion element is more excellent in the heat resistance, the compound represented by Formula (1) may be a compound represented by Formula (4).

(4)

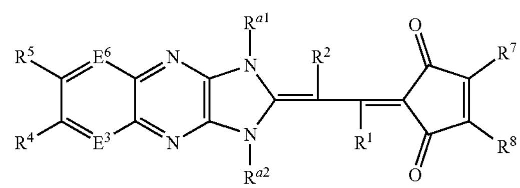

$R^1$ and $R^2$ in Formula (4) have the same meanings as $R^1$ and $R^2$ in Formula (1) and preferred conditions are also the same.

$E^3$ and $E^6$ in Formula (4) have the same meanings as $E^3$ and $E^6$ in Formula (3) and preferred conditions are also the same.

$R^3$ to $R^6$ in Formula (4) have the same meanings as $R^3$ to $R^6$ in Formula (3) and preferred conditions are also the same.

$R^7$ and $R^8$ in Formula (4) have the same meanings as $R^7$ and $R^8$ in Formula (AX) and preferred conditions are also the same.

$R^{a1}$ and $R^{a2}$ in Formula (4) have the same meanings as $R^{a1}$ and $R^{a2}$ in Formula (1) and preferred conditions are also the same.

Compound Represented by Formula (4-2)

An example of a suitable form of the compound represented by Formula (4) includes a compound represented by Formula (4-2).

(4-2)

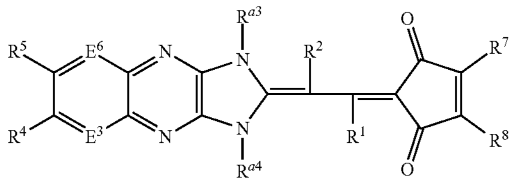

$R^1$ and $R^2$ in Formula (4-2) have the same meanings as $R^1$ and $R^2$ in Formula (1) and preferred conditions are also the same.

$E^3$ and $E^6$ in Formula (4-2) have the same meanings as $E^3$ and $E^6$ in Formula (3) and preferred conditions are also the same.

$R^3$ to $R^6$ in Formula (4-2) have the same meanings as $R^3$ to $R^6$ in Formula (3) and preferred conditions are also the same.

$R^7$ and $R^8$ in Formula (4-2) have the same meanings as $R^7$ and $R^8$ in Formula (AX) and preferred conditions are also the same.

$R^{a3}$ and $R^{a4}$ in Formula (4-2) each independently represent a group represented by Formula (X), —$C(R^{L1})(R^{L2})(R^{L3})$, a polycyclic aryl group which may have a substituent, or a polycyclic heteroaryl group which may have a substituent.

The group represented by Formula (X), —$C(R^{L1})(R^{L2})(R^{L3})$, the polycyclic aryl group which may have a substituent, and the polycyclic heteroaryl group which may have a substituent in $R^{a3}$ and $R^{a4}$ in Formula (4-2) have the same meanings as the group represented by Formula (X) described for $R^{a1}$ and $R^{a2}$ in Formula (1), —$C(R^{L1})(R^{L2})(R^{L3})$, the polycyclic aryl group which may have a substituent, and the polycyclic heteroaryl group which may have a substituent, respectively, and preferred conditions are also the same.

Compound Represented by Formula (5)

From the viewpoint that the photoelectric conversion element is more excellent in the heat resistance, the compound represented by Formula (1) may be a compound represented by Formula (5).

(5)

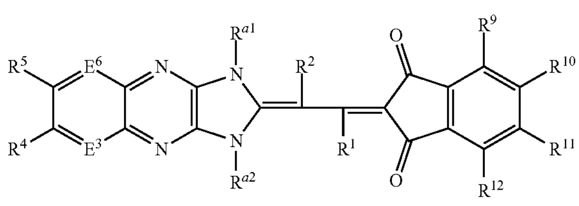

$R^1$ and $R^2$ in Formula (5) have the same meanings as $R^1$ and $R^2$ in Formula (1) and preferred conditions are also the same.

$E^3$ and $E^6$ in Formula (5) have the same meanings as $E^3$ and $E^6$ in Formula (3) and preferred conditions are also the same.

$R^3$ to $R^6$ in Formula (5) have the same meanings as $R^3$ to $R^6$ in Formula (3) and preferred conditions are also the same.

$R^9$ to $R^{12}$ in Formula (5) have the same meanings as $R^9$ to $R^{12}$ in Formula (AY) and preferred conditions are also the same.

$R^{a1}$ and $R^{a2}$ in Formula (5) have the same meanings as $R^{a1}$ and $R^2$ in Formula (1) and preferred conditions are also the same.

The compound represented by Formula (1) is exemplified below.

In a case where compounds exemplified below were applied to Formula (1), the compounds exemplified below, which are represented by Formula (1), include all geometric isomers that can be distinguished based on the C═C double bond constituted by a carbon atom to which $R^1$ bonds and a carbon atom adjacent thereto. That is, both the cis isomer and the trans isomer which are distinguished based on the C═C double bond are included in the compounds exemplified below, which are represented by Formula (1), respectively.

In the following examples, Me represents a methyl group and Ph represents a phenyl group.

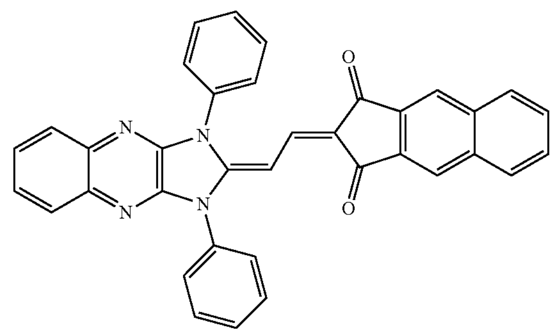

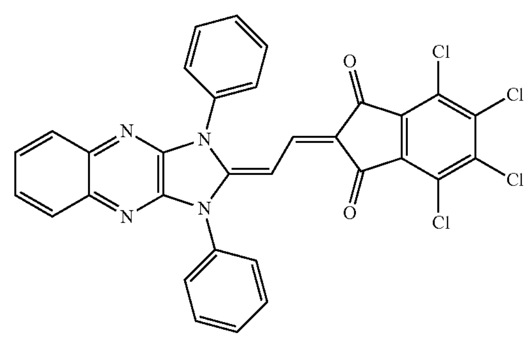

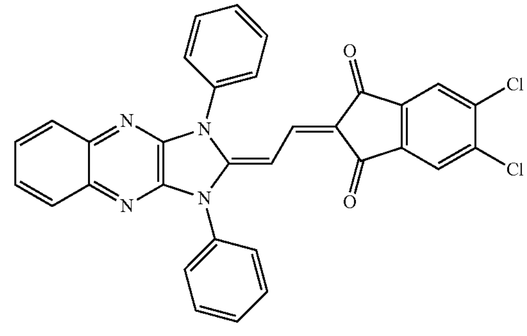

-continued
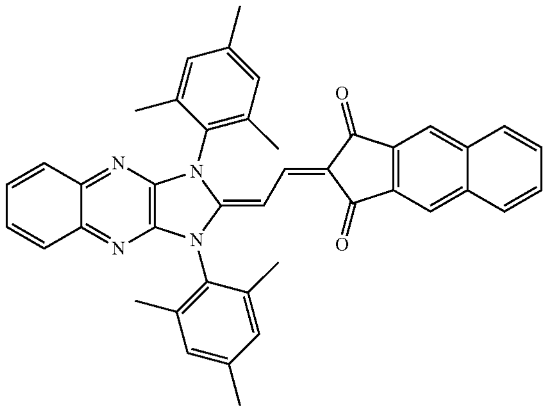
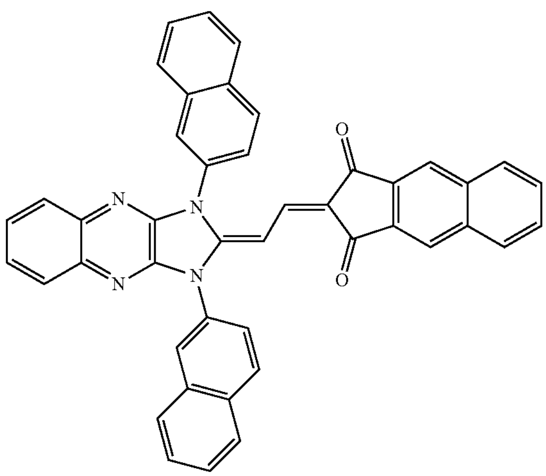
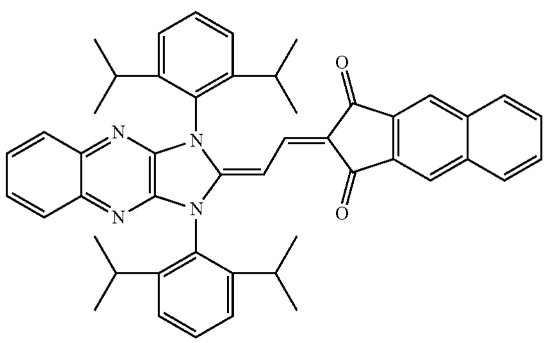
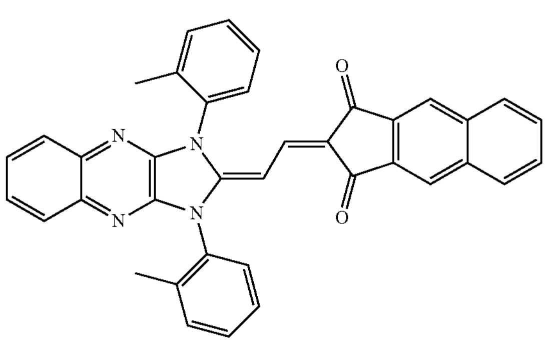
-continued
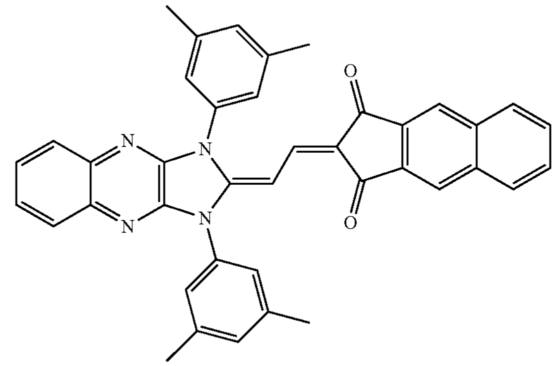
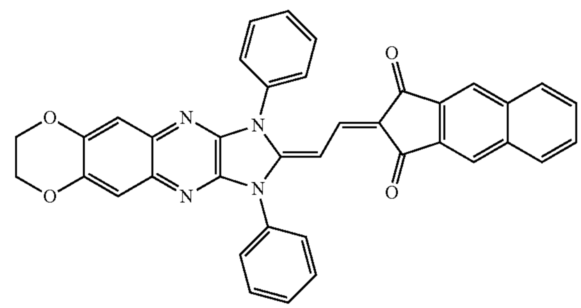
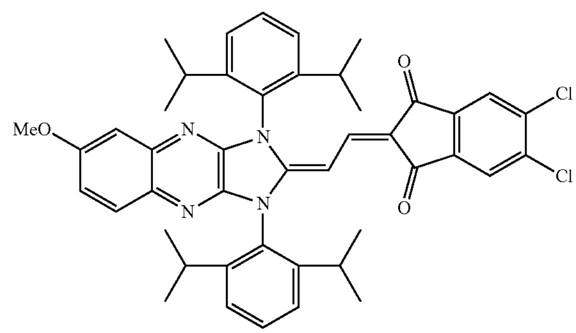
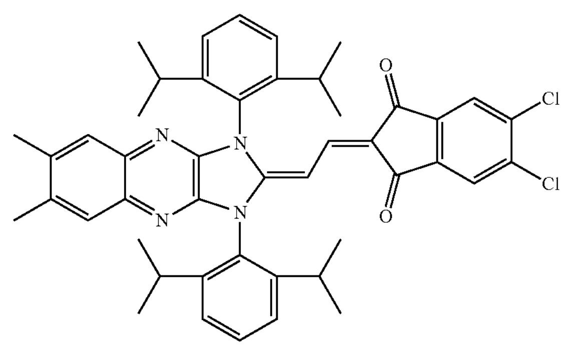
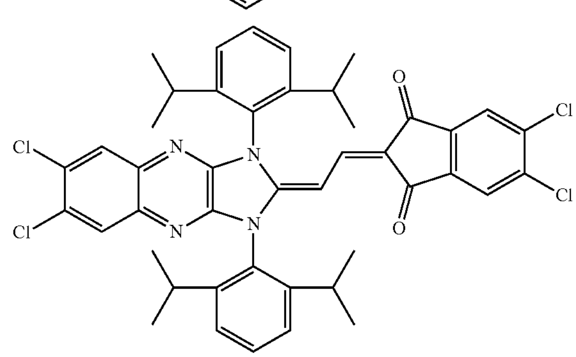

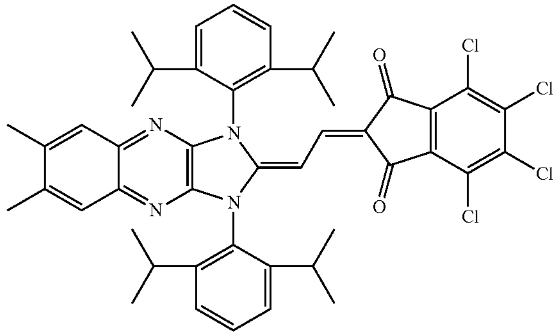
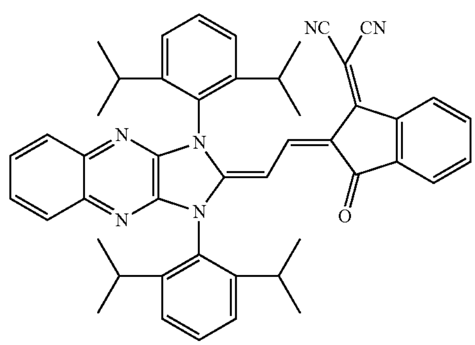
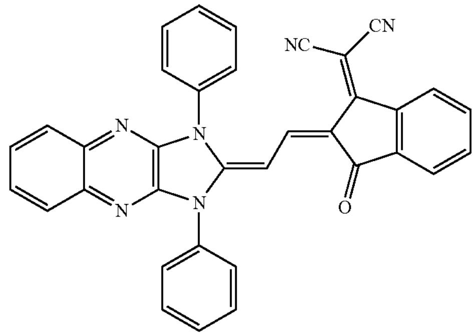
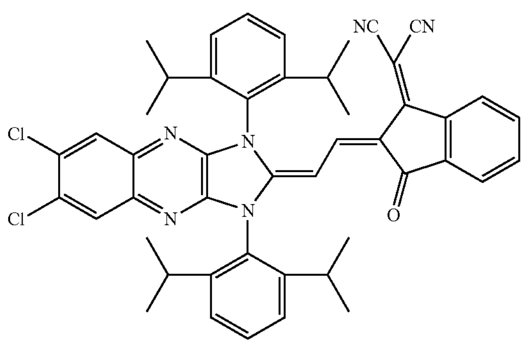
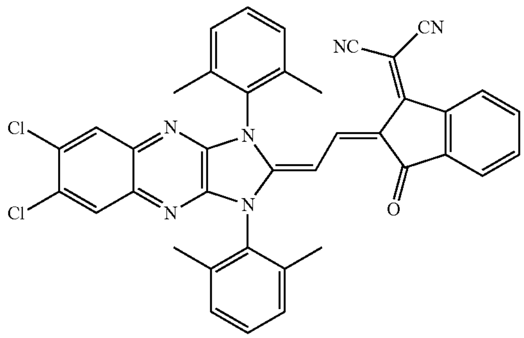
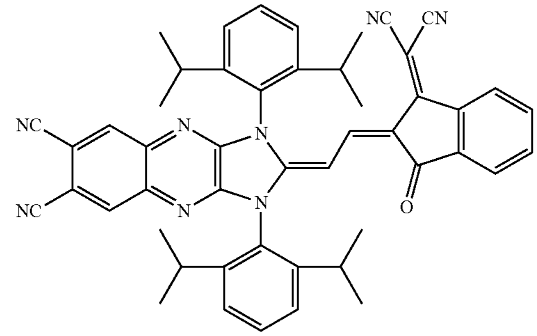
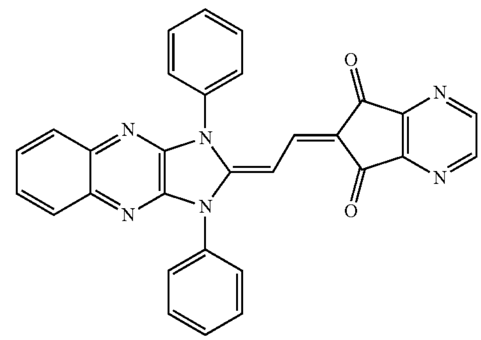
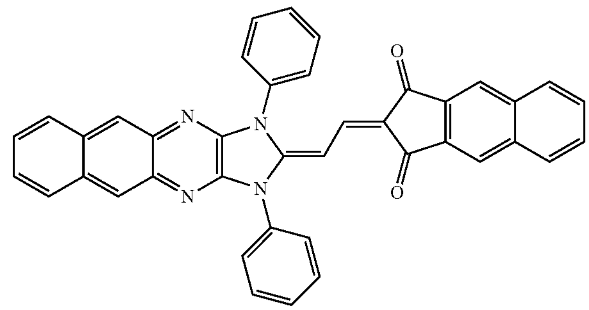
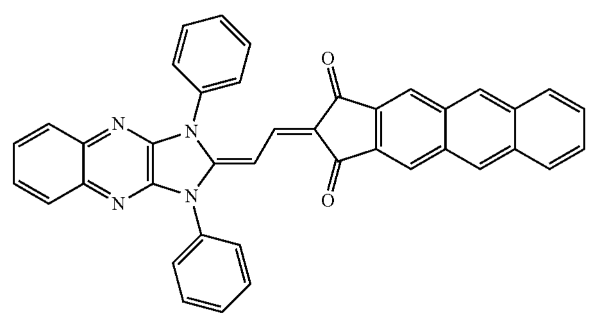
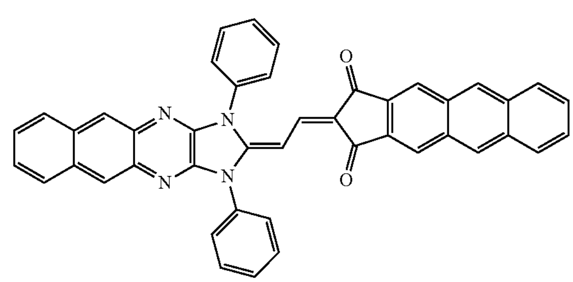

-continued
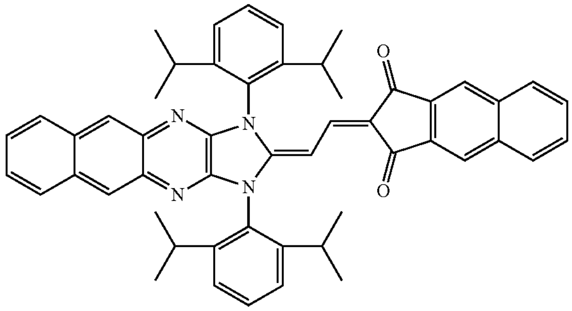
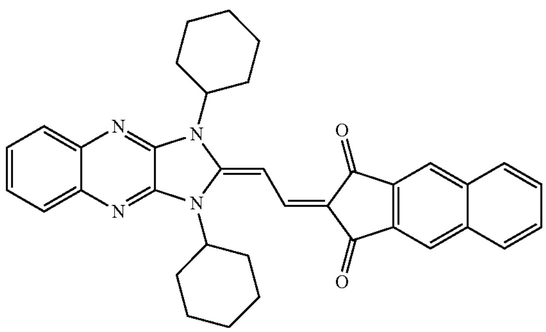
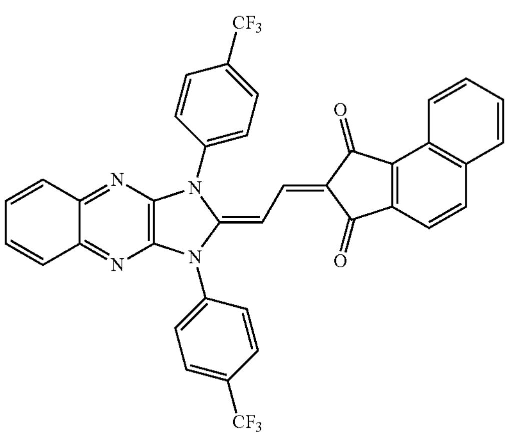
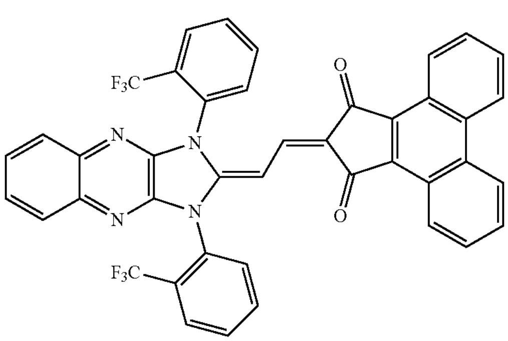
-continued
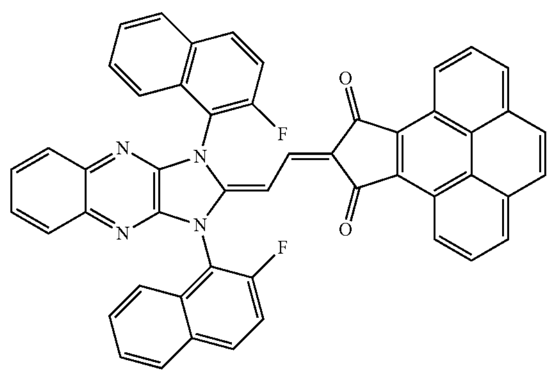
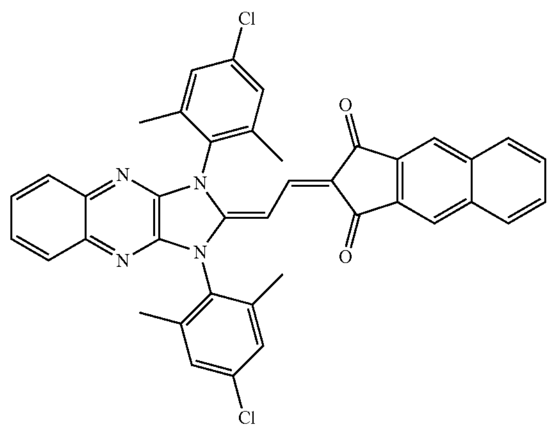
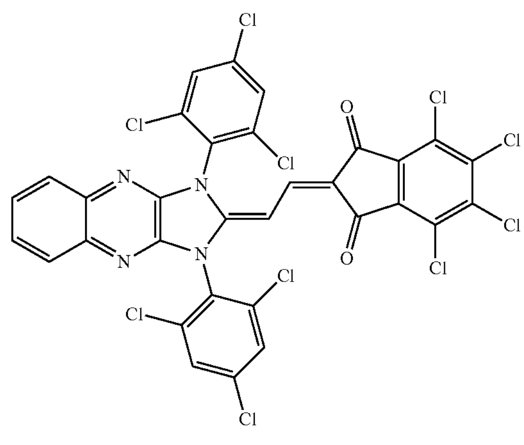
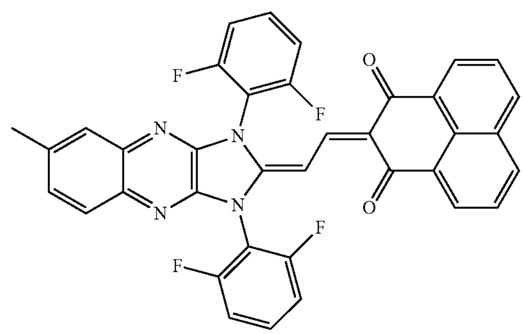

-continued
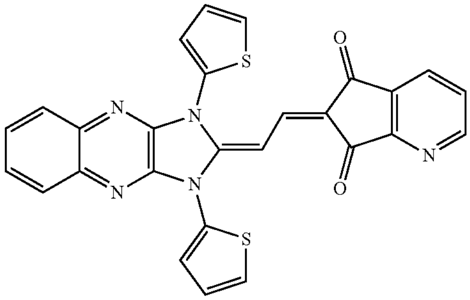
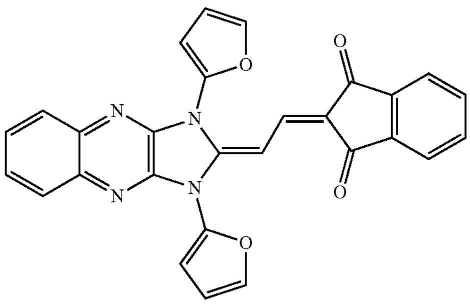
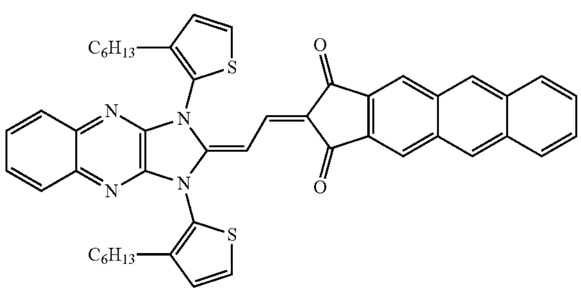
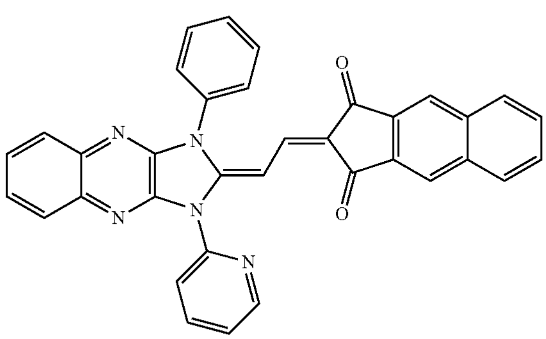
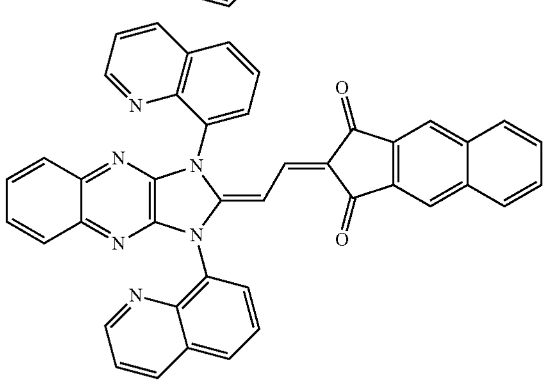
-continued
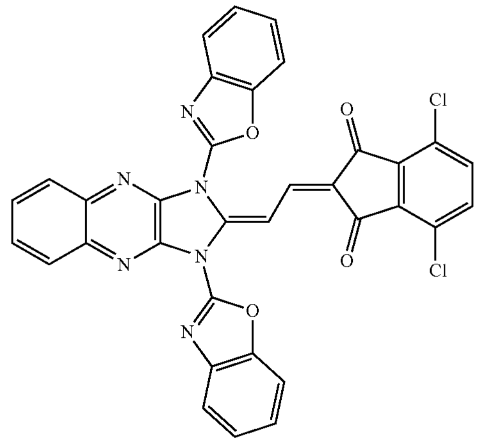
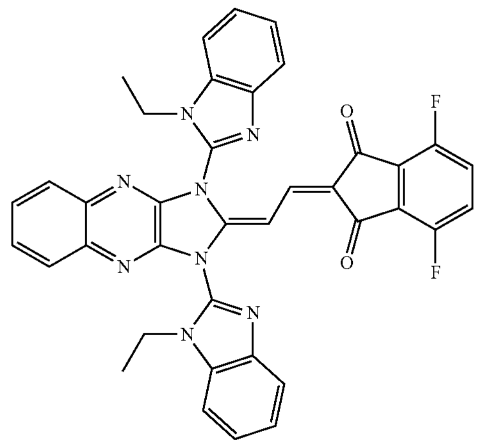
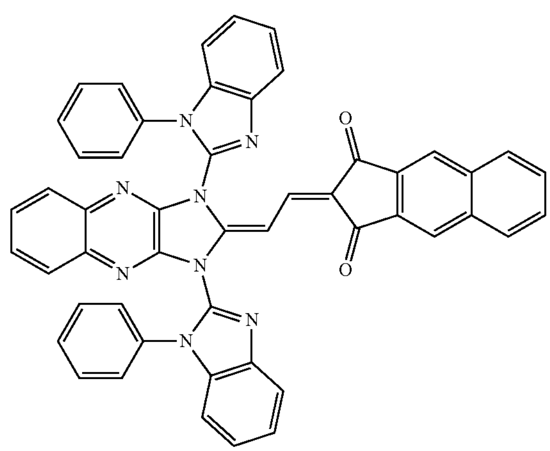
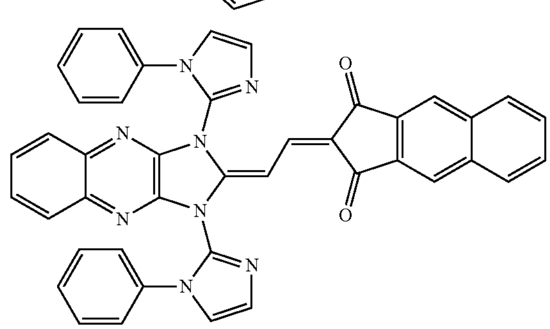

-continued
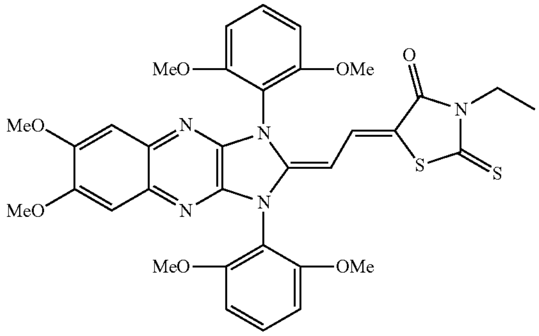
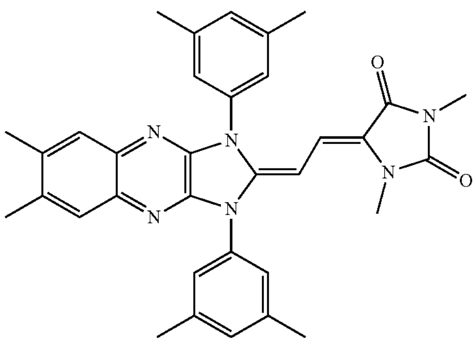
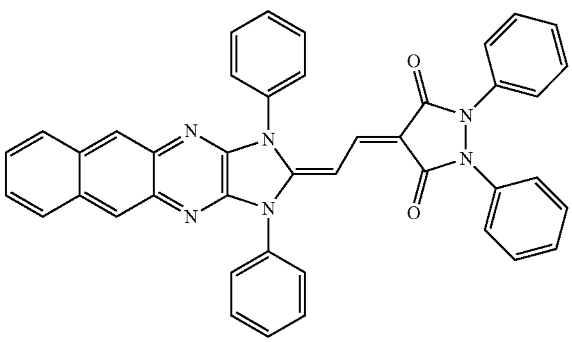
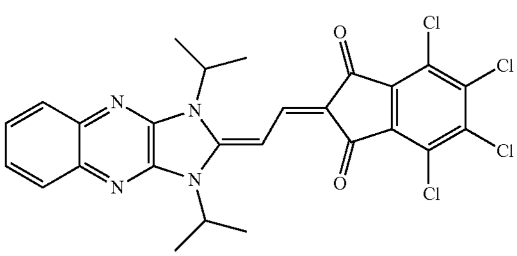
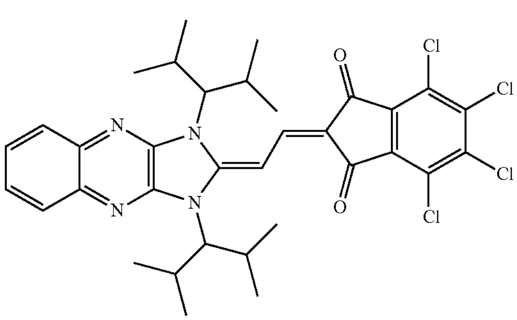
-continued
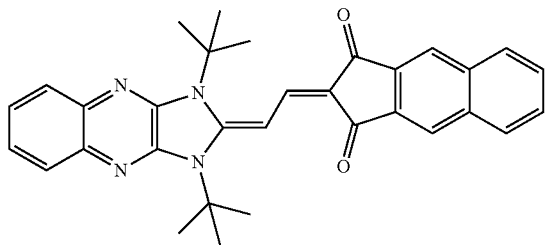
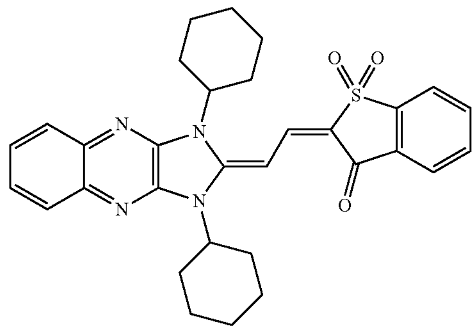
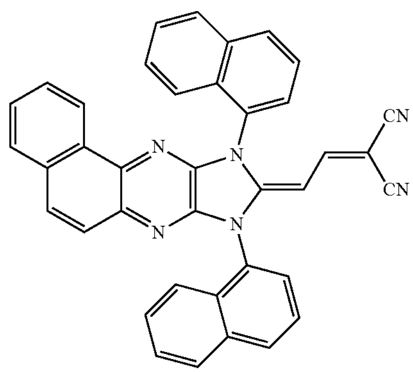
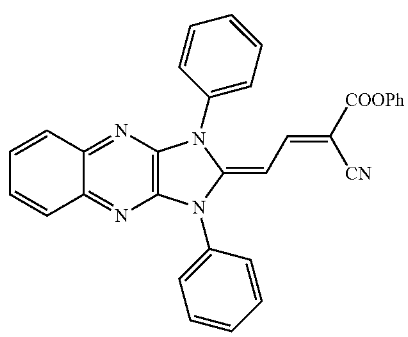
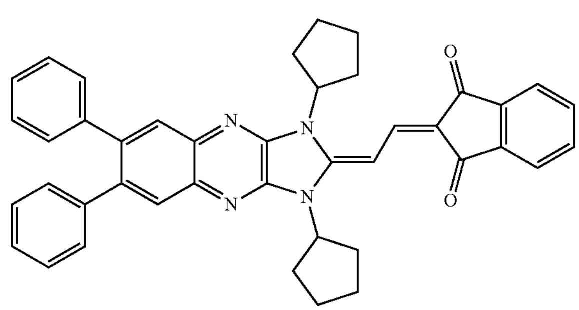

-continued
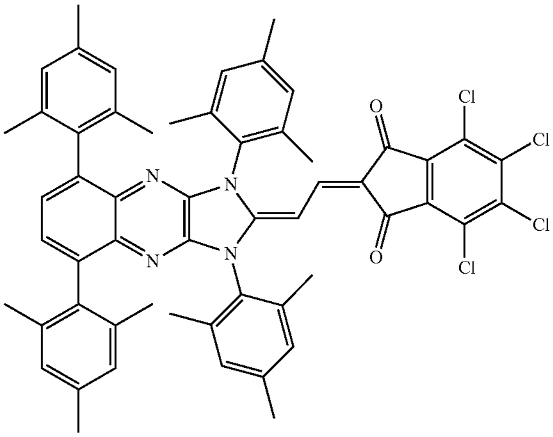
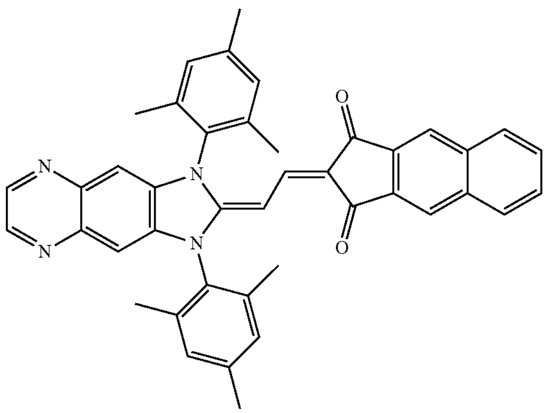
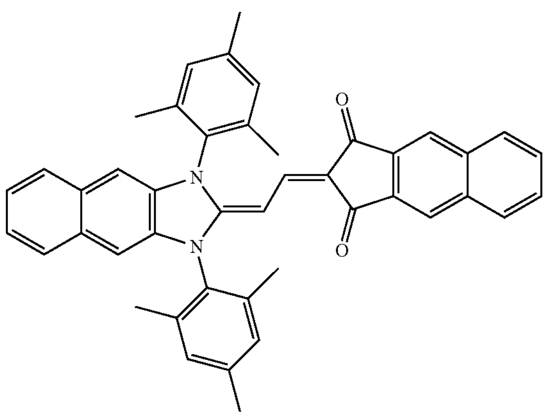
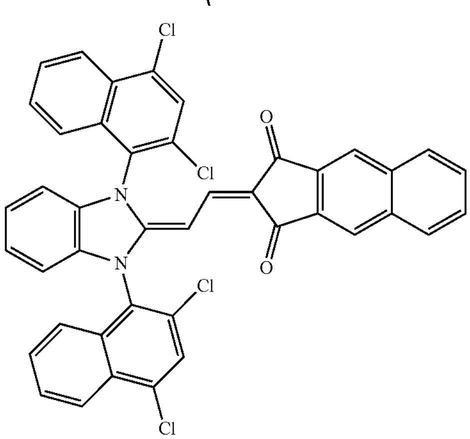
-continued
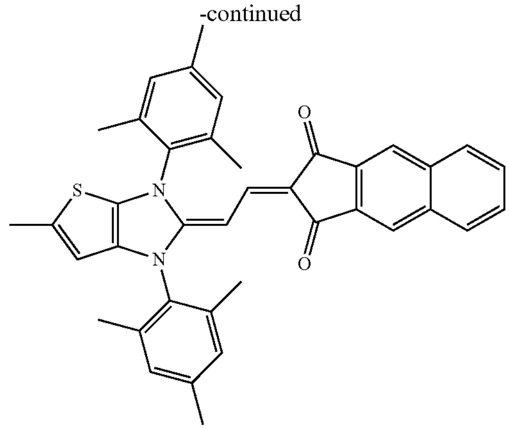
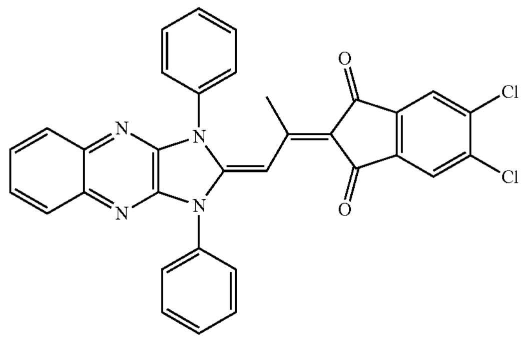
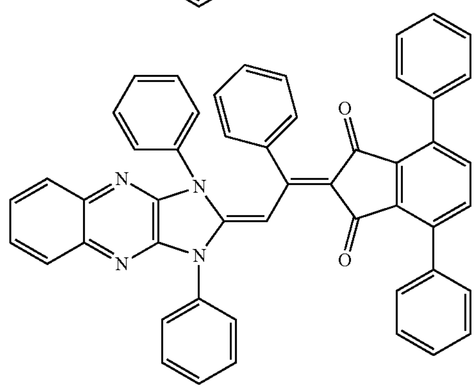
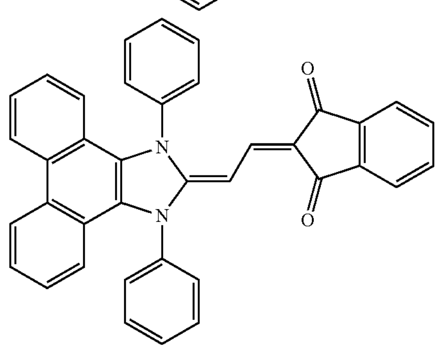
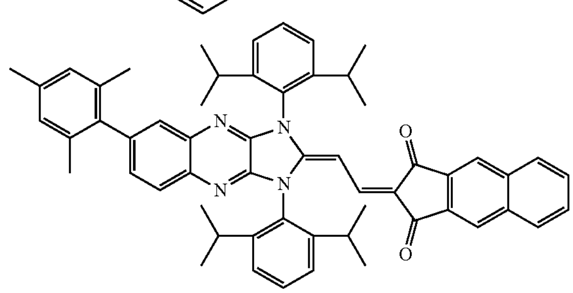

-continued
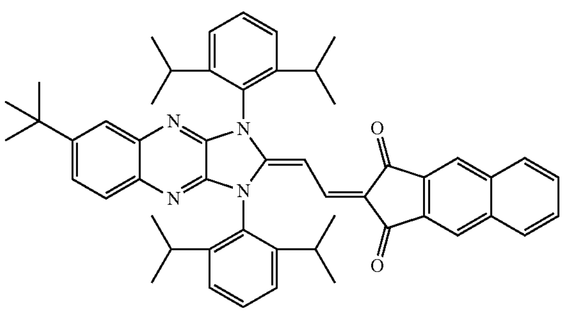
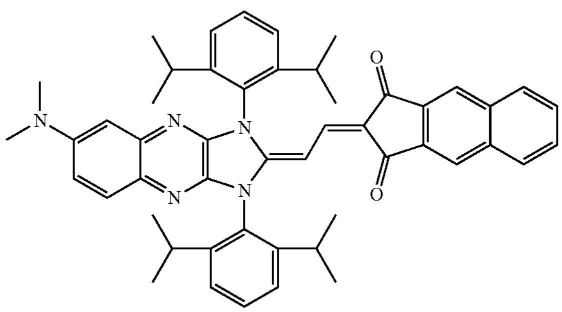
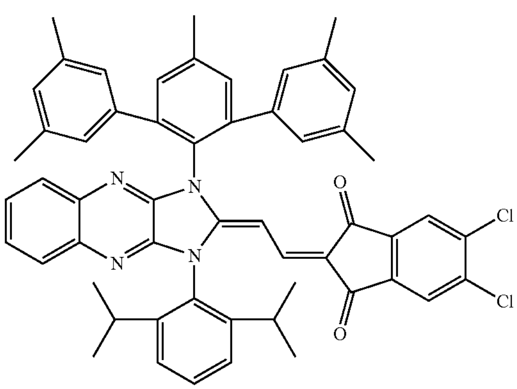
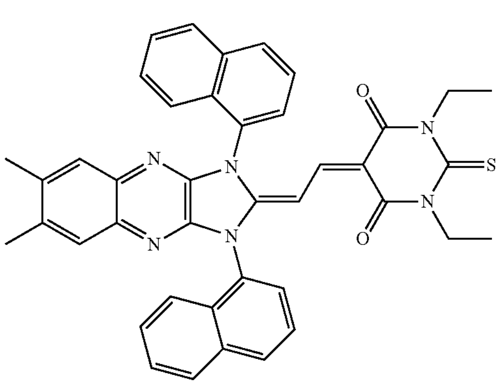
-continued
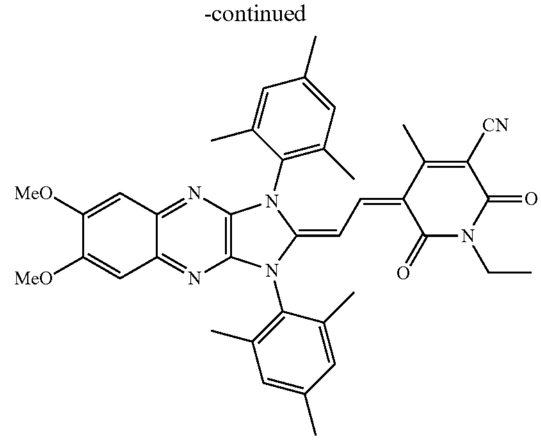
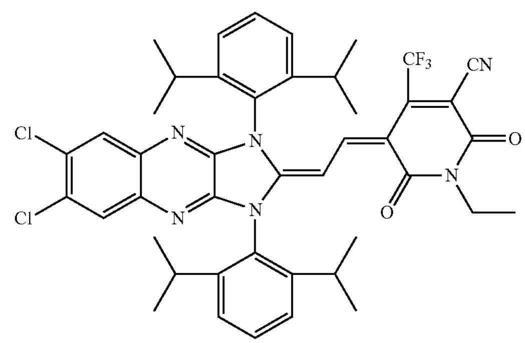
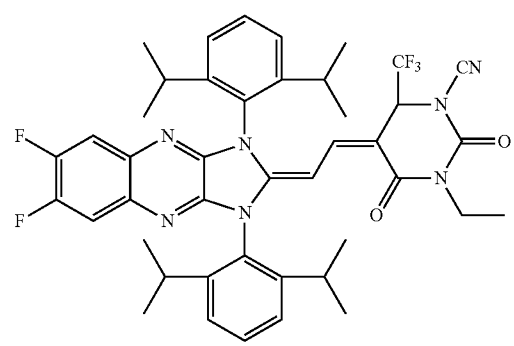
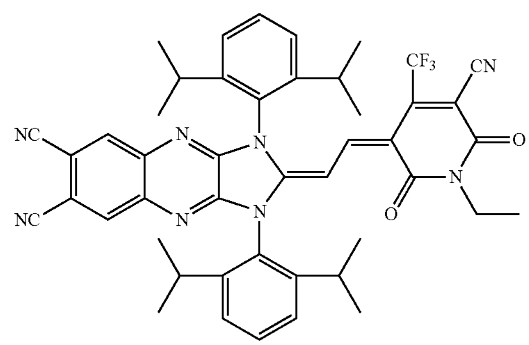

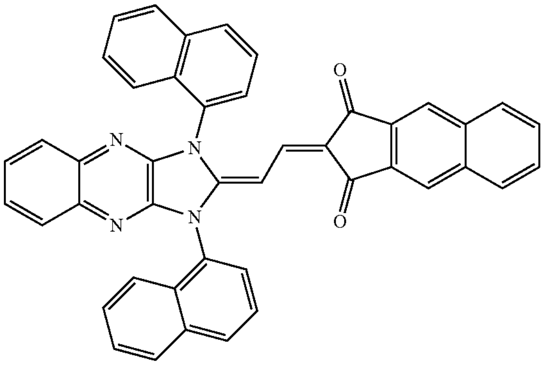
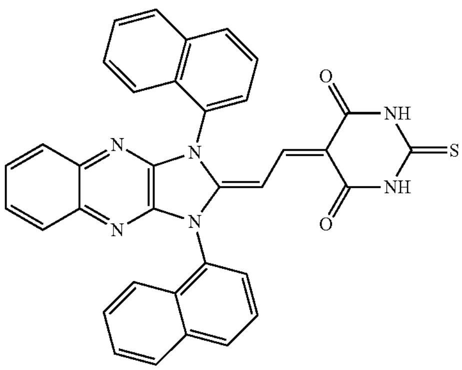
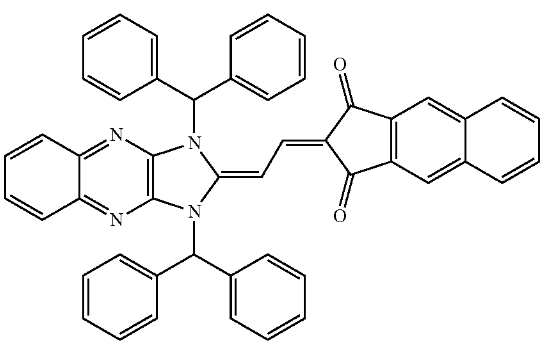
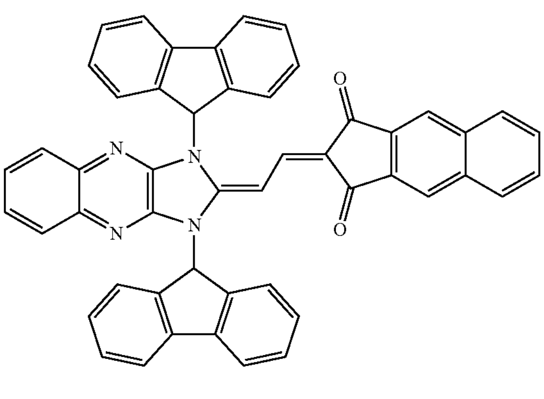
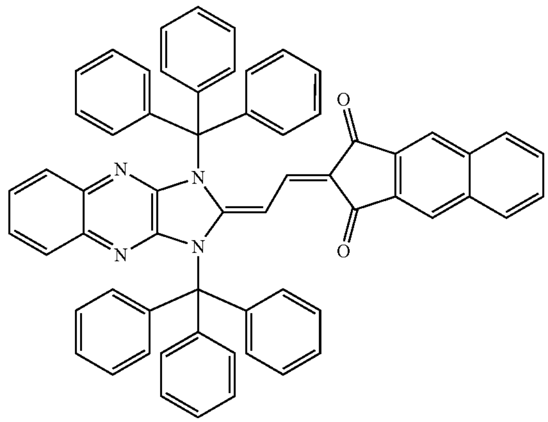
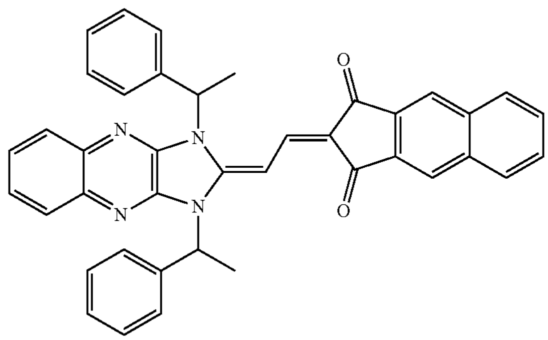
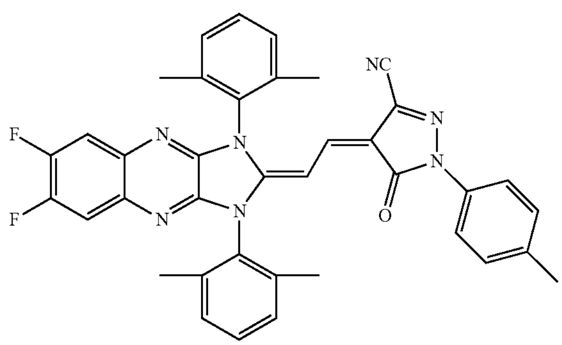
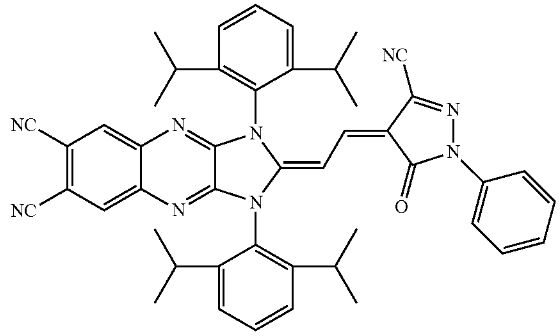

-continued

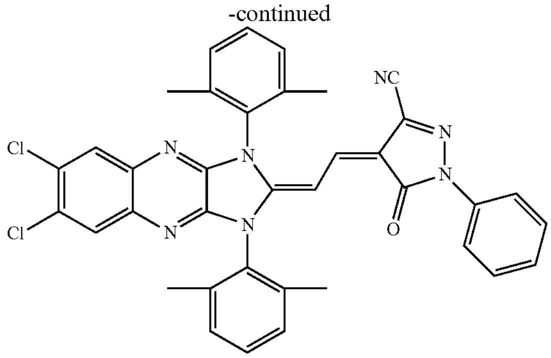

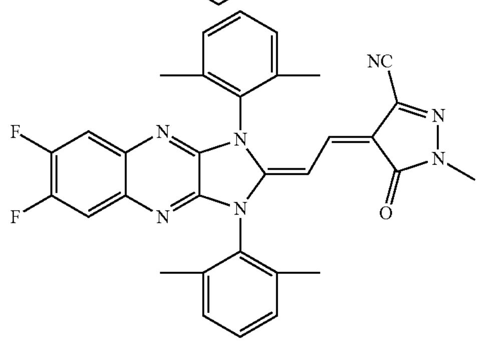

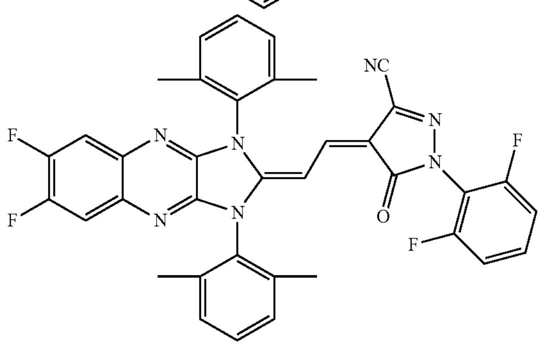

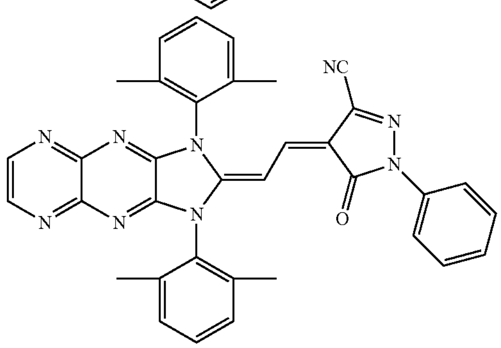

A molecular weight of the first compound is not particularly limited, but is preferably 300 to 1200. In a case where the molecular weight is 1200 or less, a vapor deposition temperature is not increased, and the compound is not easily decomposed. In a case where the molecular weight is 300 or more, a glass transition point of a vapor deposition film is not lowered, and the heat resistance of the photoelectric conversion element is improved.

The maximum absorption wavelength of the first compound is a wavelength of 500 to 620 nm, preferably a wavelength of 510 to 610 nm, more preferably a wavelength of 520 to 600 nm, and still more preferably a wavelength of 530 to 590 nm.

The absorption coefficient of the first compound at the maximum absorption wavelength is preferably $8\times10^{4}$ $cm^{-1}$ or more, more preferably $1\times10^{5}$ $cm^{-1}$ or more, and still more preferably $2\times10^{5}$ $cm^{-1}$ or more. The upper limit of the light absorption coefficient is not particularly limited, and is, for example, $1\times10^{8}$ $cm^{-1}$ or less.

The first compound is preferably a compound having an ionization potential of 5.0 to 6.2 eV in a single film, more preferably a compound having an ionization potential of 5.2 to 6.1 eV, and still more preferably a compound having an ionization potential of 5.4 to 6.0 eV from the viewpoint of matching the n-type semiconductor material described later with the energy level.

In the present specification, the ionization potential is a value measured by using a single film of a compound with AC-2 of a photoelectron spectrometer manufactured by RIKEN KEIKI CO., LTD.

A content of the first compound with respect to the entire photoelectric conversion film (=(film thickness of first compound in terms of single layer/film thickness of entire photoelectric conversion film)×100) is preferably 5% to 70% by volume, more preferably 10% to 50% by volume, and still more preferably 15% to 40% by volume.

(Second Compound)

First, the second compound will be described.

The second compound is a compound having a maximum absorption wavelength at a wavelength of 450 to 550 nm. The second compound is a compound different from the above-described first compound.

The second compound is not particularly limited as long as the second compound is a compound having a maximum absorption wavelength at a wavelength of 450 to 550 nm, and among these, the second compound is a compound represented by Formula (P), a compound represented by Formula (Q), a compound represented by Formula (R), a compound represented by Formula (S), a compound represented by Formula (T), a compound represented by Formula (U), a compound represented by Formula (V), a compound represented by Formula (W), or a compound represented by Formula (1), and is preferably a compound having a maximum absorption wavelength at a wavelength of 450 to 550 nm.

Among these, the second compound is more preferably a compound represented by Formula (U) or a compound represented by Formula (1) and a compound having a maximum absorption wavelength at a wavelength of 450 to 550 nm.

It is also preferable that the second compound has no ionic group.

Compound Represented by Formula (1)

As the second compound, a compound represented by Formula (1) can also be used.

The description for Formula (1) is as described above, and the same applies to the forms that can be achieved by the compound represented by Formula (1).

The compound represented by Formula (1) as the second compound is a compound having a maximum absorption wavelength at a wavelength of 450 to 550 nm.

In a case where the photoelectric conversion film is a compound represented by Formula (1) and contains a plurality of types of compounds each of which has a maximum absorption wavelength at a wavelength of 500 to 550 nm (that is, a case where there are a plurality of types of compounds that correspond to any of the first compound and the second compound, in the photoelectric conversion film), in a relationship between two compounds to be compared, it is preferably considered that a compound with the smaller maximum absorption wavelength is regarded as the second compound, and a compound with the larger maximum absorption wavelength is regarded as the first compound.

Contents of compounds treated as the first compound and/or the second compound each are independently preferably 5% by volume or more, more preferably 10% by volume or more, and still more preferably 15% by volume or more, with respect to the entire photoelectric conversion film.

Compound Represented by Formula (P)

Formula (P) is illustrated below.

(P)

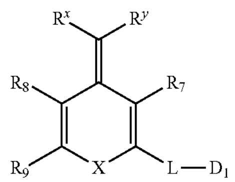

In Formula (P), X represents —O—, —S—, or N—$R_{10}$.

$R^x$ and $R^y$ each independently represent a hydrogen atom or a substituent, and at least one of $R^x$ or $R^y$ represents an electron withdrawing group. $R^x$ and $R^y$ may be bonded to form a ring.

$R_7$ to $R_{10}$ each independently represent a hydrogen atom or a substituent.

$R_8$ and $R_9$ may be bonded to each other to form a ring.

L represents a linking group consisting of a conjugated bond.

$D_1$ represents an atomic group (preferably a group containing —$NR^a(R^b)$, where $R^a$ and $R^b$ each independently represent a hydrogen atom or a substituent, and a combination of groups selected from the group consisting of $R^a$, $R^b$, and L may be combined with each other to form a ring).

As the compound represented by Formula (P), compounds represented by General Formula (I) in JP2009-088291A can also be used, and the content of which is incorporated in the present specification.

Compound Represented by Formula (Q)

Formula (Q) is illustrated below.

(Q)

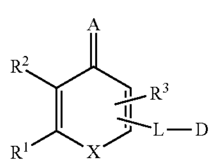

In Formula (Q), A represents an electron withdrawing atomic group.

$R^1$ to $R^3$ each independently represent a hydrogen atom or a substituent.

L represents a divalent π-conjugated substituent.

D represents an electron-donating aromatic substituent.

X represents any of O, S, and N—$R^a$.

$R^a$ represents a hydrogen atom or a substituent.

The compound represented by Formula (Q) has a molecular weight of 250 to 800.

In Formula (Q), the electron withdrawing atomic group represents an atomic group in which at least one electron withdrawing group is bonded to an atom at a bonding position. The electron withdrawing group is not particularly limited, and examples thereof include those having a positive Hammet value among substituents described in Chem. Rev., 1991, vol. 91, p. 165. More specifically, examples of the electron withdrawing group include groups represented by a halogen atom, a cyano group, a nitro group, a perfluoroalkyl group, —CO—R', —CO—CO—R', —SO—R', —$SO_2$—R', —C(═N—R")—R', —S(═NR")—R', —$S(═NR")_2$—R', —P(═O)$R'_2$, —O—R''', —S-R''', —N(—R")—CO—R', —N(—R")—SO—R', —N(—R")—$SO_2$—R', —N(—R")—C(═N—R")—R', —N(—R")—S$(═NR")_2$—R', and —N(—R")—P(═O)$R'_2$. Here, R' represents a hydrogen atom, an alkyl group, an aryl group, a heterocyclic group, an amino group, an alkyloxy group, an aryloxy group, a heterocyclic oxy group, a hydroxy group, an alkylthio group, an arylthio group, a heterocyclic thio group, or a mercapto group.

Regarding Formula (Q), the electron-donating aromatic substituent is defined as an aromatic substituent having a higher electron density than an unsubstituted benzene ring, and is more likely to be oxidized and more unlikely to be reduced than benzene. From the viewpoint of photoelectric conversion ability, solubility, and suitability for sublimation purification, a structure represented by D is preferably a group having 3 to 30 carbon atoms, and more preferably a group having 6 to 20 carbon atoms. From the viewpoint of photoelectric conversion ability, a structure represented by D is preferably a group having a partial structure of N,N-disubstituted aniline, and more preferably a group having a triphenylamine structure as a partial structure.

As compounds represented by Formula (Q), an organic photoelectric conversion material for an organic thin film photoelectric conversion element having a molecular weight of 250 to 800 represented by General Formula 1 described in JP2009-215260A can also be used, and the content of which is incorporated in the present specification.

Compound Represented by Formula (R)

Formula (R) is illustrated below.

(R)

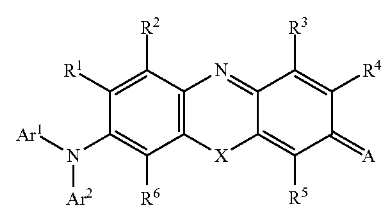

In Formula (R), $R^1$ to $R^6$ each independently represent a hydrogen atom or a substituent. $R^1$ and $R^2$, and $R^3$ and $R^4$ may be bonded to each other to form a ring, respectively.

$Ar^1$ and $Ar^2$ each independently represent an aryl group which may have a substituent or a heteroaryl group which may have a substituent. $Ar^1$ and $Ar^2$, $Ar^1$ and $R^1$, and $Ar^2$ and $R^6$ (preferably an aryl group in $Ar_1$ or a substituent in a heteroaryl group and an aryl group in $Ar_2$ or a substituent in a heteroaryl group, an aryl group in $Ar_1$ or a substituent in a heteroaryl group and $R^1$, and an aryl group in $Ar_2$ or a substituent in a heteroaryl group and $R^6$) each may be bonded to each other to form a ring.

X represents a group selected from the group consisting of an oxygen atom, a sulfur atom, >$CR^{C1}R^{C2}$, >$NR^{N1}$, and >$SiR^{Si1}R^{Si2}$. Here, $R^{C1}$, $R^{C2}$, $R^{N1}$, $R^{Si1}$, and $R_{Si2}$ each independently represent a hydrogen atom or a substituent.

A represents a group selected from the group consisting of an oxygen atom, a sulfur atom, ═$CR^{C3}R^{C4}$, and ═$NR^{N2}$. Here, $R^{C3}$, $R^{C4}$, and $R^{N2}$ each independently represent a hydrogen atom or a substituent. $R^{C3}$ and $R^{C4}$ may be bonded to each other to form a ring. In a case where A is $=NR^{N2}$, $R^{N2}$ and $R^4$ may be bonded to each other to form a ring. A has no carboxy group and no hydroxy group.

As the compound represented by Formula (R), a compound (A) represented by —Formula (1) in JP2015-038937A can also be used, and the content of which is incorporated in the present specification.

Compound Represented by Formula (S)

Formula (S) is illustrated below.

(S)

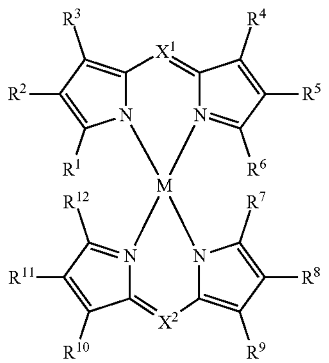

In Formula (S), $R^1$ to $R^{12}$ each independently represent a hydrogen atom or a substituent.

M represents a divalent metal atom (for example, Zn, Cu, Fe, Co, Ni, Au, Ag, Ir, Ru, Rh, Pd, Pt, Mn, Mg, Ti, Be, Ca, Ba, Cd, Hg, Pb, or Sn).

$X^1$ and $X^2$ each independently represent a nitrogen atom or $CR^{13}$.

$R^{13}$ represents a hydrogen atom or a substituent.

$R^{13}$ is preferably an aryl group which has a Hammett's substituent constant up more than 0 and which may have a substituent, or a heteroaryl group which has a Hammett's substituent constant $\sigma_p$ more than 0 and which may have a substituent.

The aryl group which may have the above-described substituent may have Hammett's substituent constant $\sigma_p$ more than 0 in the entirety of the group. For example, in a case where the aryl group has a substituent, the Hammett's substituent constant $o_p$ in the entirety of the aryl group having a substituent may be more than 0.

The heteroaryl group which may have the above-described substituent also may have Hammett's substituent constant $\sigma_p$ more than 0 in the entirety of the group. For example, in a case where the heteroaryl group has a substituent, the Hammett's substituent constant $\sigma_p$ in the entirety of the heteroaryl group having a substituent may be more than 0.

Here, the Hammett's substituent constant $\sigma_p$ value will be described. The Hammett's rule is an empirical rule advocated by L. P. Hammett in 1935 so as to quantitatively discuss the effect of substituent on the reaction or equilibrium of benzene derivatives and its propriety is widely admitted at present. The substituent constant determined by the Hammett's rule includes a $\sigma_p$ value and a $\sigma_m$ value and these values can be found in a large number of general publications and described in detail, for example, in J. A. Dean (compiler), Lange's Handbook of Chemistry, 12th edition, McGraw-Hill (1979), and Kagakuno Ryoiki (Chemistry Region), special number, No. 122, pp. 96-103, Nankodo (1979). In the present invention, a substituent is limited or described by using the Hammett's substituent constant $\sigma_p$, but this does not mean that the substituent is limited only to those having a known value which can be found in the above-described publications. The substituent includes substituents whose value is not known in the publications but in a case of being measured based on the Hammett's rule, falls within the range specified.

$R^1$ and $R^2$, $R^2$ and $R^3$, $R^3$ and $R^{13}$ adjacent to each other, $R^{13}$ and $R^4$ adjacent to each other, $R^4$ and $R^5$, $R^5$ and $R^6$, $R^7$ and $R^8$, $R^8$ and $R^9$, $R^8$ and $R^{13}$ adjacent to each other, $R^{13}$ and $R^{10}$ adjacent to each other, $R^{10}$ and $R^{11}$, and $R^{11}$ and $R^{12}$ each may be bonded to each other to form a ring.

As the compound represented by Formula (S), compounds represented by Formula (1) in WO2018-186389A and compounds represented by Formula (1) in WO2018-186397A can also be used, and the contents of which are incorporated in the present specification.

Compound Represented by Formula (T)

Formula (T) is illustrated below.

(T)

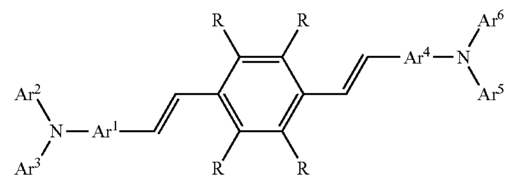

In Formula (T), $Ar^1$ and $Ar^4$ each independently represent an arylene group which may have a substituent or a heteroarylene group which may have a substituent.

$Ar^2$, $Ar^3$, $Ar^5$, and $Ar^6$ each independently represent an aryl group which may have a substituent or a heteroaryl group which may have a substituent.

Four Rs each independently represent a hydrogen atom or a substituent (preferably a cyano group).

Compound Represented by Formula (U)

Formula (U) is illustrated below.

(U)

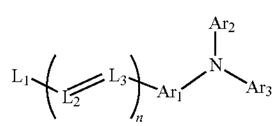

(U2)

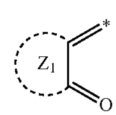

(U3)

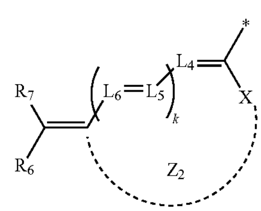

In Formula (U), $L_2$ and $L_3$ each independently represent a methine group which may have a substituent.

n represents an integer of 0 to 2.

$Ar_1$ represents an arylene group which may have a substituent or a heteroarylene group which may have a substituent.

$Ar_2$ and $Ar_3$ each independently represent an aryl group which may have a substituent, an alkyl group which may have a substituent, or a heteroaryl group which may have a substituent.

$Ar_1$ and $Ar_2$, $Ar_2$ and $Ar_3$, and $Ar_3$ and $Ar_1$ (preferably an arylene group in $Ar_1$ or a substituent in a heteroarylene group and an aryl group in $Ar_2$ or a substituent in a heteroaryl group, an aryl group in $Ar_2$ or a substituent in a heteroaryl group and an aryl group in $Ar_3$ or a substituent in a heteroaryl group, and an arylene group in $Ar_1$ or a substituent in a heteroarylene group and an aryl group in $Ar_2$ or a substituent in a heteroaryl group) each may be bonded to each other to form a ring.

$L_1$ represents a methine group which may have a substituent or a group represented by Formula (U3), which is bonded to a group represented by Formula (U2).

In Formula (U2), $Z_1$ is a ring containing a carbon atom bonded to $L_1$ and a carbonyl group adjacent to the carbon atom, and represents a 5-membered ring which may have a substituent, a 6-membered ring which may have a substituent, or a fused ring which may have a substituent containing at least any of a 5-membered ring or a 6-membered ring. As such a ring, a merocyanine coloring agent usually used as an acidic nucleus is preferable.

* represents a bonding position with the methine group which may have a substituent, the methine group being represented by $L_1$.

In Formula (U3), X represents a heteroatom.

$Z_2$ is a ring containing X and represents a 5-membered ring which may have a substituent, a 6-membered ring which may have a substituent, a 7-membered ring which may have a substituent, or a fused ring which may have a substituent containing at least any of a 5-membered ring, a 6-membered ring, or a 7-membered ring.

$L_4$ to $L_6$ each independently represent a methine group which may have a substituent.

In a case where there are a plurality of $L_5$'s and/or $L_6$'s, the plurality of $L_5$'s and/or $L_6$'s may be the same or different, respectively.

$R_6$ and $R_7$ each independently represent a hydrogen atom or a substituent. $R_6$ and $R_7$ may be bonded to each other to form a ring.

k represents an integer of 0 to 2.

* represents a bonding position bonded to $L_2$ or $Ar_1$.

As the compound represented by Formula (U), compounds represented by General Formula (1) in JP2015-118977A can also be used, and the content of which is incorporated in the present specification.

Compound Represented by Formula (V)

Formula (V) is illustrated below.

(V)

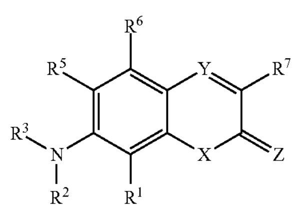

In Formula (V), $R^1$ to $R^7$ each independently represent a hydrogen atom or a substituent. $R^3$ and $R^5$, and $R^1$ and $R^2$ may be bonded to each other to form a ring, respectively. It is preferable that at least one of $R^2$ and $R^3$ is other than a hydrogen atom.

Among these, $R^7$ is preferably a substituent, and more preferably an aryl group which may have a substituent, a heteroaryl group which may have a substituent, a halogen atom, a cyano group, or —$COOR^8$. $R^8$ represents an alkyl group which may have a substituent, an aryl group which may have a substituent, or a heteroaryl group which may have a substituent.

X represents an oxygen atom, a sulfur atom, or a selenium atom.

Y represents a nitrogen atom or —$CR^9$═. $R^9$ represents a hydrogen atom or a substituent.

Z represents an oxygen atom, a sulfur atom, ═$NR^{Z1}$, or ═$CR^{Z2}R^{Z3}$. $R^{z1}$ represents a hydrogen atom or a substituent. $R^{Z2}$ and $R^{Z3}$ each independently represent a cyano group or —$COOR^{Z4}$. $R^{Z4}$ represents an alkyl group which may have a substituent, an aryl group which may have a substituent, or a heteroaryl group which may have a substituent.

Compound Represented by Formula (W)

Formula (W) is illustrated below.

(W)

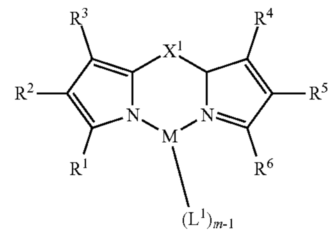

In Formula (W), $R^1$ to $R^6$ each independently represent a hydrogen atom or a substituent. Among these, $R^1$, $R^3$, $R^4$, and $R^6$ each independently represent an aryl group which may have a substituent or a heteroaryl group which may have a substituent X represents a nitrogen atom or —$CR^{13}$—; $R^{13}$ represents a hydrogen atom or a substituent (preferably, an alkyl group which may have a substituent, an aryl group which may have a substituent, or a heteroaryl group which may have a substituent).

M represents one kind of atom selected from the group consisting of boron, beryllium, magnesium, chromium, iron, nickel, copper, zinc, and platinum.

$L^1$ represents a group (halogen atom, or the like) that can be bonded to M. m represents a valence of the atom represented by M.

$R^1$ and $R^2$, $R^2$ and $R^3$, $R^3$ and $R^{13}$ adjacent to each other, $R^{13}$ and $R^4$ adjacent to each other, $R^4$ and $R^5$, and $R^5$ and $R^6$ each may be combined with each other to form a ring.

As the compound represented by Formula (W), compounds represented by General Formula (1) in WO2017/018351A can also be used, and the content of which is incorporated in the present specification.

A molecular weight of the second compound is not particularly limited, but is preferably 300 to 1200. In a case where the molecular weight is 1200 or less, a vapor deposition temperature is not increased, and the compound is not easily decomposed. In a case where the molecular weight is 300 or more, a glass transition point of a vapor deposition film is not lowered, and the heat resistance of the photoelectric conversion element is improved.

The maximum absorption wavelength of the second compound is a wavelength of 450 to 550 nm, preferably a wavelength of 460 nm or more and less than 530 nm, and more preferably a wavelength of 470 nm or more and less than 520 nm.

The absorption coefficient of the second compound at the maximum absorption wavelength is preferably $8\times10^4$ $cm^{-1}$ or more, more preferably $1\times10^5$ $cm^{-1}$ or more, and still more preferably $2\times10^5$ $cm^{-1}$ or more. The upper limit of the light absorption coefficient is not particularly limited, and is, for example, $1\times10^8$ $cm^{-1}$ or less.

The second compound is preferably a compound having an ionization potential of 5.0 to 6.2 eV in a single film, more preferably a compound having an ionization potential of 5.2 to 6.1 eV, and still more preferably a compound having an ionization potential of 5.4 to 6.0 eV from the viewpoint of matching the n-type semiconductor material described later with the energy level.

A content of the second compound with respect to the entire photoelectric conversion film (=(film thickness of second compound in terms of single layer/film thickness of entire photoelectric conversion film)×100) is preferably 5% to 70% by volume, more preferably 10% to 50% by volume, and still more preferably 15% to 40% by volume.

A ratio of a content of the second compound to a content of the first compound in the entire photoelectric conversion film (=(film thickness in terms of single layer of second compound/film thickness in terms of single layer of first compound) is preferably 10/90 to 90/10, more preferably 30/70 to 70/30, and still more preferably 40/60 to 60/40.

<n-Type Semiconductor Material>

The photoelectric conversion film preferably includes the n-type semiconductor material as another component in addition to the first compound and the second compound. The n-type semiconductor material is an acceptor-property organic semiconductor material (a compound), and refers to an organic compound having a property of easily accepting an electron.

Further specifically, the n-type semiconductor material is an organic compound having more excellent electron transport properties than the above-described first compound and second compound. It is preferable that the n-type semiconductor material has a large electron affinity for both the first compound and the second compound described above.

In the present specification, the electron transport properties (electron carrier mobility) of a compound can be evaluated by, for example, a time-of-flight method (a TOF method) or by using a field effect transistor element.

The electron carrier mobility of the n-type semiconductor material is preferably $10^{-4}$ $cm^2$/V·s or more, more preferably $10^{-3}$ $cm^2$/V·s or more, and still more preferably $10^{-2}$ $cm^2$/V·s or more. The upper limit of the electron carrier mobility is not particularly limited, but is preferably 10 $cm^2$/V·s or less, for example, from the viewpoint of suppressing the flow of a small amount of current without light irradiation.

In the present specification, a value (value multiplied by −1) of a reciprocal number of the LUMO value obtained by the calculation of B3LYP/6-31G (d) using Gaussian '09 (software manufactured by Gaussian, Inc.) as a value of the electron affinity.

The electron affinity of the n-type semiconductor material is preferably 3.0 to 5.0 eV.

Examples of the n-type semiconductor material include fullerenes selected from the group consisting of a fullerene and derivatives thereof, fused aromatic carbocyclic compounds (for example, a naphthalene derivative, an anthracene derivative, a phenanthrene derivative, a tetracene derivative, a pyrene derivative, a perylene derivative, and a fluoranthene derivative); a heterocyclic compound having a 5- to 7-membered ring having at least one of a nitrogen atom, an oxygen atom, or a sulfur atom (for example, pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, and thiazole); polyarylene compounds; fluorene compounds; cyclopentadiene compounds; silyl compounds; 1,4,5,8-naphthalenetetracarboxylic acid anhydride; 1,4,5,8-naphthalenetetracarboxylic acid anhydride imide derivative; oxadiazole derivative; anthraquinodimethane derivatives; diphenylquinone derivatives; bathocuproine, bathophenanthroline, and derivatives thereof; triazole compounds; a distyrylarylene derivative; a metal complex having a nitrogen-containing heterocyclic compound as a ligand; a silole compound; and compounds disclosed in paragraphs [0056] to [0057] of JP2006-100767A.

Among these, it is preferable that examples of the n-type semiconductor material include fullerenes selected from the group consisting of a fullerene and derivatives thereof. Examples of the fullerenes include a fullerene C60, a fullerene C70, a fullerene C76, a fullerene C78, a fullerene C80, a fullerene C82, a fullerene C84, a fullerene C90, a fullerene C96, a fullerene C240, a fullerene C540, and a mixed fullerene.

Examples of the fullerene derivatives include compounds in which a substituent is added to the above fullerenes. The substituent is preferably an alkyl group, an aryl group, or a heterocyclic group. The fullerene derivative is preferably compounds described in JP2007-123707A.

In a case where the n-type semiconductor material includes fullerenes, a content of the fullerenes to a total content of the n-type semiconductor material in the photoelectric conversion film (=(film thickness of fullerenes in terms of single layer/film thickness of total n-type semiconductor material in terms of single layer)×100) is preferably 15% to 100% by volume, more preferably 35% to 100% by volume.

An organic coloring agent may be used as the n-type semiconductor material in place of the n-type semiconductor material described in the upper row or together with the n-type semiconductor material described in the upper row.

By using an organic coloring agent as the n-type semiconductor material, it is easy to control an absorption wavelength (maximum absorption wavelength) of the photoelectric conversion element to be within any wavelength range.

Examples of the organic coloring agent include a cyanine coloring agent, a styryl coloring agent, a hemicyanine coloring agent, a merocyanine coloring agent (including zeromethine merocyanine (simple merocyanine)), a rhodacyanine coloring agent, an allopolar coloring agent, an oxonol coloring agent, a hemioxonol coloring agent, a squarylium coloring agent, a croconium coloring agent, an azamethine coloring agent, a coumarin coloring agent, an arylidene coloring agent, an anthraquinone coloring agent, a triphenylmethane coloring agent, an azo coloring agent, an azomethine coloring agent, a metallocene coloring agent, a fluorenone coloring agent, a flugide coloring agent, a perylene coloring agent, a phenazine coloring agent, a phenothiazine coloring agent, a quinone coloring agent, a diphenylmethane coloring agent, a polyene coloring agent, an acridine coloring agent, an acridinone coloring agent, a diphenylamine coloring agent, a quinophthalone coloring agent, a phenoxazine coloring agent, a phthaloperylene coloring agent, a dioxane coloring agent, a porphyrin coloring agent, a chlorophyll coloring agent, a phthalocyanine coloring agent, a subphthalocyanine coloring agent, a metal complex coloring agent, compounds disclosed in paragraphs [0083] to [0089] of JP2014-82483A, compounds disclosed in paragraphs [0029] to [0033] of JP2009-167348A, compounds disclosed in paragraphs [0197] to [0227] of JP2012-77064A, compounds disclosed in paragraphs [0035] to [0038] of WO2018-105269A, compounds disclosed in paragraphs [0041] to [0043] of WO2018-186389A, compounds disclosed in paragraphs [0059] to [0062] of WO2018-186397A, compounds disclosed in paragraphs [0078] to [0083] of WO2019-009249A, compounds disclosed in paragraphs [0054] to [0056] of WO2019-049946A, compounds disclosed in paragraphs [0059] to [0063] of WO2019-054327A, and compounds disclosed in paragraphs [0086] to [0087] of WO2019-098161A.

In a case where the n-type semiconductor material includes an organic coloring agent, a content of the organic coloring agent to a total content of the n-type semiconductor material in the photoelectric conversion film (=(film thickness of organic coloring agent in terms of single layer/film thickness of total n-type semiconductor material in terms of single layer)×100) is preferably 15% to 100% by volume, more preferably 35% to 100% by volume.

The molecular weight of the n-type semiconductor material is preferably 200 to 1200, and more preferably 200 to 1000.

It is preferable that the photoelectric conversion film has a bulk heterostructure formed in a state where the first compound and/or the second compound and the n-type semiconductor material are mixed.

For example, the layer containing the first compound preferably has a bulk heterostructure formed in a state where the first compound and the n-type semiconductor material are mixed, and the layer containing the second compound is also preferably has a bulk heterostructure formed in a state where the second compound and the n-type semiconductor material are mixed.

Among these, in a case where the photoelectric conversion film includes the layer containing the first compound and the layer containing the second compound, it is preferable to satisfy at least one condition (preferably both conditions) in which the layer containing the first compound has the bulk heterostructure or in which the layer containing the second compound has the bulk heterostructure.

The photoelectric conversion film also preferably includes a mixture layer having a bulk heterostructure formed in a state where the first compound, the second compound, and the n-type semiconductor material are mixed.

The bulk heterostructure referred to herein refers to a layer in which materials for forming the photoelectric conversion film are mixed with each other (for example, the first compound and the n-type semiconductor material are mixed with each other, the second compound and the n-type semiconductor material are mixed with each other, or the first compound, the second compound, and the n-type semiconductor material are mixed with each other) and dispersed in the photoelectric conversion film.

A content of the n-type semiconductor material with respect to the entire photoelectric conversion film (=(film thickness of n-type semiconductor material in terms of single layer/film thickness of entire photoelectric conversion film)×100) is preferably 5% to 70% by volume, more preferably 10% to 50% by volume, and still more preferably 15% to 40% by volume.

From the viewpoint of responsiveness of the photoelectric conversion element, a content of the specific compound with respect to a total content of the specific compound (refers to the first compound and the second compound collectively) and the n-type semiconductor material in the entire photoelectric conversion film (=sum of film thicknesses of specific compounds in terms of single layer/(sum of film thicknesses of specific compounds in terms of single layer+film thickness of n-type semiconductor material in terms of single layer)×100) is preferably 20% to 80% by volume, and more preferably 40% to 80% by volume.

In addition, in a case where the photoelectric conversion film includes a p-type semiconductor material described later, a content of the specific compounds in the entire photoelectric conversion film (=sum of film thicknesses of specific compounds in terms of single layer/(sum of film thicknesses of specific compounds in terms of single layer+film thickness of n-type semiconductor material in terms of single layer+film thickness of p-type semiconductor material in terms of single layer)×100) is preferably 15% to 75% by volume, and more preferably 25% to 75% by volume.

It is preferable that the photoelectric conversion film is substantially composed of only the specific compounds, the n-type semiconductor material contained as desired, and the p-type semiconductor material contained as desired. The term "substantially" is intended that the total content of the specific compound, the n-type semiconductor material, and the p-type semiconductor material is 95% by mass or more with respect to a total mass of the photoelectric conversion film.

The n-type semiconductor material contained in the photoelectric conversion film may be used alone, or two or more thereof may be used in combination.

<p-Type Semiconductor Material>

The photoelectric conversion film also preferably includes the p-type semiconductor material as another component in addition to the first compound and the second compound.

The p-type semiconductor material is a donor organic semiconductor material (a compound), and refers to an organic compound having a property of easily donating an electron.

Further specifically, the p-type semiconductor material is an organic compound having more excellent hole transport properties than the above-described first compound and second compound.

In the present specification, the hole transport properties (hole carrier mobility) of a compound can be evaluated by, for example, a time-of-flight method (a TOF method) or by using a field effect transistor element.

The hole carrier mobility of the p-type semiconductor material is preferably $10^{-4}$ $cm^2/V{\cdot}s$ or more, more preferably $10^{-3}$ $cm^2/V{\cdot}s$ or more, and still more preferably $10^{-2}$ $cm^2/V{\cdot}s$ or more. The upper limit of the hole carrier mobility is not particularly limited, but is preferably 10 $cm^2/V{\cdot}s$ or less, for example, from the viewpoint of suppressing the flow of a small amount of current without light irradiation.

In addition, it is also preferable that the p-type semiconductor material has a small ionization potential with respect to both the first compound and the second compound described above.

It is preferable that the photoelectric conversion film has a bulk heterostructure formed in a state where the first compound and/or the second compound, and the p-type semiconductor material (preferably, furthermore the n-type semiconductor material described above) are mixed.

For example, the layer containing the first compound preferably has a bulk heterostructure formed in a state where the first compound and the p-type semiconductor material (preferably, furthermore the n-type semiconductor material described above) are mixed, and the layer containing the second compound is also preferably has a bulk heterostructure formed in a state where the second compound and the p-type semiconductor material (preferably, furthermore the n-type semiconductor material described above) are mixed.

Among these, in a case where the photoelectric conversion film includes the layer containing the first compound and the layer containing the second compound, it is preferable to satisfy at least one condition (preferably both conditions) in which the layer containing the first compound has the bulk heterostructure or in which the layer containing the second compound has the bulk heterostructure.

In addition, it is also preferable that the photoelectric conversion film has a bulk heterostructure formed in a state where the first compound, the second compound, and the p-type semiconductor material (preferably, furthermore the n-type semiconductor material described above) are mixed.

The bulk heterostructure referred to herein is a layer in which materials for forming the photoelectric conversion film are mixed with each other (for example, the first compound and the p-type semiconductor material are mixed with each other, the second compound and the p-type semiconductor material are mixed with each other, the first compound, the second compound, and the p-type semiconductor material are mixed with each other, the first compound, the n-type semiconductor material, and the p-type semiconductor material are mixed with each other, the second compound, the n-type semiconductor material, and the p-type semiconductor material are mixed with each other, or the first compound, the second compound, the n-type semiconductor material, and the p-type semiconductor material are mixed with each other) and dispersed in the photoelectric conversion film.

Examples of the p-type semiconductor material include triarylamine compounds (for example, N, N'-bis (3-methylphenyl)-(1,1'-biphenyl)-4,4'-diamine (TPD), 4,4'-bis [N-(naphthyl)-N-Phenyl-amino] biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-94660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1] benzothieno [3,2-b] thiophene (BTBT) derivative, a thieno [3,2-f: 4,5-f] bis [1] benzothiophene (TBBT) derivative, compounds disclosed in paragraphs [0031] to [0036] of JP2018-14474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-54228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-80052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

The p-type semiconductor material is preferably a compound represented by Formula (p1), a compound represented by Formula (p2), a compound represented by Formula (p3), and a compound represented by Formula (p4), or is also preferably a compound represented by Formula (p5).

(p1)

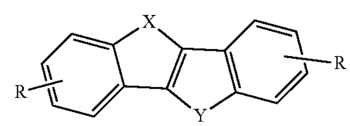

(p2)

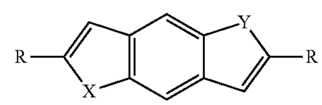

(p3)

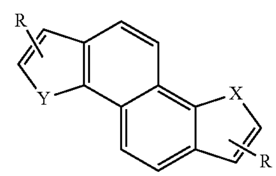

(p4)

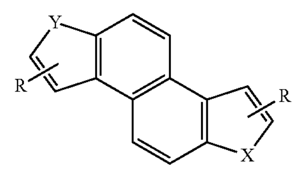

(p5)

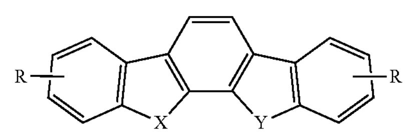

In Formulae (p1) to (p5), two Rs each independently represent a hydrogen atom or a substituent (an alkyl group, an alkoxy group, a halogen atom, an alkylthio group, a (hetero) arylthio group, an alkylamino group, a (hetero) arylamino group, a (hetero) aryl group, and the like, these groups each may further have a substituent, as possible, and for example, a (hetero) aryl group may be an arylaryl group (that is, a biaryl group, at least one of the aryl groups composing this group may be a heteroaryl group) which may further have a substituent).

As R, a group represented by R in Formula (IX) of WO2019-081416 is also preferable.

X and Y each independently represent —$CR^2_2$—, a sulfur atom, an oxygen atom, —$NR^2$—, or —$SiR^2_2$—.

$R^2$ represents a hydrogen atom, an alkyl group (preferably a methyl group or a trifluoromethyl group) which may have a substituent, an aryl group which may have a substituent, or a heteroaryl group which may have a substituent. Two or more $R^2$'s may be the same or different from each other.
The compounds that can be used as the p-type semiconductor materials are exemplified below.
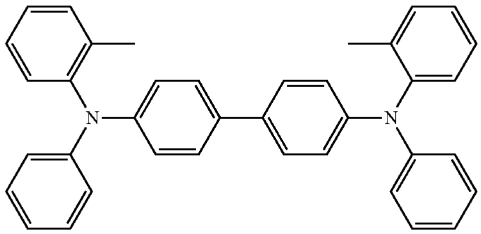
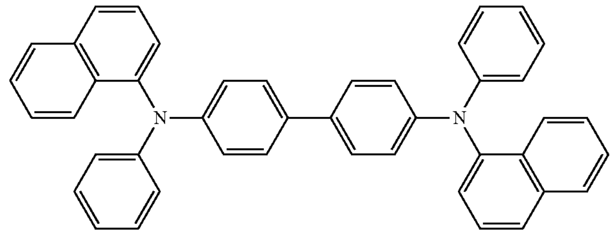
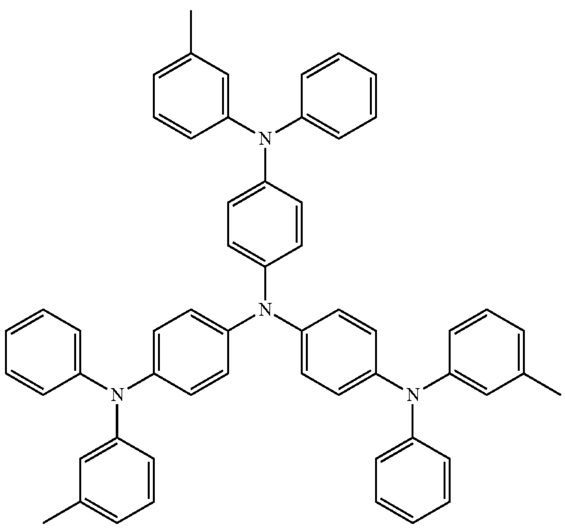
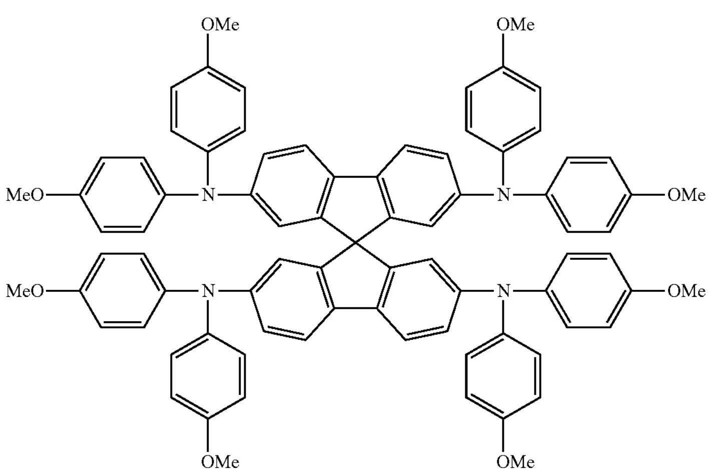

-continued
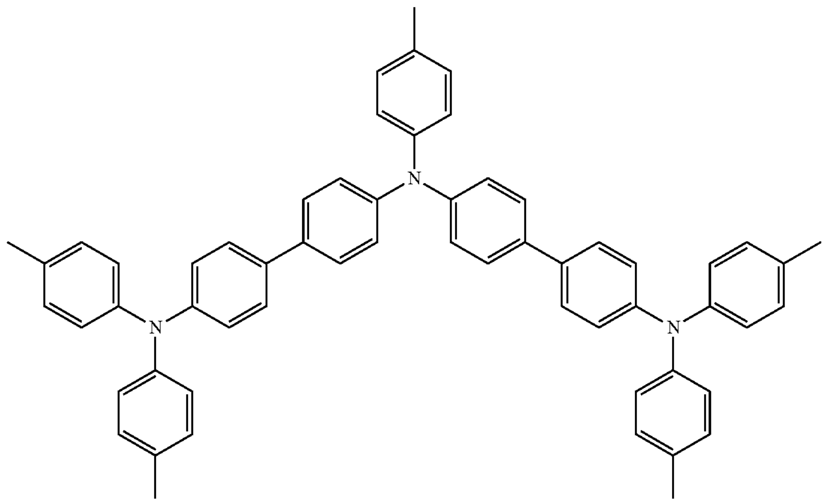
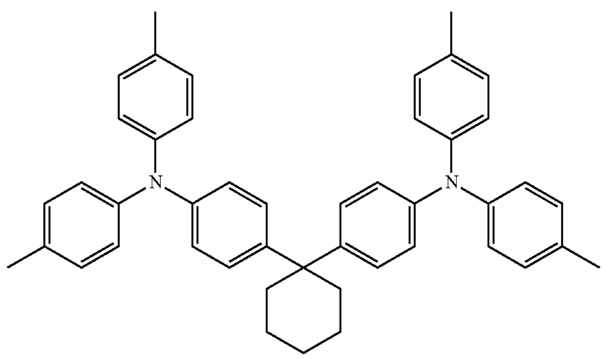
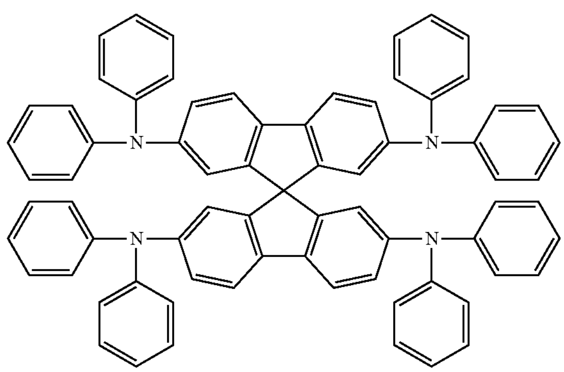
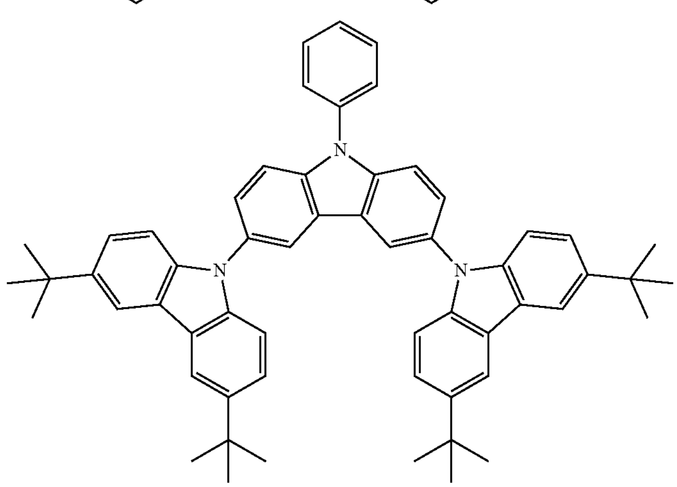

-continued
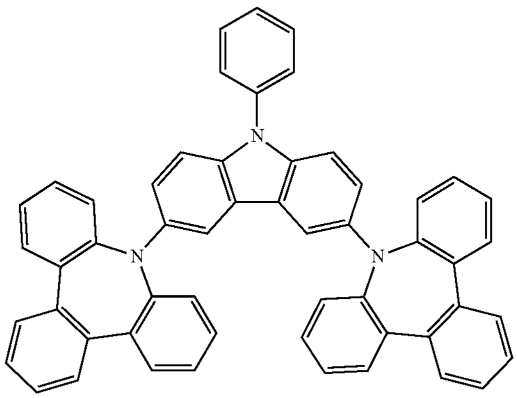
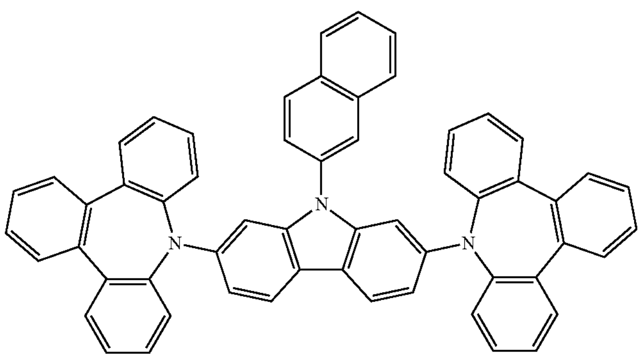
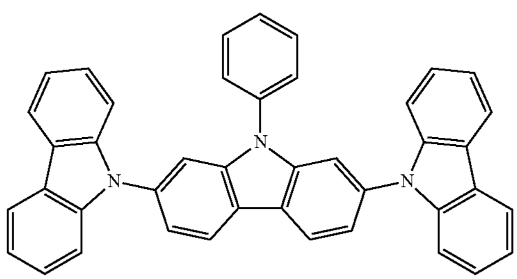
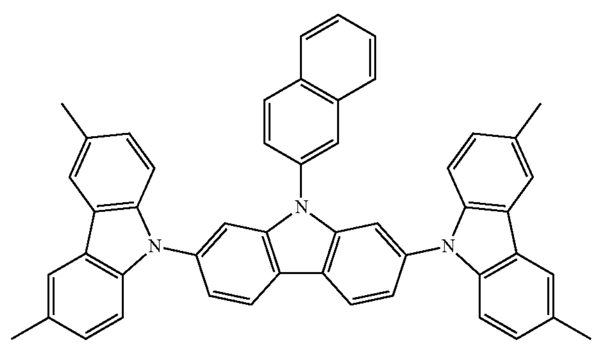
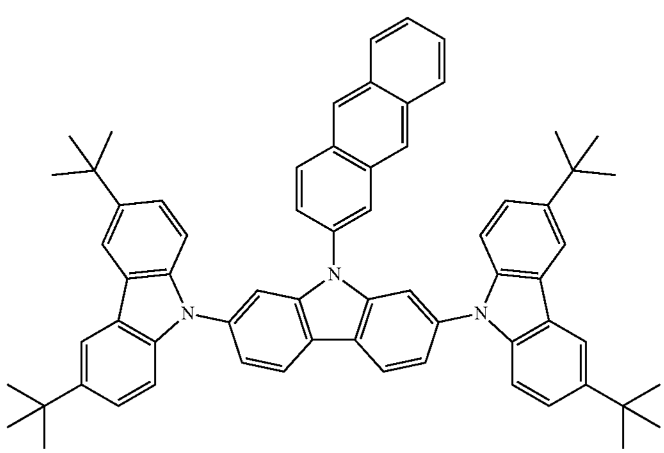

-continued
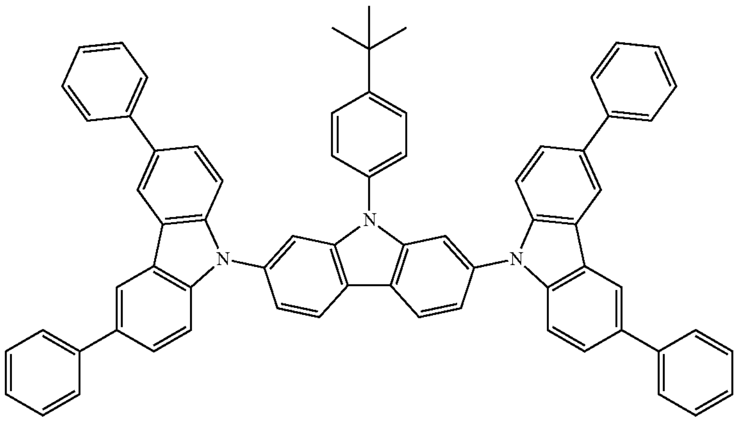
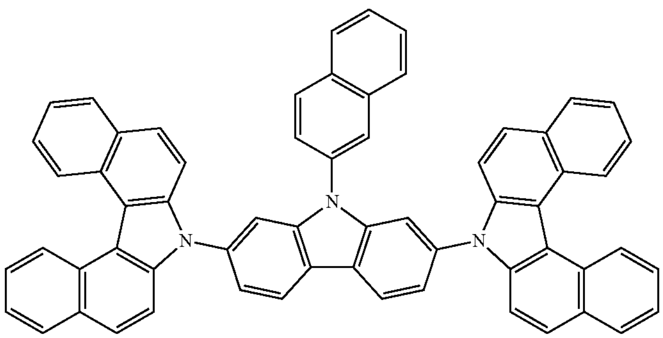
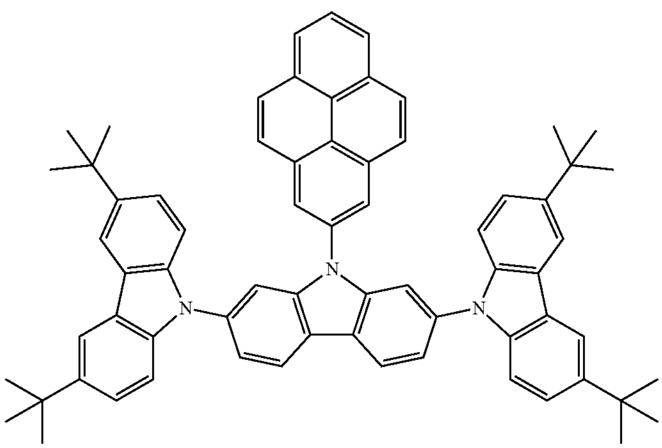
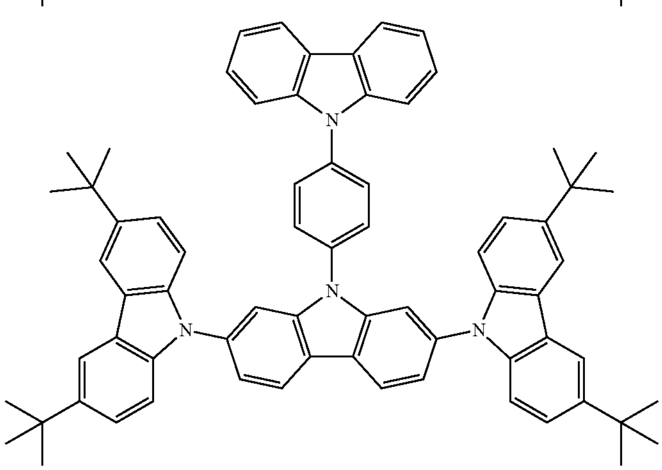

-continued
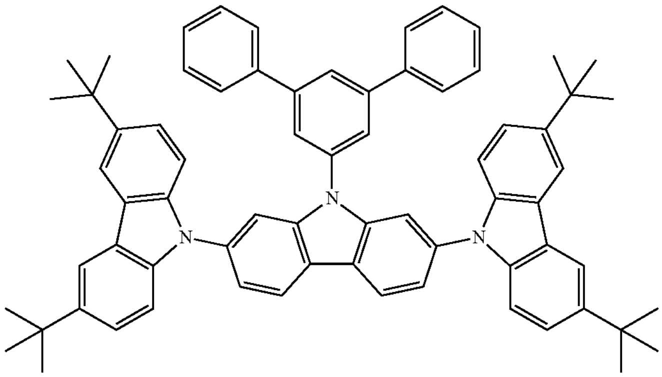
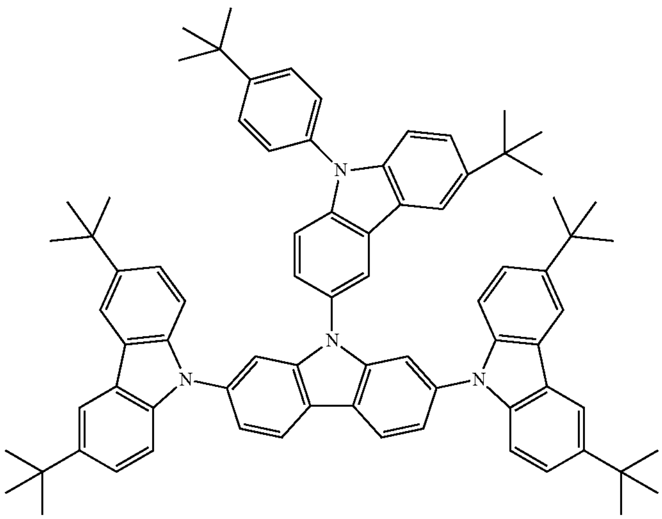
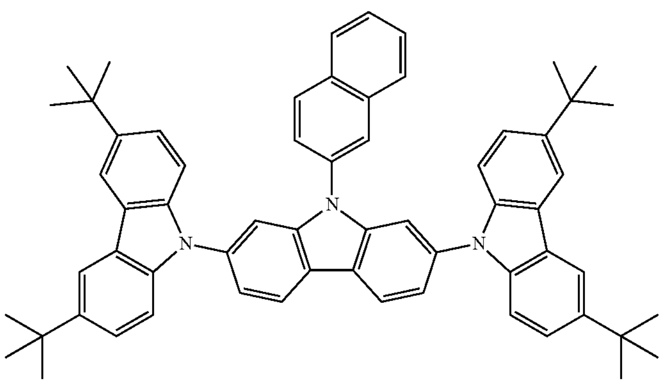
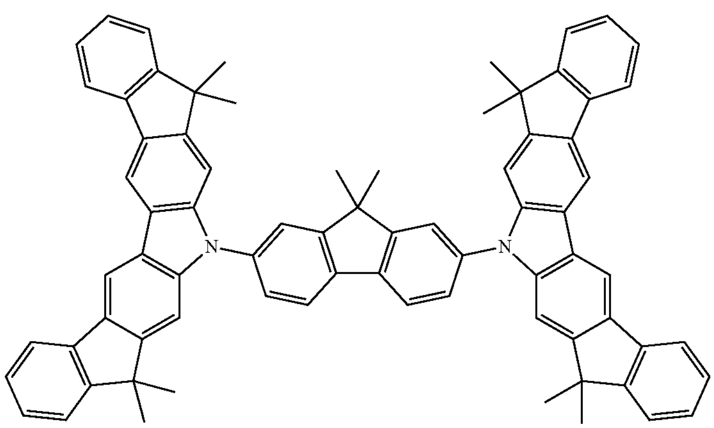

-continued
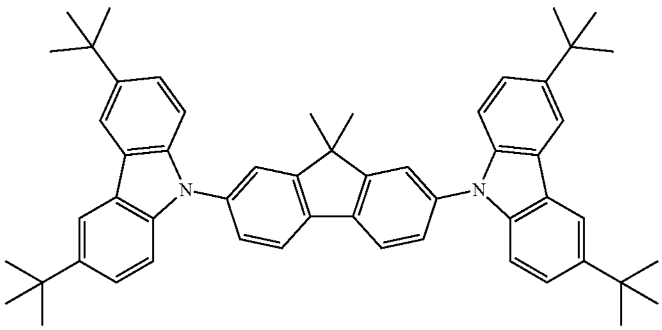
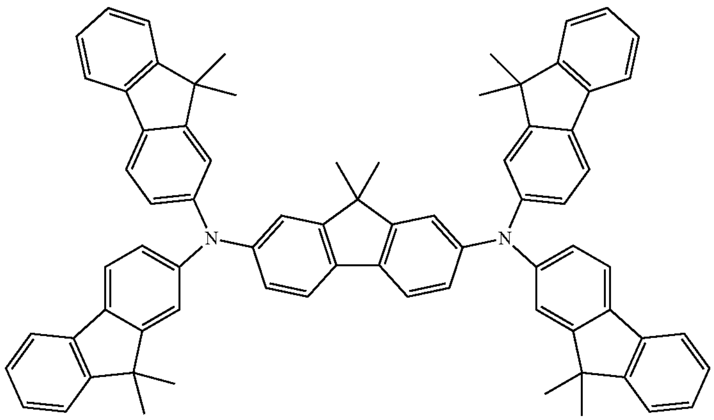
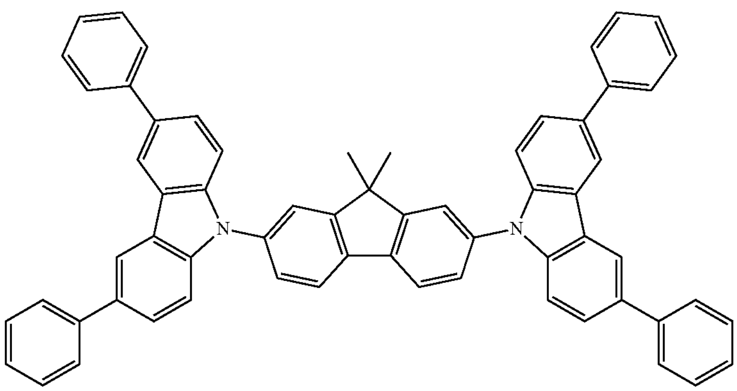
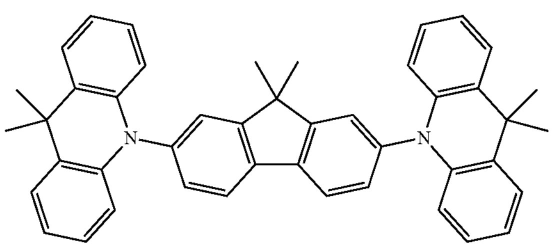
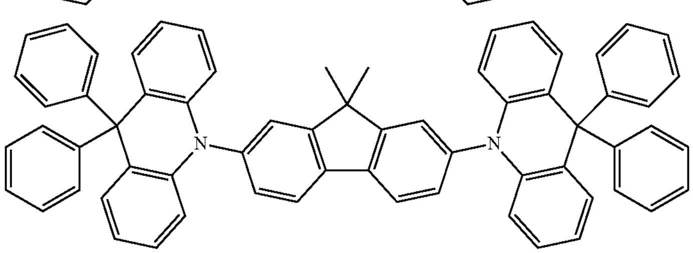

-continued
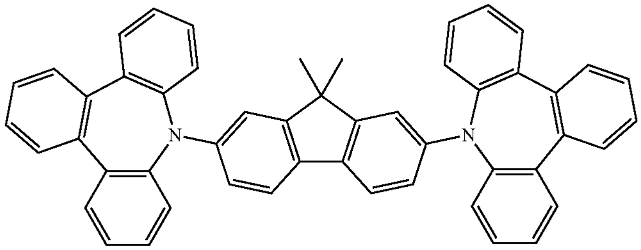
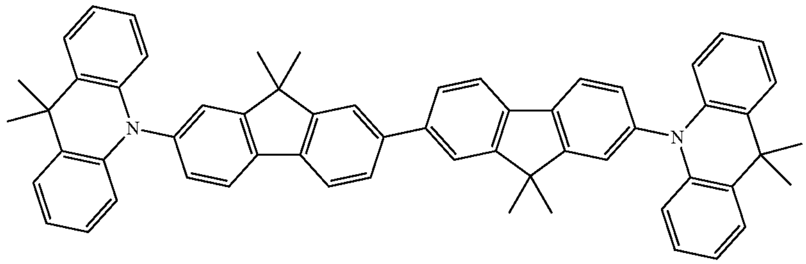
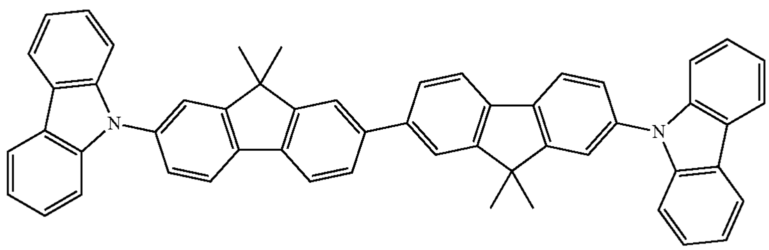
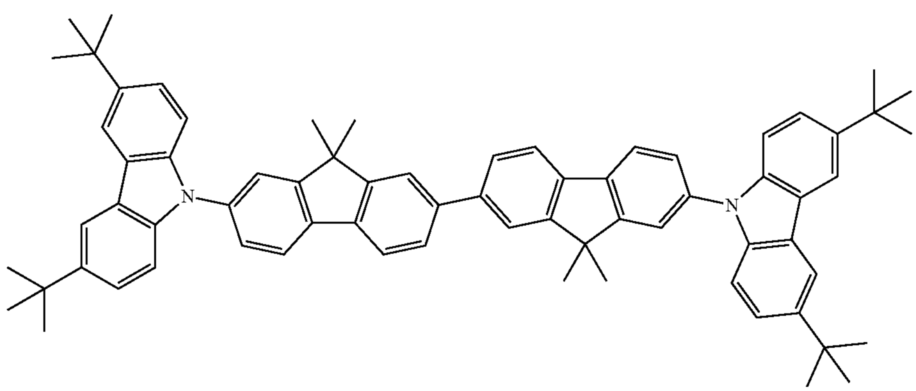
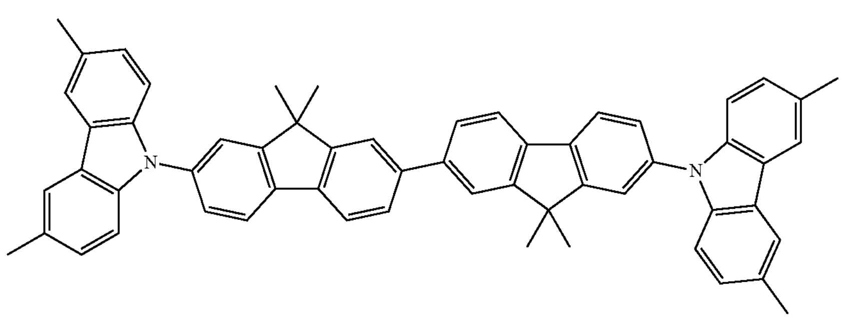

-continued
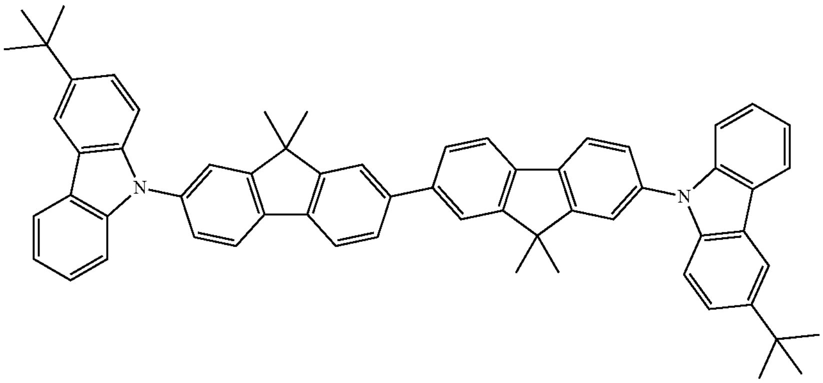
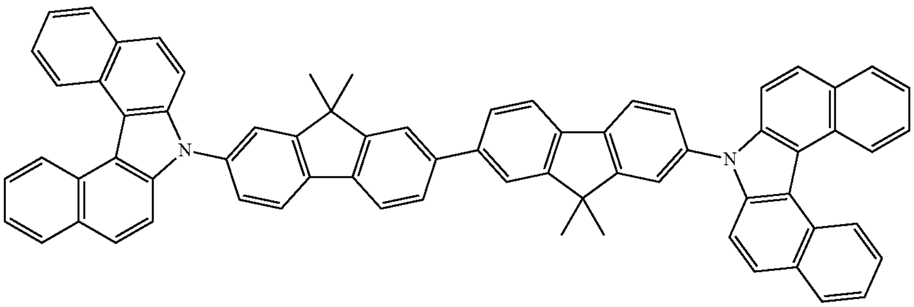
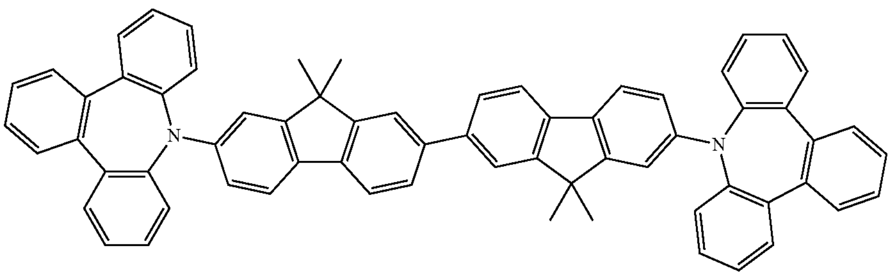
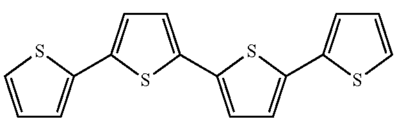
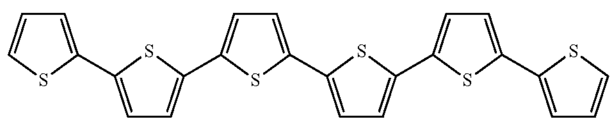
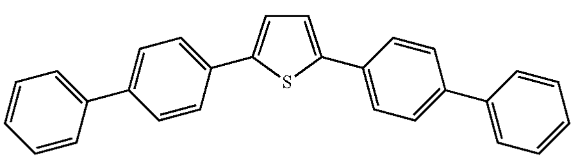
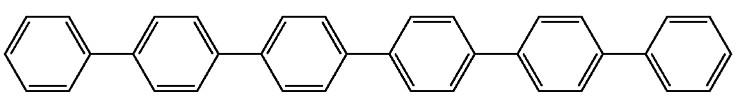
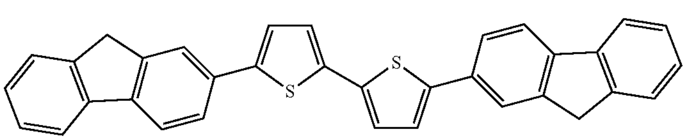
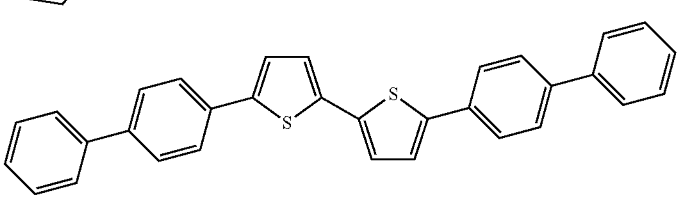

-continued
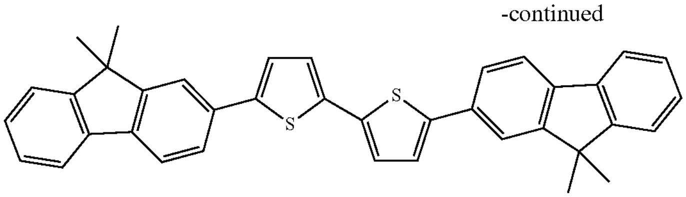
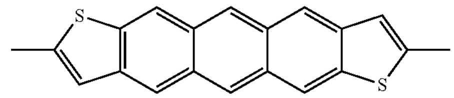
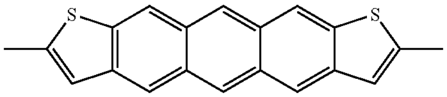
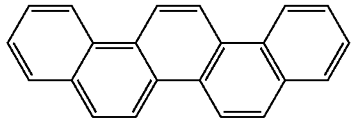
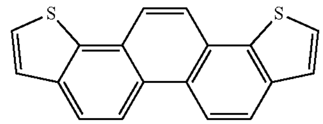
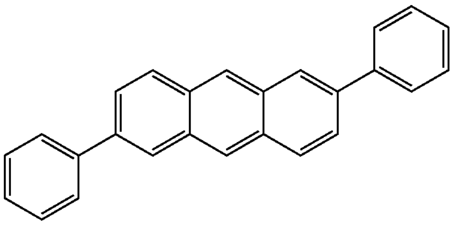
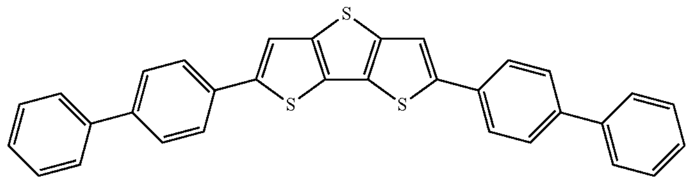
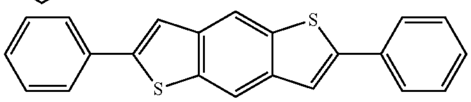
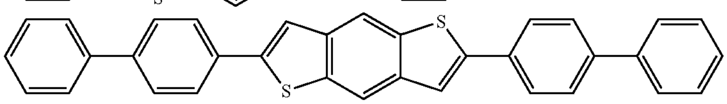
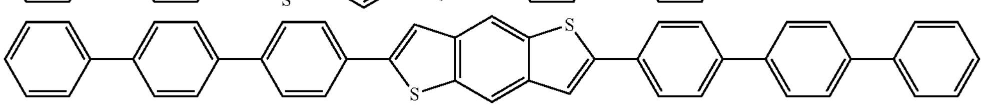
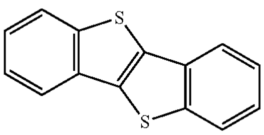
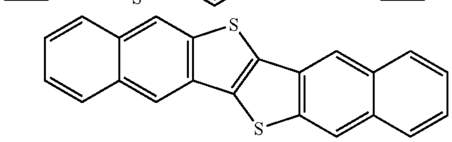
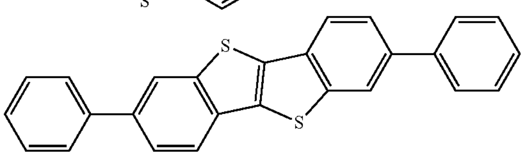
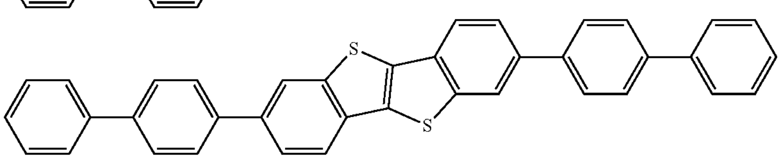
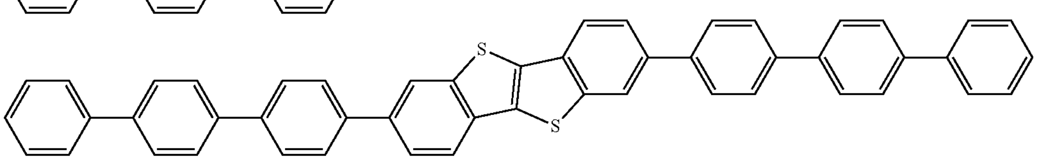
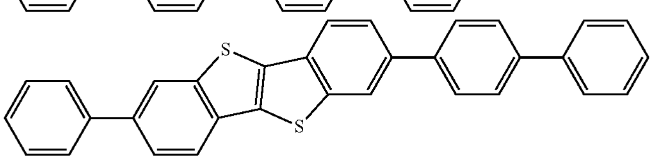
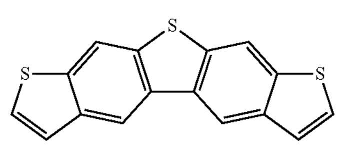
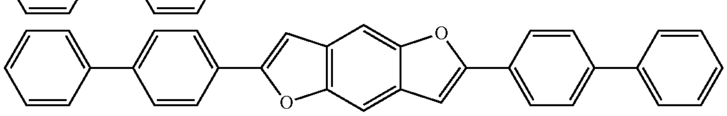
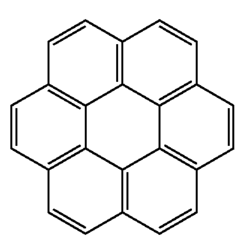

-continued
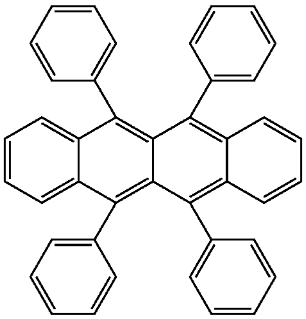
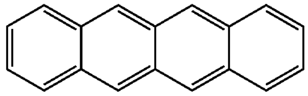
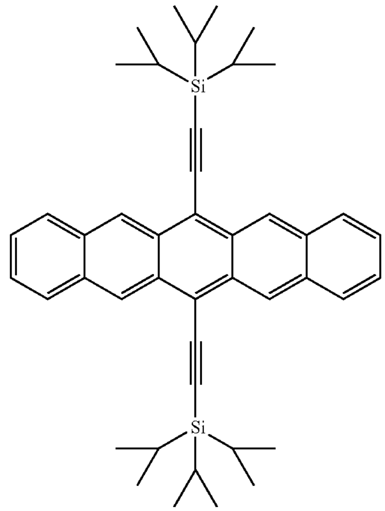
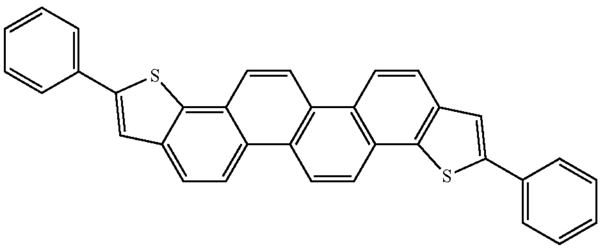
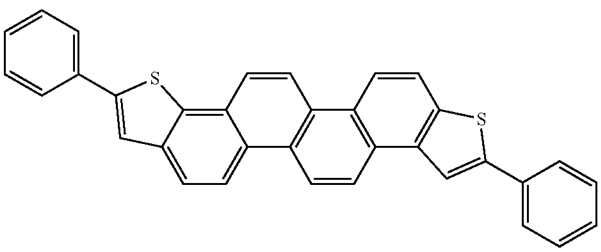
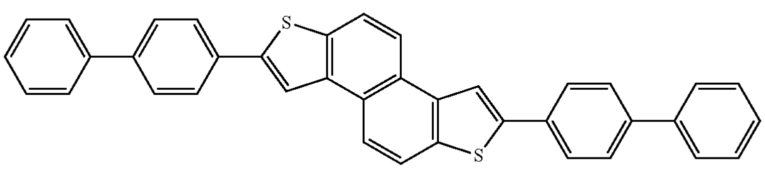
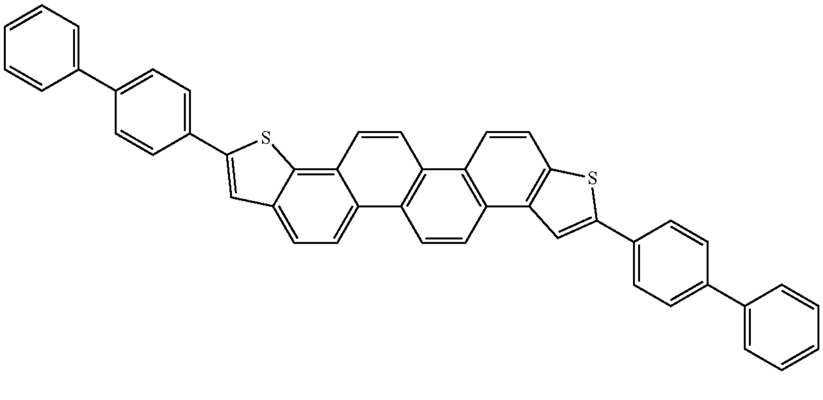

-continued
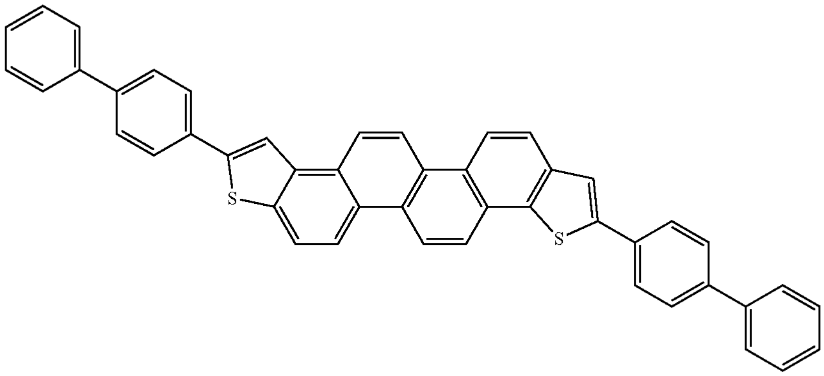
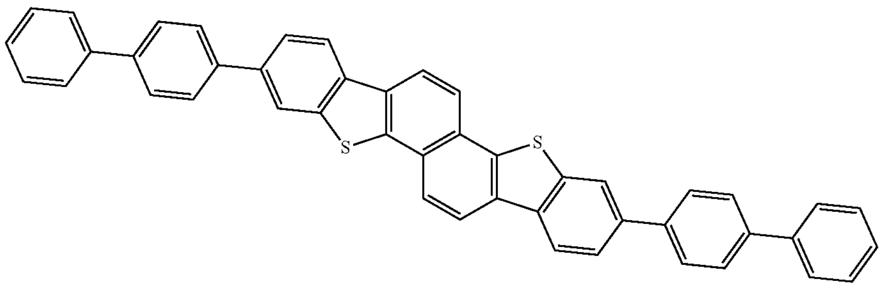
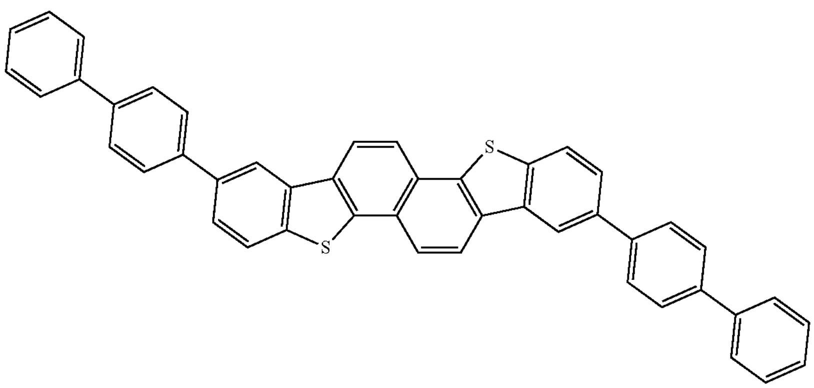
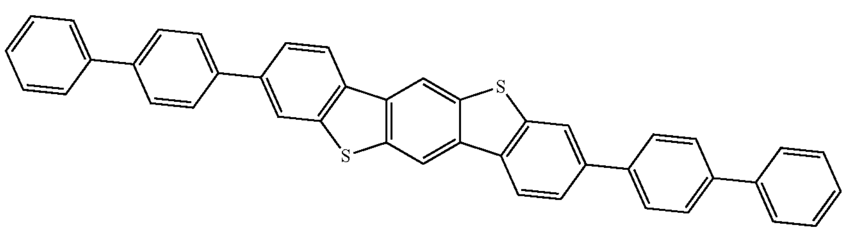
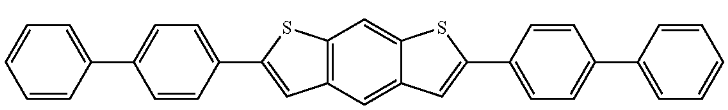

-continued

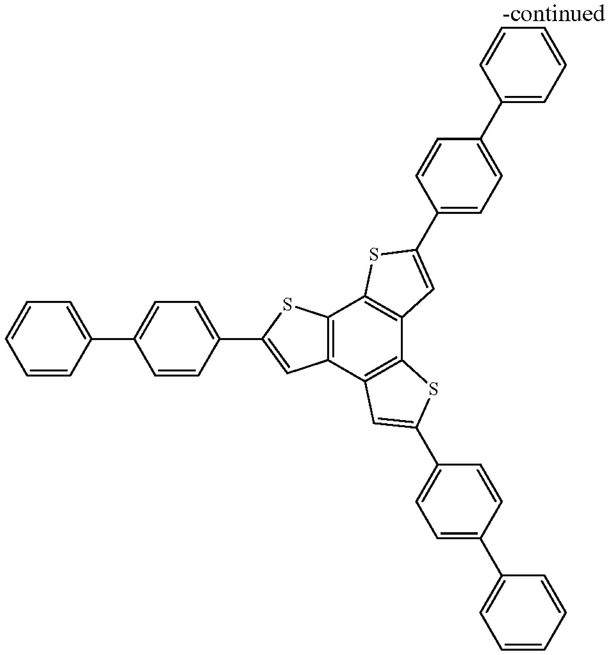

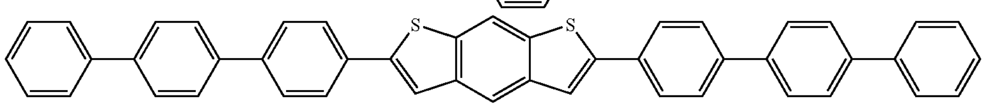

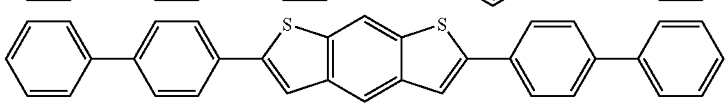

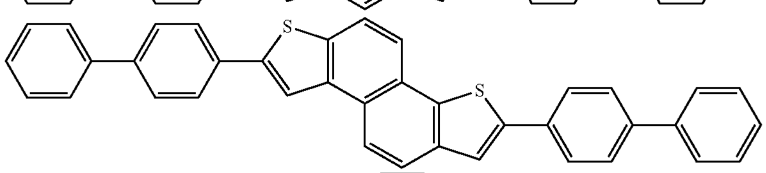

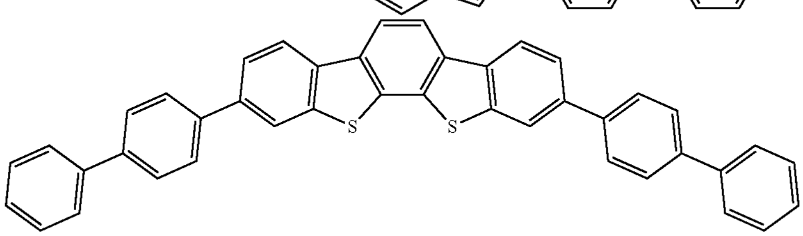

A content of the p-type semiconductor material with respect to the entire photoelectric conversion film (=(film thickness of p-type semiconductor material in terms of single layer/film thickness of entire photoelectric conversion film)×100) is preferably 5% to 70% by volume, more preferably 10% to 50% by volume, and still more preferably 15% to 40% by volume.

The p-type semiconductor material contained in the photoelectric conversion film may be used alone, or two or more thereof may be used in combination.

The photoelectric conversion film according to the embodiment of the present invention is a non-light emitting film, and has a feature different from an organic light emitting diode (OLED). The non-light emitting film means a film having a light emission quantum efficiency of 1% or less, and the light emission quantum efficiency is preferably 0.5% or less, and more preferably 0.1% or less.

<Film Formation Method>

The photoelectric conversion film can be formed mostly by a dry film formation method. Examples of the dry film formation method include a physical vapor deposition method such as a vapor deposition method (in particular, a vacuum deposition method), a sputtering method, and an ion plating method, a molecular beam epitaxy (MBE) method, and a chemical vapor deposition (CVD) method such as plasma polymerization. Among these, the vacuum deposition method is preferable. In a case where the photoelectric conversion film is formed by the vacuum deposition method, manufacturing conditions such as a degree of vacuum and a vapor deposition temperature can be set according to the normal method.

The thickness of the photoelectric conversion film (the thickness of the entire photoelectric conversion film in a case of the laminated photoelectric conversion film) is preferably 10 to 1000 nm, more preferably 50 to 800 nm, and still more preferably 50 to 500 nm.

Each thickness of each layer in the case of the laminated photoelectric conversion film is preferably 5 to 500 nm, more preferably 25 to 400 nm, and still more preferably 25 to 250 nm.

<Electrode>

Electrodes (the upper electrode (the transparent conductive film) 15 and the lower electrode (the conductive film) 11) are formed of conductive materials. Examples of the conductive material include metals, alloys, metal oxides, electrically conductive compounds, and mixtures thereof.

Since light is incident through the upper electrode 15, the upper electrode 15 is preferably transparent to light to be detected. Examples of the materials constituting the upper electrode 15 include conductive metal oxides such as tin oxide (antimony tin oxide (ATO), fluorine doped tin oxide (FTO)) doped with antimony, fluorine, or the like, tin oxide, zinc oxide, indium oxide, indium tin oxide (ITO), and indium zinc oxide (IZO); metal thin films such as gold, silver, chromium, and nickel; mixtures or laminates of these metals and the conductive metal oxides; and organic conductive materials such as polyaniline, polythiophene, and polypyrrole. Among these, conductive metal oxides are preferable from the viewpoints of high conductivity, transparency, and the like.

In general, in a case where the conductive film is made to be thinner than a certain range, a resistance value is rapidly increased. However, in the solid-state imaging element into which the photoelectric conversion element according to the present embodiment is incorporated, the sheet resistance is preferably 100 to 10000Ω/□, and a degree of freedom of a range of the film thickness that can be thinned is large. In addition, as the thickness of the upper electrode (the transparent conductive film) 15 is thinner, the amount of light that the upper electrode absorbs is smaller, and the light transmittance usually increases. The increase in the light transmittance causes an increase in light absorbance in the photoelectric conversion film and an increase in the photoelectric conversion ability, which is preferable. Considering the suppression of leakage current, an increase in the resistance value of the thin film, and an increase in transmittance accompanied by the thinning, the film thickness of the upper electrode 15 is preferably 5 to 100 nm, and more preferably 5 to 20 nm.

There is a case where the lower electrode 11 has transparency or an opposite case where the lower electrode does not have transparency and reflects light, depending on the application. Examples of a material constituting the lower electrode 11 include conductive metal oxides such as tin oxide (ATO, FTO) doped with antimony, fluorine, or the like, tin oxide, zinc oxide, indium oxide, indium tin oxide (ITO), and indium zinc oxide (IZO); metals such as gold, silver, chromium, nickel, titanium, tungsten, and aluminum, conductive compounds (for example, titanium nitride (TiN)) such as oxides or nitrides of these metals; mixtures or laminates of these metals and conductive metal oxides; and organic conductive materials such as polyaniline, polythiophene, and polypyrrole.

The method of forming electrodes is not particularly limited, and can be appropriately selected in accordance with the electrode material. Specific examples thereof include a wet method such as a printing method and a coating method; a physical method such as a vacuum deposition method, a sputtering method, and an ion plating method; and a chemical method such as a CVD method and a plasma CVD method.

In a case where the material of the electrode is ITO, examples thereof include an electron beam method, a sputtering method, a resistance heating vapor deposition method, a chemical reaction method (such as a sol-gel method), and a coating method with a dispersion of indium tin oxide.

<Charge Blocking Film: Electron Blocking Film and Positive Hole Blocking Film>

It is also preferable that the photoelectric conversion element according to the embodiment of the present invention has one or more interlayers between the conductive film and the transparent conductive film, in addition to the photoelectric conversion film. An example of the interlayer includes a charge blocking film. In a case where the photoelectric conversion element has this film, the characteristics (such as photoelectric conversion efficiency and responsiveness) of the obtained photoelectric conversion element are more excellent. Examples of the charge blocking film include an electron blocking film and a positive hole blocking film. The photoelectric conversion element preferably includes at least an electron blocking film as an interlayer.

Hereinafter, each of the films will be described in detail.

(Electron Blocking Film)

The electron blocking film is a donor organic semiconductor material (compound).

The electron blocking film preferably has an ionization potential of 4.8 to 5.8 eV.

An ionization potential Ip(B) of the electron blocking film, an ionization potential Ip (1) of the first compound, and an ionization potential Ip (2) of the second compound satisfy a relationship of Ip(B)≤Ip (1) and Ip(B)≤Ip (2).

As the electron blocking film, for example, a p-type organic semiconductor can be used. The p-type organic semiconductor may be used alone, or two or more thereof may be used in combination.

Examples of the p-type organic semiconductor include triarylamine compounds (for example, N, N'-bis (3-methylphenyl)-(1,1'-biphenyl)-4,4'-diamine (TPD), 4,4'-bis [N-(naphthyl)-N-Phenyl-amino] biphenyl (α-NPD), compounds disclosed in paragraphs [0128] to [0148] of JP2011-228614A, compounds disclosed in paragraphs [0052] to [0063] of JP2011-176259A, compounds disclosed in paragraphs [0119] to [0158] of JP2011-225544A, compounds disclosed in paragraphs [0044] to [0051] of JP2015-153910A, and compounds disclosed in paragraphs [0086] to [0090] of JP2012-94660A, pyrazoline compounds, styrylamine compounds, hydrazone compounds, polysilane compounds, thiophene compounds (for example, a thienothiophene derivative, a dibenzothiophene derivative, a benzodithiophene derivative, a dithienothiophene derivative, a [1] benzothieno [3,2-b] thiophene (BTBT) derivative, a thieno [3,2-f: 4,5-f] bis [1] benzothiophene (TBBT) derivative, compounds disclosed in paragraphs [0031] to [0036] of JP2018-14474A, compounds disclosed in paragraphs [0043] to [0045] of WO2016-194630A, compounds disclosed in paragraphs [0025] to [0037], and [0099] to [0109] of WO2017-159684A, compounds disclosed in paragraphs [0029] to [0034] of JP2017-076766A, compounds disclosed in paragraphs [0015] to [0025] of WO2018-207722A, compounds disclosed in paragraphs [0045] to [0053] of JP2019-54228A, compounds disclosed in paragraphs [0045] to [0055] of WO2019-058995A, compounds disclosed in paragraphs [0063] to [0089] of WO2019-081416A, compounds disclosed in paragraphs [0033] to [0036] of JP2019-80052A, compounds disclosed in paragraphs [0044] to [0054] of WO2019-054125A, compounds disclosed in paragraphs [0041] to [0046] of WO2019-093188A, and the like), a cyanine compound, an oxonol compound, a polyamine compound, an indole compound, a pyrrole compound, a pyrazole compound, a polyarylene compound, a fused aromatic carbocyclic compound (for example, a naphthalene derivative, an anthracene derivative, a phenanthrene derivative, a tetracene derivative, a pentacene derivative, a pyrene derivative, a perylene derivative, and a fluoranthene derivative), a porphyrin compound, a phthalocyanine compound, a triazole compound, an oxadiazole compound, an imidazole compound, a polyarylalkane compound, a pyrazolone compound, an amino-substituted chalcone compound, an oxazole compound, a fluorenone compound, a silazane compound, and a metal complex having nitrogen-containing heterocyclic compounds as ligands.

Examples of the p-type organic semiconductor include compounds having an ionization potential smaller than that of the n-type semiconductor material, and in a case where this condition is satisfied, the organic coloring agents exemplified as the n-type semiconductor material can be used.

A polymer material can also be used as the electron blocking film.

Examples of the polymer material include a polymer such as phenylenevinylene, fluorene, carbazole, indole, pyrene, pyrrole, picoline, thiophene, acetylene, and diacetylene, and a derivative thereof.

The electron blocking film may be formed of a plurality of films.

The electron blocking film may be formed of an inorganic material. In general, since an inorganic material has a dielectric constant larger than that of an organic material, in a case where the inorganic material is used in the electron blocking film, a large voltage is applied to the photoelectric conversion film. Therefore, the photoelectric conversion efficiency increases. Examples of the inorganic material that can be used for the electron blocking film include calcium oxide, chromium oxide, copper chromium oxide, manganese oxide, cobalt oxide, nickel oxide, copper oxide, copper gallium oxide, copper strontium oxide, niobium oxide, molybdenum oxide, copper indium oxide, silver indium oxide, and iridium oxide.

(Positive Hole Blocking Film)

A positive hole blocking film is an acceptor-property organic semiconductor material (compound), and the n-type semiconductor material described above can be used.

The method of manufacturing the charge blocking film is not particularly limited, and examples thereof include a dry film formation method and a wet film formation method. Examples of the dry film formation method include a vapor deposition method and a sputtering method. The vapor deposition method may be any of a physical vapor deposition (PVD) method and a chemical vapor deposition (CVD) method, and the physical vapor deposition method such as a vacuum deposition method is preferable. Examples of the wet film formation method include an ink jet method, a spray method, a nozzle printing method, a spin coating method, a dip coating method, a casting method, a die coating method, a roll coating method, a bar coating method, and a gravure coating method, and an ink jet method is preferable from the viewpoint of high accuracy patterning.

Each thickness of the charge blocking films (the electron blocking film and the positive hole blocking film) is preferably 3 to 200 nm, more preferably 5 to 100 nm, and still more preferably 5 to 30 nm.

<Substrate>

The photoelectric conversion element may further include a substrate. Types of the substrate to be used are not particularly limited, and examples of the substrate include a semiconductor substrate, a glass substrate, and a plastic substrate.

A position of the substrate is not particularly limited, and in general, the conductive film, the photoelectric conversion film, and the transparent conductive film are laminated on the substrate in this order.

<Sealing Layer>

The photoelectric conversion element may further include a sealing layer. The performance of a photoelectric conversion material may deteriorate noticeably due to the presence of deterioration factors such as water molecules. The deterioration can be prevented by coating and sealing the entirety of the photoelectric conversion film with the sealing layer such as diamond-like carbon (DLC) or ceramics such as metal oxide, or metal nitride, and metal nitride oxide which are dense and into which water molecules do not permeate.

The material of the sealing layer may be selected and the sealing layer may be manufactured according to the description in paragraphs [0210] to [0215] of JP2011-082508A.

[Imaging Element]

An example of the application of the photoelectric conversion element includes an imaging element having a photoelectric conversion element. The imaging element is an element that converts optical information of an image into an electric signal. In general, a plurality of the photoelectric conversion elements are arranged in a matrix on the same plane, and an optical signal is converted into an electric signal in each photoelectric conversion element (pixel) to sequentially output the electric signal to the outside of the imaging element for each pixel. Therefore, each pixel is formed of one or more photoelectric conversion elements and one or more transistors.

The imaging element is mounted on an imaging element such as a digital camera and a digital video camera, an electronic endoscope, and imaging modules such as a cellular phone.

The photoelectric conversion element of the present invention is also preferably used for an optical sensor including the photoelectric conversion element of the present invention. The photoelectric conversion element may be used alone as the optical sensor, and the photoelectric conversion element may be used as a line sensor in which the photoelectric conversion elements are linearly arranged or as a two-dimensional sensor in which the photoelectric conversion elements are arranged in a plane shape.

EXAMPLES

The present invention will be described in more detail based on Examples below. Materials, used amounts, ratios, treatment contents, treatment procedures, and the like described in the following Examples can be appropriately changed within the range that does not depart from the gist of the present invention. Therefore, the range of the present invention should not be limitatively interpreted by the following Examples. As possible, each compound used in the production of the photoelectric conversion element was sublimated and purified in advance, and then used in the production of the actual photoelectric conversion element.

[Compound]

<First Compound>

(Synthesis of Compound B-1)

A compound (B-1) was synthesized according to the following scheme.

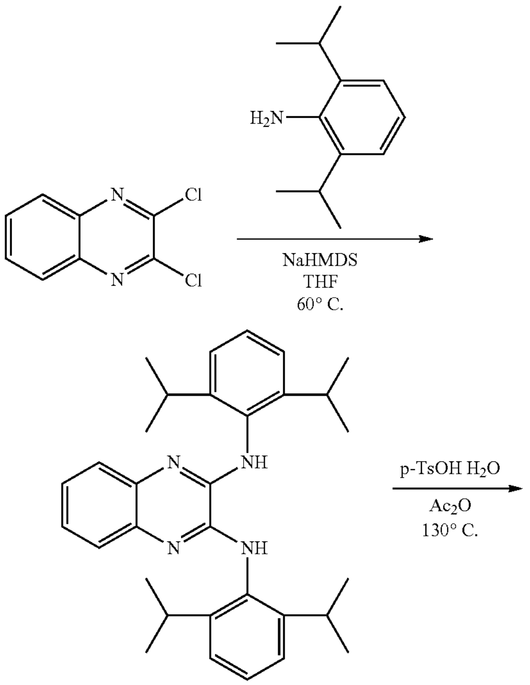

(B-1-1)

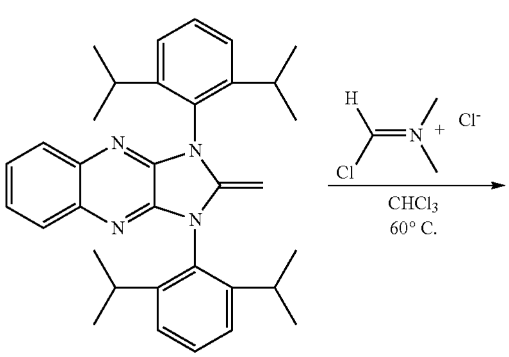

(B-1-2)

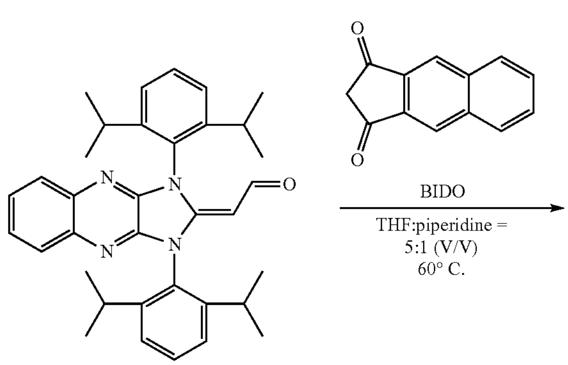

(B-1-3)

-continued

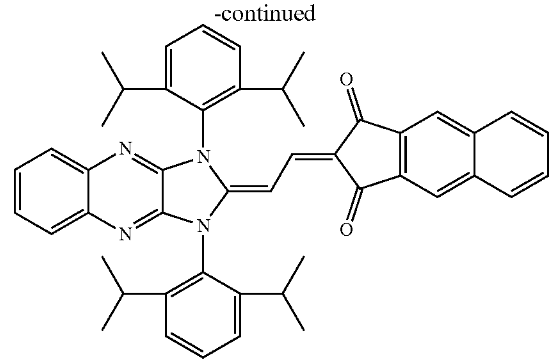

(B-1)

2,3-dichloroquinoxaline (20.0 g, 100 mmol), 2,6-diisopropylaniline (42 mL, 220 mmol), and tetrahydrofuran (100 mL) were mixed to obtain a mixed liquid, and hexamethyldisilazane sodium 35% by mass tetrahydrofuran solution (1.9 mol/L) (237 mL, 450 mmol) was added dropwise to the mixed liquid. The mixed liquid was stirred at 60° C. for 1 hour and allowed to cool to room temperature, and water (200 mL) was added dropwise to the mixed liquid. Furthermore, 100 mL of 20% by mass saline solution was added to the above-described mixed liquid, and an organic phase in the above-described mixed liquid was then extracted. The obtained organic layer was dried by magnesium sulfate and filtered, and the obtained filtrate was concentrated under reduced pressure. A crude product obtained by concentration under reduced pressure was dispersed in 2-propanol and washed. The crude product after washing was collected by filtration, and the filtrate was dried under reduced pressure to obtain an intermediate (B-1-1) (33.7 g, yield 70%).

p-Toluenesulfonic acid monohydrate (35.6 g, 187 mmol), acetic anhydride (62 mL), and the intermediate (B-1-1) (30.0 g, 62.4 mmol) were mixed to obtain a reaction solution, and the obtained reaction solution was stirred at 130° C. for 3 hours. The reaction solution allowed to cool to room temperature was added dropwise to a mixture of a 50 w/v % aqueous sodium hydroxide solution (100 mL) and ice (440 g), and the obtained reaction mixture was stirred for 30 minutes. Acetic acid was added to the reaction mixture to adjust the pH to 8 at 25° C., and the reaction mixture was further stirred for 20 minutes. The resulting precipitate was filtered, and the obtained crude product (filtrate) was washed with water and methanol in this order. The washed crude product was reprecipitated with dichloromethane and methanol. The target product obtained by reprecipitation is collected by filtration, and the target product (filtrate) is dried under reduced pressure to obtain an intermediate (B-1-2) (26.8 g, yield 87%).

The intermediate (B-1-2) (25.0 g, 49.5 mmol) was added to a mixture of (chloromethylene)dimethyliminium chloride (15.8 g, 124 mmol) and acetonitrile (100 mL) to obtain a reaction solution, and the reaction solution was stirred at 60° C. for 2 hours. The reaction solution allowed to cool to room temperature was added dropwise to a mixture of a 1 mol/L aqueous sodium hydroxide solution (375 mL) and ice (250 g), and the obtained mixture was stirred for 1 hour. The resulting precipitate produced in the mixture was filtered, and the obtained crude product (filtrate) was washed with water and methanol in this order. The washed crude product was reprecipitated with dichloromethane and acetonitrile. The target product obtained by reprecipitation is collected by filtration, and the target product (filtrate) is dried under reduced pressure to obtain an intermediate (B-1-3) (16.4 g, yield 62%).

The intermediate (B-1-3) (40.0 g, 75.1 mmol), benzoindan-1,3-dione (19.2 g, 98.0 mmol), tetrahydrofuran (375 mL), and piperidine (75 mL) were mixed to obtain a reaction solution, and the obtained reaction solution was stirred at 60° C. for 2 hours. After allowing the reaction solution to cool to room temperature, methanol (375 mL) was added to the reaction solution, and the reaction solution was further stirred for 30 minutes. The resulting precipitate produced in the reaction solution was filtered, and the obtained crude product (filtrate) was washed with methanol. The washed crude product was reprecipitated with dichloromethane and methanol. The target product obtained by reprecipitation is collected by filtration, and the target product (filtrate) is dried under reduced pressure to obtain a compound (B-1) (47.6 g, yield 89%).

The results of identifying the obtained compound (B-1) by nuclear magnetic resonance (NMR) are as follows.

$^1$H-NMR ($CDCl_3$, 400 MHz) b=1.19 (18H, d), 1.26 (6H, d), 2.60-2.81 (4H, m), 6.88 (2H, s), 7.50-7.54 (4H, m), 7.58-7.63 (4H, m), 7.73 (1H, t), 7.84-7.98 (5H, m), 8.08 (2H, d)

The first compound used in the Example is illustrated.

Compounds B-2 to B-14 were synthesized with reference to the method for synthesizing the compound B-1. Other compounds were obtained by known methods.

The compounds B-1 to B-14 correspond to the compounds represented by Formula (1).

(B-1)

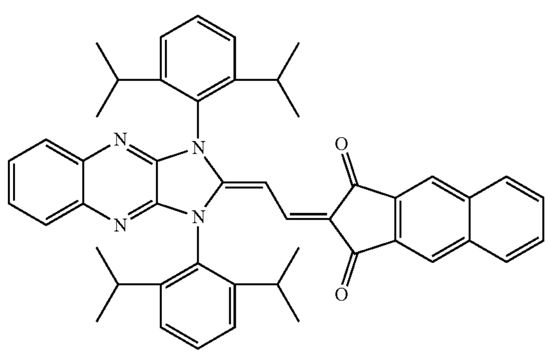

(B-2)

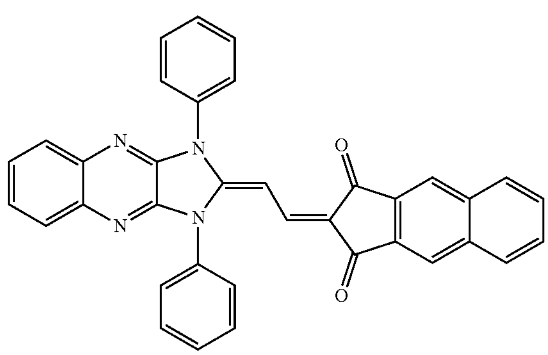

-continued (B-3)

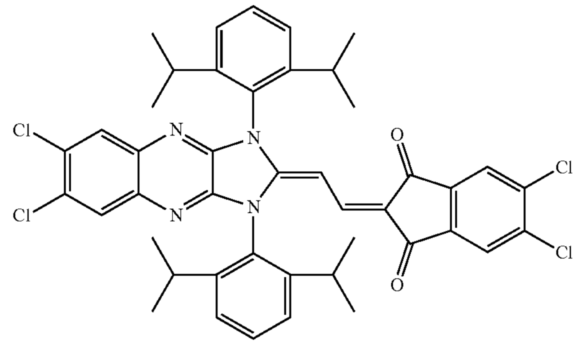

(B-4)

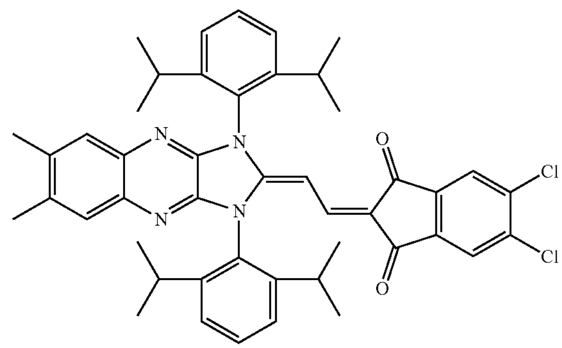

(B-5)

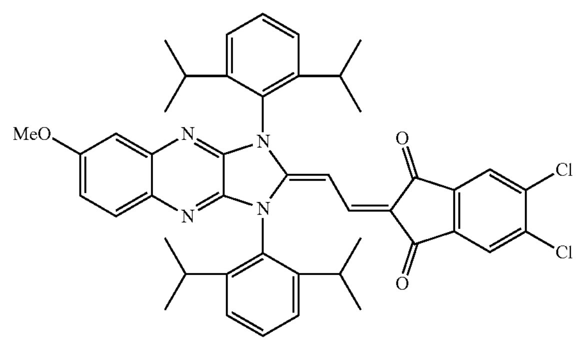

(B-6)

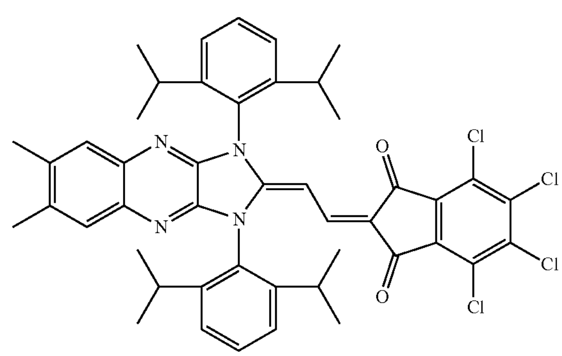

-continued
(B-7)
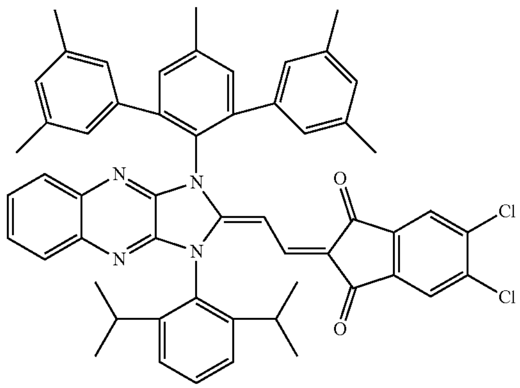
(B-8)
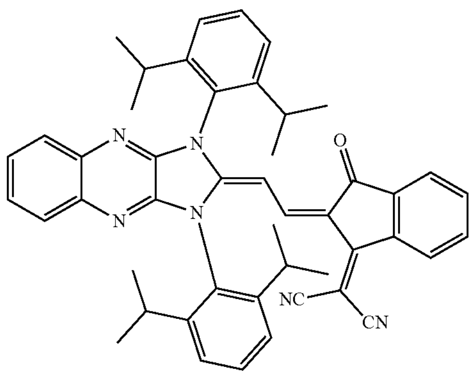
(B-9)
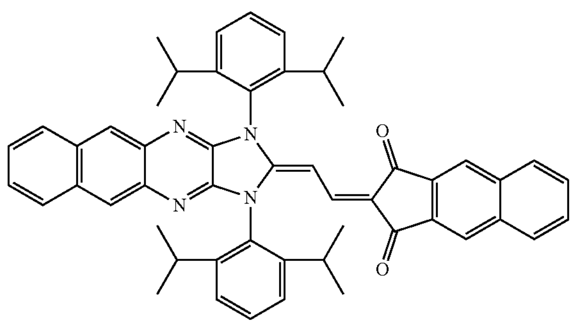
(B-10)
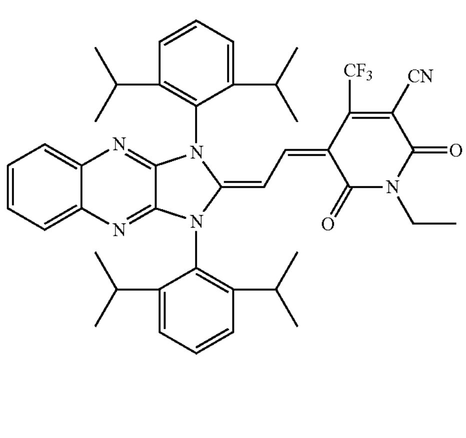
-continued
(B-11)
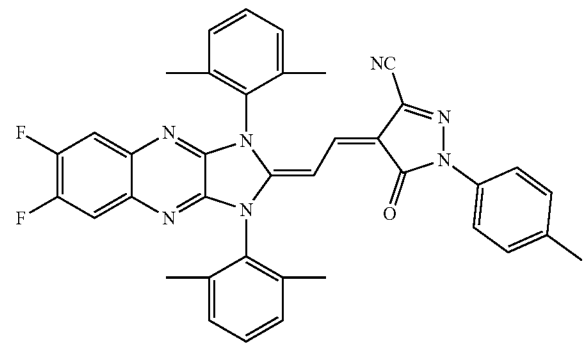
(B-12)
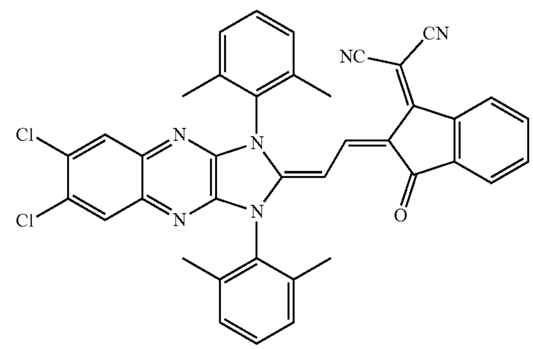
(B-13)
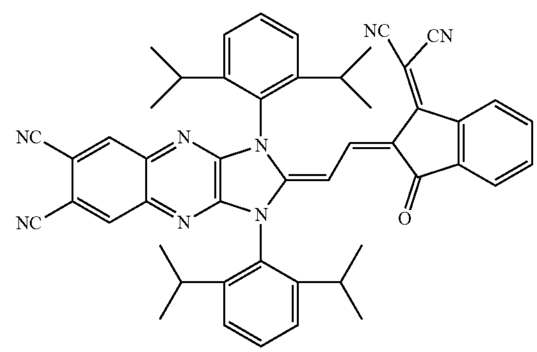
(B-14)
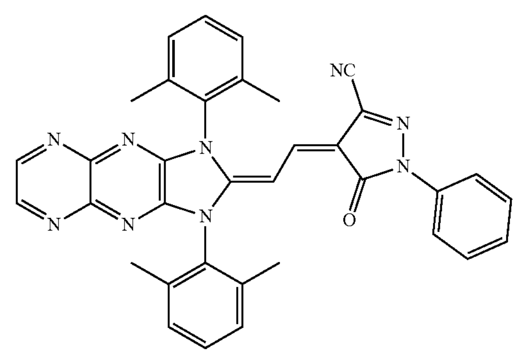
Maximum absorption wavelengths of B-1 to B-14 were all in the range of 500 to 620 nm.
<Second Compound>
The following compounds were used as the second compound.

(A-2)
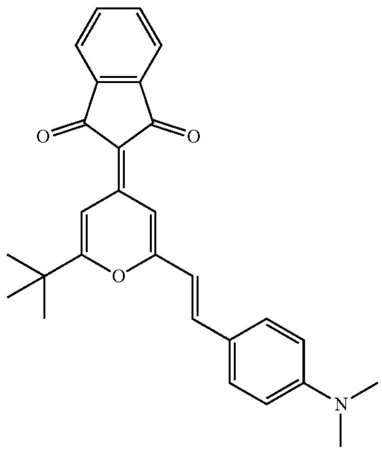
(A-3)
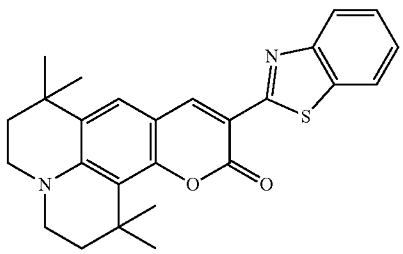
(A-5)
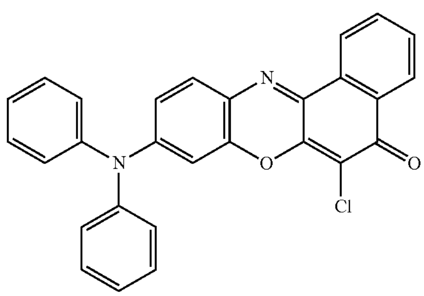
(A-7)
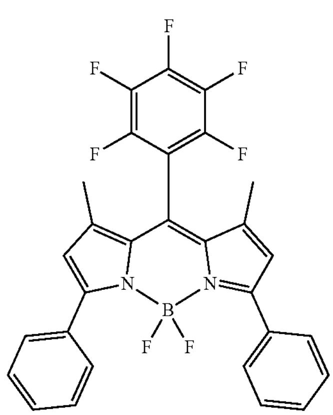
(A-1)
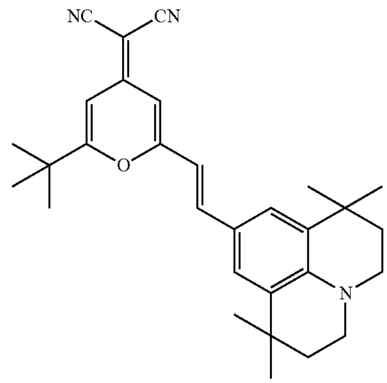
(A-4)
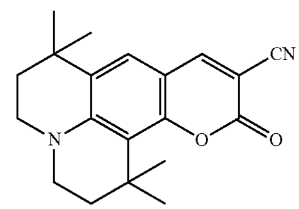
(A-6)
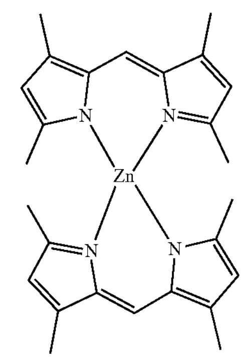
(A-8)
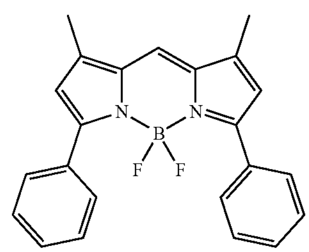

-continued
(A-9)
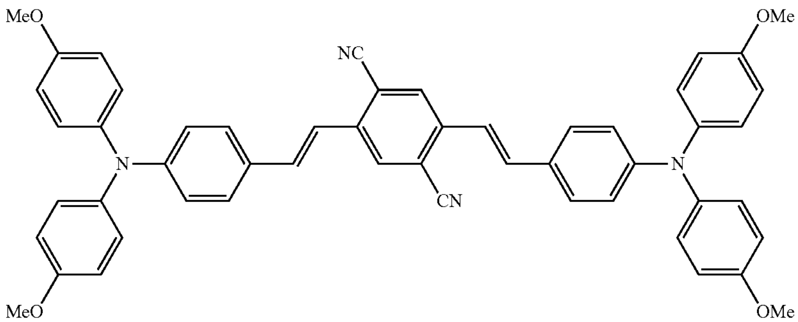
(A-10)
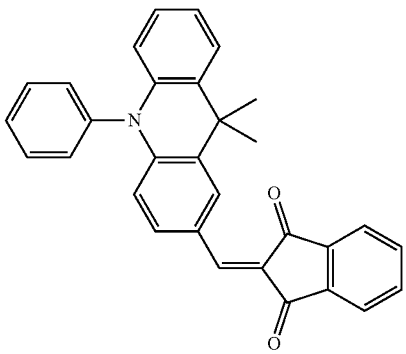
(A-11)
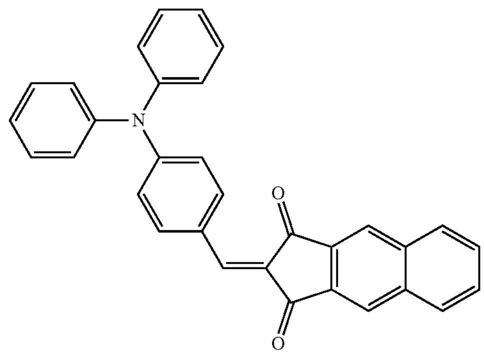
(A-12)
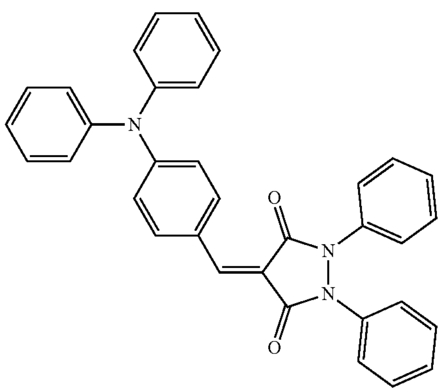
(A-13)
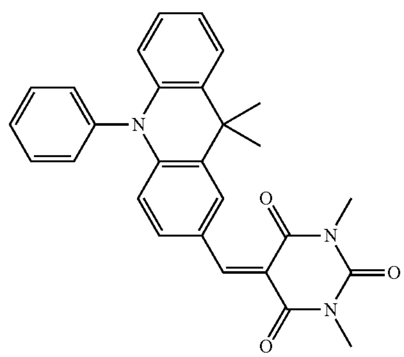
(A-14)
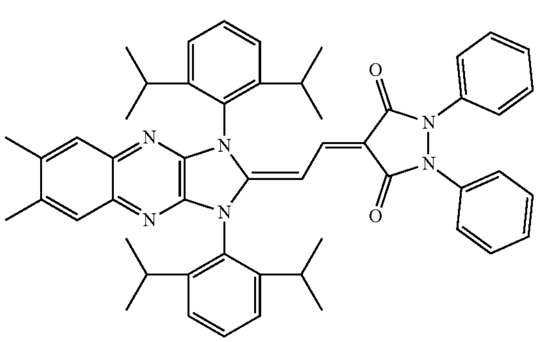
(A-15)
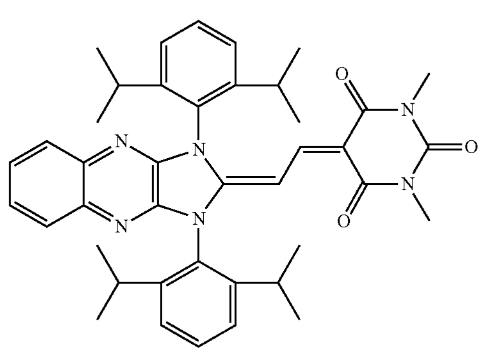

Maximum absorption wavelengths of A-1 to A-15 were all in the range of 450 to 550 nm.

In addition, the maximum absorption wavelengths of A-14 and A-15 were smaller than any maximum absorption wavelength of B-1 to B-14.

<n-Type Semiconductor Material>

$C_{60}$ (fullerene ($C_{60}$)) was used as the n-type semiconductor material.

The fullerene ($C_{60}$) illustrated in the upper row has a higher electron affinity than the first compound and the second compound.

<p-Type Semiconductor Material>

The following compounds were used as the p-type semiconductor material.

80 nm respectively, in terms of a single layer, on the electron blocking film 16A to be formed into a film in a state where the temperature of the substrate was controlled to 25° C., and the photoelectric conversion film 12 having a bulk hetero-structure of 240 nm was formed (320 nm in a case where the p-type semiconductor material was also used).

Furthermore, amorphous ITO was formed into a film on the photoelectric conversion film 12 by a sputtering method to form the upper electrode 15 (the transparent conductive film) (the thickness: 10 nm). A SiO film was formed as a sealing layer on the upper electrode 15 by a vacuum deposition method, and thereafter, an aluminum oxide ($Al_2O_3$) layer was formed thereon by an atomic layer chemical vapor (P-1)

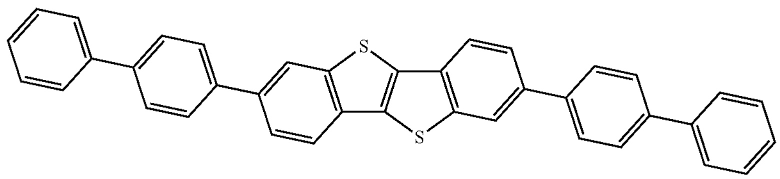

(P-2)

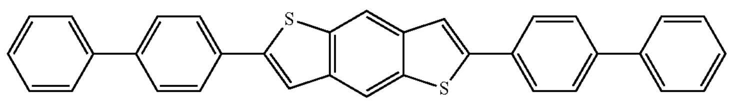

(P-3)

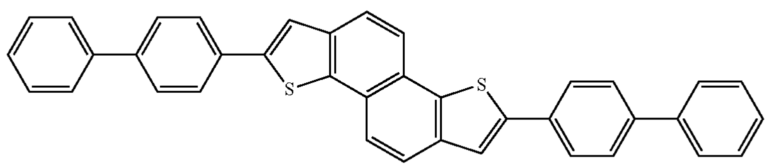

(P-4)

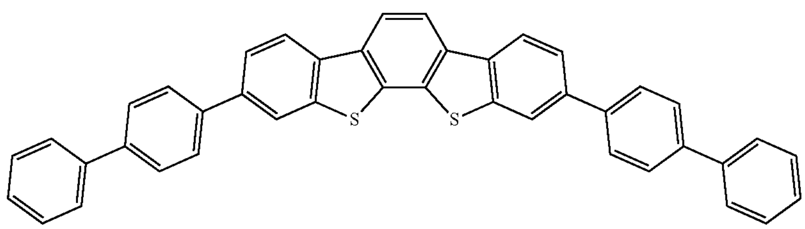

[Production of Photoelectric Conversion Element]

Various photoelectric conversion elements were produced by methods illustrated below.

<Production-1 of Photoelectric Conversion Element>

The obtained compound is used to produce the photoelectric conversion element including the single layer type photoelectric conversion film as a mixture layer, in the form of FIG. 1. Here, the photoelectric conversion element consists of a lower electrode 11, an electron blocking film 16A, a photoelectric conversion film 12, and an upper electrode 15.

Specifically, an amorphous ITO was formed into a film on a glass substrate by a sputtering method to form the lower electrode 11 (thickness: 30 nm). Furthermore, a compound (EB-1) described below was formed into a film on the lower electrode 11 by a vacuum thermal vapor deposition method to form the electron blocking film 16A (thickness: 30 nm).

Furthermore, the first compound, the second compound, the n-type semiconductor material (fullerene ($C_{60}$)), and the p-type semiconductor material as desired were subjected to co-vapor deposition by a vacuum deposition method to be deposition (ALCVD) method to produce a photoelectric conversion element including a photoelectric conversion film of a single layer.

Specific types and combinations of the first compound, the second compound, and the p-type semiconductor material used for producing the photoelectric conversion film are described in Table illustrated in the following column.

Regarding the photoelectric conversion films in the photoelectric conversion elements of Comparative Examples 1-1 and 1-2, the first compound or the second compound was not used, and one of the first compound and the second compound, the n-type semiconductor material (fullerene ($C_{60}$)), and the p-type semiconductor material were subjected to co-vapor deposition by a vacuum deposition method to be 80 nm respectively, in terms of a single layer, to be formed into a film.

In Comparative Example 1-3, the following comparative compound (R-1) was used instead of the first compound, and the compound (A-2) was used as the second compound.

EB-1

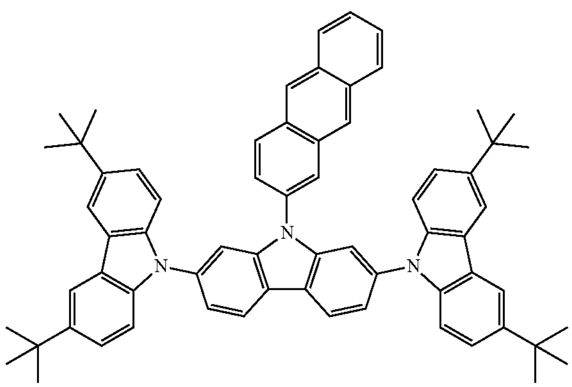

R-1

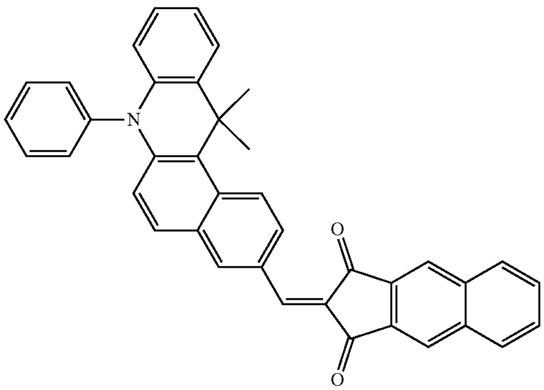

<Production-2 of Photoelectric Conversion Element>

The obtained compound is used to produce the photoelectric conversion element illustrated FIG. 1, which includes the laminated photoelectric conversion film illustrated in FIG. 2. Here, the photoelectric conversion element consists of a lower electrode 11, an electron blocking film 16A, a photoelectric conversion film 12, and an upper electrode 15.

Specifically, an amorphous ITO was formed into a film on a glass substrate by a sputtering method to form the lower electrode 11 (thickness: 30 nm). Furthermore, a compound (EB-2) described below was formed into a film on the lower electrode 11 by a vacuum thermal vapor deposition method to form the electron blocking film 16A (thickness: 30 nm).

Furthermore, in a state where the temperature of the substrate was controlled to 25° C., a second compound, the second compound, the n-type semiconductor material (fullerene ($C_{60}$)), and the p-type semiconductor material as desired were subjected to co-vapor deposition by a vacuum deposition method to be 80 nm respectively, in terms of a single layer, on the electron blocking film 16A to be formed into a film. Thereafter, furthermore, the first compound, the n-type semiconductor material (fullerene ($C_{60}$)), and the p-type semiconductor material as desired were subjected to co-vapor deposition by a vacuum deposition method to be 80 nm respectively, in terms of a single layer to be formed into a film. As a result, the photoelectric conversion film 12 consisting of a layer 12A containing the second compound having a bulk heterostructure of 160 nm (240 nm in a case where the p-type semiconductor material was also used) and a layer 12B containing the first compound having a bulk heterostructure of 160 nm (240 nm in a case where the p-type semiconductor material was also used).

Furthermore, amorphous ITO was formed into a film on the photoelectric conversion film 12 by a sputtering method to form the upper electrode 15 (the transparent conductive film) (the thickness: 10 nm). A SiO film was formed as a sealing layer on the upper electrode 15 by a vacuum deposition method, and thereafter, an aluminum oxide ($Al_2O_3$) layer was formed thereon by an atomic layer chemical vapor deposition (ALCVD) method to produce a photoelectric conversion element including a photoelectric conversion film of a laminated layer.

Specific types and combinations of the first compound, the second compound, and the p-type semiconductor material used for producing the photoelectric conversion film are described in Table illustrated in the following column.

Regarding the photoelectric conversion films in the photoelectric conversion elements of Comparative Examples 2-1 and 2-2, only one of the layer 12A containing the second compound or the layer 12B containing the first compound was formed.

In Comparative Example 2-3, the following comparative compound (R-1) was used instead of the first compound, and the compound (A-2) was used as the second compound.

EB-2

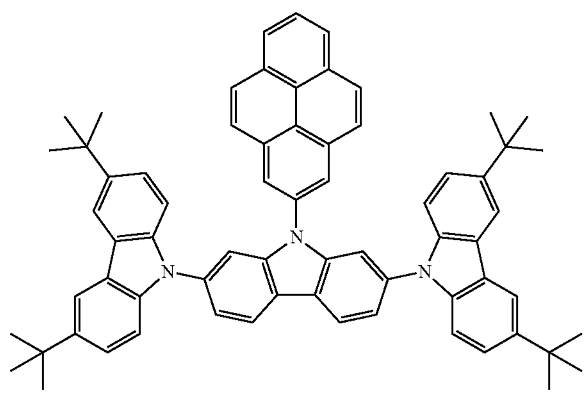

[Test]

<Evaluation of Change in External Quantum Efficiency (Photoelectric Conversion Efficiency) after Continuous Drive>

An external quantum efficiency (photoelectric conversion efficiency) after a continuous drive of each of the obtained photoelectric conversion elements was evaluated. Specifically, first, a voltage is applied to each photoelectric conversion element to have an electric field intensity of $2.0\times10^5$ V/cm, and light is emitted from the upper electrode (transparent conductive film) side to perform an incident photon to current conversion efficiency (IPCE) measurement, and the external quantum efficiency (external quantum efficiency before the continuous drive) at 460 nm and 560 nm was extracted. Thereafter, a voltage was continuously applied to each photoelectric conversion element for 4 weeks to have an electric field intensity of $2.0\times10^5$ V/cm, and the elements were continuously driven. A voltage was applied to each photoelectric conversion element after the continuous drive to have an electric field intensity of $2.0\times10^5$ V/cm, and light is emitted from the upper electrode (transparent conductive film) side to perform the IPCE measurement, and the external quantum efficiency (external quantum efficiency after the continuous drive) at 460 nm and 560 nm was then extracted. A relative value of the external quantum efficiency after the continuous drive in a case where the external quantum efficiency before the continuous drive was set to 1 was obtained, and an evaluation was performed according to the following criteria. Since only one kind of the first compound and the second compound was used in Comparative Examples, the external quantum efficiency was measured at any wavelength of 460 nm or 560 nm. The external quantum efficiency was measured using a constant energy quantum efficiency measuring device manufactured by Optel Co., Ltd. The amount of light emitted was 50 μW/cm$^2$.

In any of the photoelectric conversion elements, the external quantum efficiency before the continuous drive was 50% or more.

In any of the photoelectric conversion elements, the relative value of the external quantum efficiency after the continuous drive was not more than 1.

A+: Relative value is 0.95 or more.

A: Relative value is 0.9 or more and less than 0.95.

B: Relative value is 0.8 or more and less than 0.9.

C: Relative value is 0.7 or more and less than 0.8.

D: Relative value is 0.5 or more and less than 0.7.

E: Relative value is less than 0.5.

In practice, A+, A, B, and C are preferable, and A+ is most preferable.

<Evaluation of Change in Dark Current after Continuous Drive>

Similar to the evaluation of the change in the external quantum efficiency (photoelectric conversion efficiency) after the continuous drive, a voltage is applied to each photoelectric conversion element for 4 weeks to have an electric field intensity of $2.0\times10^5$ V/cm, and each photoelectric conversion element was continuously driven. A voltage was applied to each of the photoelectric conversion elements after the continuous drive to have an electric field intensity of $2.0\times10^5$ V/cm, and current values (dark current) in a dark place were measured. A relative value of the dark current after the continuous drive in a case where the dark current before the continuous drive was set to 1 was obtained, and an evaluation was performed according to the following criteria.

A: Relative value is less than 2.

B: Relative value is 2 or more and less than 4.

C: Relative value is 4 or more and less than 8.

D: Relative value is 8 or more and less than 10.

E: Relative value is 10 or more.

In practice, A, B, and C are preferable, and A is most preferable.

[Result]

The following Table illustrates the first compound, the second compound, the kinds of the p-type semiconductor material used for producing the photoelectric conversion element tested in each Example or Comparative Example, and the test results.

Table 1 illustrates the test results using the photoelectric conversion element (that is, the photoelectric conversion element having a single layer photoelectric conversion film) produced by the method illustrated in <Production-1 of Photoelectric Conversion Element>.

Table 2 illustrates the test results using the photoelectric conversion element (that is, the photoelectric conversion element having a laminated photoelectric conversion film) produced by the method illustrated in <Production-2 of Photoelectric Conversion Element>.

In Table, the "Formula" column in the "First compound or comparative compound" column indicates characteristics of the first compound used. The description of "(1)" indicates that the first compound is a compound represented by Formula (1), and the description of "-" indicates other compounds or indicates that the first compound was not used.

In the table, the "Formula" column in the "Second compound" column indicates characteristics of the second compound used. The description of "(1)" indicates that the first compound is a compound represented by Formula (1), the description of "(U)" indicates that the second compound is represented by Formula (U), the description of "-" indicates other compounds or indicates that the second compound was not used.

TABLE 1

| | First compound or comparative compound | | Second compound | | n-type semiconductor material | p-type semiconductor material | Change in external quantum efficiency after continuous drive | | Change in dark current after continuous drive |
|---|---|---|---|---|---|---|---|---|---|
| | Kind | Formula | Kind | Formula | Kind | Kind | 460 nm | 560 nm | |
| Example 1-1 | (B-1) | (1) | (A-1) | — | $C_{60}$ | — | C | B | C |
| Example 1-2 | (B-1) | (1) | (A-2) | — | $C_{60}$ | — | C | B | C |
| Example 1-3 | (B-1) | (1) | (A-3) | — | $C_{60}$ | — | C | B | C |
| Example 1-4 | (B-1) | (1) | (A-4) | — | $C_{60}$ | — | C | B | C |
| Example 1-5 | (B-1) | (1) | (A-5) | — | $C_{60}$ | — | C | B | C |
| Example 1-6 | (B-1) | (1) | (A-6) | — | $C_{60}$ | — | C | B | C |
| Example 1-7 | (B-1) | (1) | (A-7) | — | $C_{60}$ | — | C | B | C |
| Example 1-8 | (B-1) | (1) | (A-8) | — | $C_{60}$ | — | C | B | C |
| Example 1-9 | (B-1) | (1) | (A-9) | — | $C_{60}$ | — | C | B | C |
| Example 1-10 | (B-1) | (1) | (A-10) | (U) | $C_{60}$ | — | B | B | C |
| Example 1-11 | (B-1) | (1) | (A-11) | (U) | $C_{60}$ | — | B | B | C |
| Example 1-12 | (B-1) | (1) | (A-12) | (U) | $C_{60}$ | — | B | B | C |
| Example 1-13 | (B-1) | (1) | (A-13) | (U) | $C_{60}$ | — | B | B | C |
| Example 1-14 | (B-1) | (1) | (A-14) | (1) | $C_{60}$ | — | B | B | B |
| Example 1-15 | (B-1) | (1) | (A-15) | (1) | $C_{60}$ | — | B | B | B |
| Example 1-16 | (B-1) | (1) | (A-10) | (U) | $C_{60}$ | (P-1) | A | A | B |
| Example 1-17 | (B-1) | (1) | (A-10) | (U) | $C_{60}$ | (P-2) | A | A | B |
| Example 1-18 | (B-1) | (1) | (A-10) | (U) | $C_{60}$ | (P-3) | A | A | B |
| Example 1-19 | (B-1) | (1) | (A-10) | (U) | $C_{60}$ | (P-4) | A | A | B |
| Example 1-20 | (B-2) | (1) | (A-10) | (U) | $C_{60}$ | (P-1) | A | A | B |
| Example 1-21 | (B-3) | (1) | (A-10) | (U) | $C_{60}$ | (P-1) | A | A | B |
| Example 1-22 | (B-4) | (1) | (A-10) | (U) | $C_{60}$ | (P-1) | A | A | B |
| Example 1-23 | (B-5) | (1) | (A-10) | (U) | $C_{60}$ | (P-1) | A | A | B |

TABLE 1-continued

| | First compound or comparative compound | | Second compound | | n-type semiconductor material | p-type semiconductor material | Change in external quantum efficiency after continuous drive | | Change in dark current after continuous drive |
|---|---|---|---|---|---|---|---|---|---|
| | Kind | Formula | Kind | Formula | Kind | Kind | 460 nm | 560 nm | |
| Example 1-24 | (B-6) | (1) | (A-10) | (U) | $C_{60}$ | (P-1) | A | A | B |
| Example 1-25 | (B-7) | (1) | (A-10) | (U) | $C_{60}$ | (P-1) | A | A | B |
| Example 1-26 | (B-8) | (1) | (A-10) | (U) | $C_{60}$ | (P-1) | A | A+ | B |
| Example 1-27 | (B-9) | (1) | (A-10) | (U) | $C_{60}$ | (P-1) | A | A | B |
| Example 1-28 | (B-10) | (1) | (A-10) | (U) | $C_{60}$ | (P-1) | A | A+ | B |
| Example 1-29 | (B-11) | (1) | (A-10) | (U) | $C_{60}$ | (P-1) | A | A+ | B |
| Example 1-30 | (B-12) | (1) | (A-10) | (U) | $C_{60}$ | (P-1) | A | A+ | B |
| Example 1-31 | (B-13) | (1) | (A-10) | (U) | $C_{60}$ | (P-1) | A | A+ | B |
| Example 1-32 | (B-14) | (1) | (A-10) | (U) | $C_{60}$ | (P-1) | A | A+ | B |
| Example 1-33 | (B-10) | (1) | (A-14) | (1) | $C_{60}$ | (P-1) | A | A+ | A |
| Example 1-34 | (B-11) | (1) | (A-14) | (1) | $C_{60}$ | (P-1) | A | A+ | A |
| Example 1-35 | (B-12) | (1) | (A-14) | (1) | $C_{60}$ | (P-1) | A | A+ | A |
| Example 1-36 | (B-13) | (1) | (A-14) | (1) | $C_{60}$ | (P-1) | A | A+ | A |
| Example 1-37 | (B-14) | (1) | (A-14) | (1) | $C_{60}$ | (P-1) | A | A+ | A |
| Comparative Example 1-1 | — | — | (A-10) | (U) | $C_{60}$ | (P-1) | D | — | E |
| Comparative Example 1 -2 | (B-1) | (1) | — | — | $C_{60}$ | (P-1) | — | D | E |
| Comparative Example 1-3 | (R-1) | — | (A-2) | — | $C_{60}$ | (P-1) | B | B | E |

TABLE 2

| | First layer | | | | Second layer | | | | Change in external quantum efficiency after continuous drive | | Change in dark current after continuous drive |
|---|---|---|---|---|---|---|---|---|---|---|---|
| | Second compound | | n-type semiconductor material | p-type semiconductor material | First compound or comparative compound | | Second compound | n-type semiconductor material | | | |
| | Kind | Formula | Kind | Kind | Kind | Formula | Kind | Kind | 460 nm | 560 nm | |
| Example 2-1 | (A-1) | — | $C_{60}$ | — | (B-1) | (1) | $C_{60}$ | — | C | B | C |
| Example 2-2 | (A-2) | — | $C_{60}$ | — | (B-1) | (1) | $C_{60}$ | — | C | B | C |
| Example 2-3 | (A-3) | — | $C_{60}$ | — | (B-1) | (1) | $C_{60}$ | — | C | B | C |
| Example 2-4 | (A-4) | — | $C_{60}$ | — | (B-1) | (1) | $C_{60}$ | — | C | B | C |
| Example 2-5 | (A-5) | — | $C_{60}$ | — | (B-1) | (1) | $C_{60}$ | — | C | B | C |
| Example 2-6 | (A-6) | — | $C_{60}$ | — | (B-1) | (1) | $C_{60}$ | — | C | B | C |
| Example 2-7 | (A-7) | — | $C_{60}$ | — | (B-1) | (1) | $C_{60}$ | — | C | B | C |
| Example 2-8 | (A-8) | — | $C_{60}$ | — | (B-1) | (1) | $C_{60}$ | — | C | B | C |
| Example 2-9 | (A-9) | — | $C_{60}$ | — | (B-1) | (1) | $C_{60}$ | — | C | B | C |
| Example 2-10 | (A-10) | (U) | $C_{60}$ | — | (B-1) | (1) | $C_{60}$ | — | B | B | C |
| Example 2-11 | (A-11) | (U) | $C_{60}$ | — | (B-1) | (1) | $C_{60}$ | — | B | B | C |
| Example 2-12 | (A-12) | (U) | $C_{60}$ | — | (B-1) | (1) | $C_{60}$ | — | B | B | C |
| Example 2-13 | (A13) | (U) | $C_{60}$ | — | (B-1) | (1) | $C_{60}$ | — | B | B | C |
| Example 2-14 | (A-14) | (1) | $C_{60}$ | — | (B-1) | (1) | $C_{60}$ | — | B | B | B |
| Example 2-15 | (A-15) | (1) | $C_{60}$ | — | (B-1) | (1) | $C_{60}$ | — | B | B | B |
| Example 2-16 | (A-10) | (U) | $C_{60}$ | (p-1) | (B-1) | (1) | $C_{60}$ | (P-1) | A | A | B |
| Example 2-17 | (A-10) | (U) | $C_{60}$ | (P-2) | (B-1) | (1) | $C_{60}$ | (P-2) | A | A | B |
| Example 2-18 | (A-10) | (U) | $C_{60}$ | (P-3) | (B-1) | (1) | $C_{60}$ | (P-3) | A | A | B |
| Example 2-19 | (A-10) | (U) | $C_{60}$ | (P-4) | (B-1) | (1) | $C_{60}$ | (P-4) | A | A | B |
| Example 2-20 | (A-10) | (U) | $C_{60}$ | (P-1) | (B-2) | (1) | $C_{60}$ | (P-1) | A | A | B |
| Example 2-21 | (A-10) | (U) | $C_{60}$ | (P-1) | (B-3) | (1) | $C_{60}$ | (P-1) | A | A | B |
| Example 2-22 | (A-10) | (U) | $C_{60}$ | (P-1) | (B-4) | (1) | $C_{60}$ | (P-1) | A | A | B |
| Example 2-23 | (A-10) | (U) | $C_{60}$ | (P-1) | (B-5) | (1) | $C_{60}$ | (P-1) | A | A | B |
| Example 2-24 | (A-10) | (U) | $C_{60}$ | (P-1) | (B-6) | (1) | $C_{60}$ | (P-1) | A | A | B |
| Example 2-25 | (A-10) | (U) | $C_{60}$ | (P-1) | (B-7) | (1) | $C_{60}$ | (P-1) | A | A | B |
| Example 2-26 | (A-10) | (U) | $C_{60}$ | (P-1) | (B-8) | (1) | $C_{60}$ | (P-1) | A | A+ | B |
| Example 2-27 | (A-10) | (U) | $C_{60}$ | (P-1) | (B-9) | (1) | $C_{60}$ | (P-1) | A | A | B |
| Example 2-28 | (A-10) | (U) | $C_{60}$ | (P-1) | (B-10) | (1) | $C_{60}$ | (P-1) | A | A+ | B |
| Example 2-29 | (A-10) | (U) | $C_{60}$ | (P-1) | (B-11) | (1) | $C_{60}$ | (P-1) | A | A+ | B |
| Example 2-30 | (A-10) | (U) | $C_{60}$ | (P-1) | (B-12) | (1) | $C_{60}$ | (P-1) | A | A+ | B |
| Example 2-31 | (A-10) | (U) | $C_{60}$ | (P-1) | (B-13) | (1) | $C_{60}$ | (P-1) | A | A+ | B |
| Example 2-32 | (A-10) | (U) | $C_{60}$ | (P-1) | (B-14) | (1) | $C_{60}$ | (P-I) | A | A+ | B |

TABLE 2-continued

| | First layer | | | | Second layer | | | | Change in external quantum efficiency after continuous drive | | Change in dark current after continuous drive |
|---|---|---|---|---|---|---|---|---|---|---|---|
| | Second compound | | n-type semiconductor material | p-type semiconductor material | First compound or comparative compound | | Second compound | n-type semiconductor material | | | |
| | Kind | Formula | Kind | Kind | Kind | Formula | Kind | Kind | 460 nm | 560 nm | |
| Example 2-33 | (A-14) | (1) | $C_{60}$ | (P-1) | (B-10) | (1) | $C_{60}$ | (p-1) | A | A+ | A |
| Example 2-34 | (A-14) | (1) | $C_{60}$ | (P-1) | (B-11) | (1) | $C_{60}$ | (P-1) | A | A+ | A |
| Example 2-35 | (A-14) | (1) | $C_{60}$ | (P-1) | (B-12) | (1) | $C_{60}$ | (P-1) | A | A+ | A |
| Example 2-36 | (A-14) | (1) | $C_{60}$ | (P-1) | (B-13) | (1) | $C_{60}$ | (P-1) | A | A+ | A |
| Example 2-37 | (A-14) | (1) | $C_{60}$ | (P-1) | (B-14) | (1) | $C_{60}$ | (P-1) | A | A+ | A |
| Comparative Example 2-1 | (A-10) | (U) | $C_{60}$ | (P-1) | — | — | | — | D | — | E |
| Comparative Example 2-2 | — | — | — | — | (B-1) | (1) | $C_{60}$ | (P-1) | — | D | E |
| Comparative Example 2-3 | (A-2) | — | $C_{60}$ | (P-1) | (R-1) | — | $C_{60}$ | (P-1) | B | B | E |

As illustrated in Table, it was confirmed that the change in the external quantum efficiency was suppressed due to the continuous drive, and the change in the dark current due to the continuous drive in the photoelectric conversion element of the present invention.

In addition, it was confirmed that the effect of the present invention is more excellent in the case where the photoelectric conversion film includes the p-type semiconductor material (see the comparison between Example 1-10 and Example 1-16, the comparison between Example 2-10 and Example 2-16, and the like).

In the compounds represented by Formula (1) as the first compound, the more excellent effect of the present invention in which $A^1$ is a ring having any of the groups represented by Formulae (AW1) to (AW3) was confirmed (see the results of Examples in which B-8 and B-10 to B-14 were used as the first compound).

From the viewpoint that the effect of the present invention is more excellent, it was confirmed that the compound represented by Formula (U) or the compound represented by Formula (1) was preferably used as the second compound, and the compound represented by Formula (1) was more preferably used (see the comparison between Examples 1-1 to 1-15, the comparison between Examples 2-1 to 2-15, and the like).

EXPLANATION OF REFERENCES

10*a*, 10*b*: Photoelectric conversion element
11: Conductive film (lower electrode)
12: Photoelectric conversion film
12A: Second compound containing layer
12B: First compound containing layer
15: Transparent conductive film (upper electrode)
16A: Electron blocking film
16B: Positive hole blocking film
20*a*: Imaging element
22: Other photoelectric conversion element

What is claimed is:

1. A photoelectric conversion element comprising, in the following order: a conductive film; a photoelectric conversion film; and a transparent conductive film, wherein the photoelectric conversion film includes a first compound that has a maximum absorption wavelength at a wavelength of 500 to 620 nm, that has no ionic group, and that is a compound represented by Formula (1), and a second compound that is different from the first compound and that has a maximum absorption wavelength at a wavelength of 450 to 550 nm, (1)

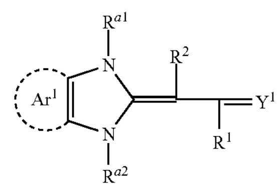

(1-1)

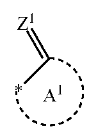

(1-2)

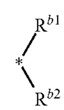

in Formula (1), $Y^1$ represents a group represented by Formula (1-1) or a group represented by Formula (1-2), $A^1$ represents a ring which contains at least two carbon atoms and may have a substituent, $Z^1$ represents an oxygen atom, a sulfur atom, $=NR^{Z1}$, or $=CR^{Z2}R^{Z3}$, $R^{Z1}$ represents a hydrogen atom or a substituent, $R^{Z2}$ and $R^{Z3}$ each independently represent a cyano group or $-COOR^{Z4}$, $R^{Z4}$ represents an alkyl group which may have a substituent, an aryl group which may have a substituent, or a heteroaryl group which may have a substituent, $R^{b1}$ and $R^{b2}$ each independently represent a cyano group or $-COOR^{b3}$, $R^{b3}$ represents an alkyl group which may have a substituent, an aryl group which may have a substituent, or a heteroaryl group which may have a substituent, $R^1$ and $R^2$ each independently represent a hydrogen atom or a substituent, $R^{a1}$ and $R^{a2}$ each independently represent an aryl group which may have a substituent, $-C(R^{L1})(R^{L2})(R^{L3})$, or a heteroaryl group which may have a substituent, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L3}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, $Ar^1$ represents an aromatic ring which may have a substituent, and

* represents a bonding position.

2. The photoelectric conversion element according to claim 1, wherein the photoelectric conversion film includes a layer containing the first compound and a layer containing the second compound.

3. The photoelectric conversion element according to claim 2, wherein at least one of a condition in which the layer containing the first compound has a bulk heterostructure formed in a state where the first compound and an n-type semiconductor material are mixed or a condition in which the layer containing the second compound has a bulk heterostructure formed in a state where the second compound and an n-type semiconductor material are mixed is satisfied.

4. The photoelectric conversion element according to claim 2, wherein the layer containing the first compound has a bulk heterostructure formed in a state where the first compound and an n-type semiconductor material are mixed, and the layer containing the second compound has a bulk heterostructure formed in a state where the second compound and an n-type semiconductor material are mixed.

5. The photoelectric conversion element according to claim 2, wherein at least one of a condition in which the layer containing the first compound has a bulk heterostructure formed in a state where the first compound, an n-type semiconductor material, and a p-type semiconductor material are mixed or a condition in which the layer containing the second compound has a bulk heterostructure formed in a state where the second compound, an n-type semiconductor material, and a p-type semiconductor material are mixed is satisfied.

6. The photoelectric conversion element according to claim 2, wherein the layer containing the first compound has a bulk heterostructure formed in a state where the first compound, an n-type semiconductor material, and a p-type semiconductor material are mixed, and the layer containing the second compound has a bulk heterostructure formed in a state where the second compound, an n-type semiconductor material, and a p-type semiconductor material are mixed.

7. The photoelectric conversion element according to claim 1, wherein the photoelectric conversion film includes a mixture layer formed in a state where the first compound and the second compound are mixed.

8. The photoelectric conversion element according to claim 7, wherein the mixture layer further includes an n-type semiconductor material and has a bulk heterostructure formed in a state where the first compound, the second compound, and the n-type semiconductor material are mixed.

9. The photoelectric conversion element according to claim 8, wherein the mixture layer further includes a p-type semiconductor material and has a bulk heterostructure formed in a state where the first compound, the second compound, the n-type semiconductor material, and the p-type semiconductor material are mixed.

10. The photoelectric conversion element according to claim 3, wherein the n-type semiconductor material includes fullerenes selected from the group consisting of a fullerene and a derivative thereof.

11. The photoelectric conversion element according to claim 1, wherein the compound represented by Formula (1) is a compound represented by Formula (2),

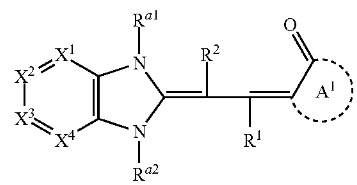

(2)

in Formula (2), $A^1$ represents a ring which contains at least two carbon atoms and may have a substituent, $R^1$ and $R^2$ each independently represent a hydrogen atom or a substituent, $R^{a1}$ and $R^{a2}$ each independently represent an aryl group which may have a substituent, —$C(R^{L1})(R^{L2})(R^{L3})$, or a heteroaryl group which may have a substituent, $R^{L1}$ to $R^{L3}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, $X^1$ to $X^4$ each independently represent a nitrogen atom or —$CR^{4'}$=, $R^{c1}$ represents a hydrogen atom or a substituent, and in a case where a plurality of $R^{c1}$'s exist, the plurality of $R^{c1}$'s may be bonded to each other to form a ring.

12. The photoelectric conversion element according to claim 11, wherein in Formula (2), $X^1$ and $X^4$ each represent a nitrogen atom.

13. The photoelectric conversion element according to claim 1, wherein the compound represented by Formula (1) is a compound represented by Formula (3), (3)

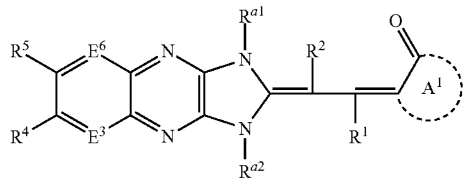

in Formula (3), A' represents a ring which contains at least two carbon atoms and may have a substituent, $E^3$ represents a nitrogen atom or —$CR^3$═, $E^6$ represents a nitrogen atom or —$CR^6$═, $R^1$ to $R^6$ each independently represent a hydrogen atom or a substituent, $R^{a1}$ and $R^{a2}$ each independently represent an aryl group which may have a substituent, —$C(R^{L1})(R^{L2})(R^{L3})$, or a heteroaryl group which may have a substituent, $R^{L1}$ to $R^{L}$ each independently represent an alkyl group which may have a substituent, an aryl group which may have a substituent, a heteroaryl group which may have a substituent, or a hydrogen atom, and at least two of $R^{L1}$, $R^{L2}$, or $R^{L3}$ each independently represent an alkyl group which may have a substituent, an aryl group which may have a substituent, or a heteroaryl group which may have a substituent, an alkyl group which may have a substituent, an aryl group which may have a substituent, and a heteroaryl group which may have a substituent, which are represented by $R^{L1}$ to $R^{L3}$, may be bonded to each other to form a ring, $R^3$ and $R^4$, $R^4$ and $R^5$, and $R^5$ and $R^6$ each may be independently bonded to each other to form a ring.

14. The photoelectric conversion element according to claim 1, wherein in Formula (1), $Y^1$ represents the group represented by Formula (1-1), and in Formula (1-1), the ring represented by $A^1$ is a ring having any of groups represented by Formulae (AW1) to (AW3), $$*1\text{-}NR^{L}—CO—CR^{ZA}═CR^{ZB}—*2 \quad \text{(AW1)}$$

$$*1\text{-}NR^{L}—N═CR^{Y5}—*2 \quad \text{(AW2)}$$

$$*1\text{-}CR^{Y1}═CR^{Y2}—C(═CR^{ZC}R^{ZD})\text{-}*2 \quad \text{(AW3)}$$

in Formulae (AW1) to (AW3), *1 represents a bonding position with a carbon atom in —C(═$Z^1$)— which is specified in Formula (1-1),

*2 represents a bonding position with a carbon atom marked with * in Formula (1-1), $R^L$ represents a hydrogen atom or a substituent, $R^{Y1}$, $R^{Y2}$, and $R^{Y5}$ each independently represent a hydrogen atom or a substituent, $R^{ZA}$ to $R^{ZD}$ each independently represent a hydrogen atom or a substituent, and $R^{Y1}$ and $R^{Y2}$ may be bonded to each other to form a ring.

15. The photoelectric conversion element according to claim 1, further comprising one or more interlayers between the conductive film and the transparent conductive film, in addition to the photoelectric conversion film.

16. The photoelectric conversion element according to claim 15, wherein the photoelectric conversion element includes at least an electron blocking film as the interlayer.

17. The photoelectric conversion element according to claim 16, wherein an ionization potential Ip(B) of the electron blocking film, an ionization potential Ip (1) of the first compound, and an ionization potential Ip (2) of the second compound satisfy a relationship of Ip(B)≤Ip (1) and Ip(B)≤Ip (2).

18. An imaging element comprising the photoelectric conversion element according to claim 1.

19. An optical sensor comprising the photoelectric conversion element according to claim 1.

20. The photoelectric conversion element according to claim 3, wherein the layer containing the first compound has a bulk heterostructure formed in a state where the first compound and an n-type semiconductor material are mixed, and the layer containing the second compound has a bulk heterostructure formed in a state where the second compound and an n-type semiconductor material are mixed.

* * * * *